(12) United States Patent
Ryu

(10) Patent No.: US 10,741,643 B2
(45) Date of Patent: Aug. 11, 2020

(54) SEMICONDUCTOR DEVICE HAVING BURIED GATE STRUCTURE AND METHOD FOR FABRICATING THE SAME

(71) Applicant: SK hynix Inc., Gyeonggi-do (KR)

(72) Inventor: Seong-Wan Ryu, Gyeonggi-do (KR)

(73) Assignee: SK hynix Inc., Gyeonggi-do (KP)

( * ) Notice: Subject to any disclaimer, the term of this patent is extended or adjusted under 35 U.S.C. 154(b) by 0 days.

(21) Appl. No.: 16/119,424

(22) Filed: Aug. 31, 2018

(65) Prior Publication Data

US 2019/0259839 A1  Aug. 22, 2019

(30) Foreign Application Priority Data

Feb. 22, 2018  (KR) .................. 10-2018-0021240

(51) Int. Cl.
| | |
|---|---|
| *H01L 29/78* | (2006.01) |
| *H01L 29/08* | (2006.01) |
| *H01L 29/423* | (2006.01) |
| *H01L 21/324* | (2006.01) |
| *H01L 29/66* | (2006.01) |

(52) U.S. Cl.
CPC ........ *H01L 29/0873* (2013.01); *H01L 21/324* (2013.01); *H01L 29/4236* (2013.01); *H01L 29/66734* (2013.01); *H01L 29/7813* (2013.01)

(58) Field of Classification Search
CPC . H01L 29/7813; H01L 29/4236–42364; H01L 29/517; H01L 21/823842; H01L 21/823857
See application file for complete search history.

(56) References Cited

U.S. PATENT DOCUMENTS

| | | | |
|---|---|---|---|
| 8,962,401 B2 | 2/2015 | Juengling et al. | |
| 9,240,453 B2 | 1/2016 | Oh | |
| 9,306,022 B1* | 4/2016 | Oh | H01L 29/4941 |
| 9,589,960 B1 | 3/2017 | Min | |
| 9,634,011 B2 | 4/2017 | Kang et al. | |
| 2004/0121591 A1* | 6/2004 | Ichinose | H01L 21/28518 438/649 |
| 2010/0038725 A1* | 2/2010 | Chudzik | H01L 21/28079 257/392 |
| 2011/0186931 A1* | 8/2011 | Marxsen | H01L 21/823807 257/368 |
| 2011/0210389 A1* | 9/2011 | Griebenow | H01L 29/1037 257/330 |
| 2012/0098067 A1* | 4/2012 | Yin | H01L 21/823807 257/351 |
| 2015/0035073 A1* | 2/2015 | Ando | H01L 21/28229 257/369 |
| 2016/0225868 A1* | 8/2016 | Kim | H01L 29/4966 |
| 2016/0315088 A1* | 10/2016 | Kang | H01L 27/10814 |

* cited by examiner

*Primary Examiner* — Eric A. Ward
*Assistant Examiner* — Eric K Ashbahian
(74) *Attorney, Agent, or Firm* — IP & T Group LLP

(57) ABSTRACT

A semiconductor device includes: a substrate; a first source/drain region and a second source/drain region spaced apart from each other by a trench in the substrate; and a gate structure in the trench, wherein the gate structure includes: a gate dielectric layer formed on a bottom and sidewalls of the trench; a first gate electrode positioned in a bottom portion of the trench over the gate dielectric layer; a second gate electrode positioned over the first gate electrode; and a dipole inducing layer formed between the first gate electrode and the second gate electrode and between sidewalls of the second gate electrode and the gate dielectric layer.

20 Claims, 41 Drawing Sheets

SEMICONDUCTOR DEVICE HAVING BURIED GATE STRUCTURE AND METHOD FOR FABRICATING THE SAME

CROSS-REFERENCE TO RELATED APPLICATIONS

The present application claims priority under 35 U.S.C. § 119(a) to Korean Patent Application No. 10-2018-0021240, filed on Feb. 22, 2018, which is incorporated herein by reference in its entirety.

BACKGROUND

1. Field

Exemplary embodiments of the present invention relate to a semiconductor device, and more particularly, to a semiconductor device having a buried gate structure, and a method for fabricating the semiconductor device.

2. Description of the Related Art

A metal gate electrode is being used for high performance of a transistor. Particularly, it is required to control a threshold voltage for a high-performance operation in a buried gate-type transistor. However, a gate-induced drain leakage (GIDL) characteristic has a great influence on the performance of the buried gate-type transistor. Reducing GIDL would substantially enhance the performance of the buried gate-type transistor.

SUMMARY

Embodiments of the present invention are directed to an improved semiconductor device capable of reducing gate-induced drain leakage (GIDL), and a method for fabricating the semiconductor device.

In accordance with an embodiment of the present invention, a semiconductor device includes: a substrate; a first source/drain region and a second source/drain region spaced apart from each other by a trench in the substrate; and a gate structure in the trench, wherein the gate structure includes: a gate dielectric layer formed on a bottom and sidewalls of the trench; a first gate electrode positioned in a bottom portion of the trench over the gate dielectric layer; a second gate electrode positioned over the first gate electrode; and a dipole inducing layer formed between the first gate electrode and the second gate electrode and between sidewalls of the second gate electrode and the gate dielectric layer.

In accordance with another embodiment of the present invention, a method for fabricating a semiconductor device includes: forming a trench in a substrate; forming a gate dielectric layer over a bottom and sidewalls of the trench; forming a lower buried portion on the gate dielectric layer, the lower buried portion including a first gate electrode filling a bottom portion of the trench and exposing a portion of the gate dielectric layer; and forming an upper buried portion including a dipole inducing layer that covers a top surface of the first gate electrode and the exposed gate dielectric layer, and a second gate electrode that is positioned over the dipole inducing layer.

In accordance with yet another embodiment of the present invention, a semiconductor device includes: a substrate; a first source/drain region and a second source/drain region spaced apart from each other by a trench in the substrate; and a gate structure which includes: a gate dielectric layer covering a bottom and sidewalls of the trench, a first gate electrode positioned over the gate dielectric layer; a second gate electrode positioned over the first gate electrode, wherein the gate dielectric layer includes: a first portion contacting the first gate electrode; and a second portion including a dipole inducing portion containing a dipole inducing chemical species that contacts the second gate electrode.

In accordance with still another embodiment of the present invention, a method for fabricating a semiconductor device includes: forming a trench in a substrate; forming a gate dielectric layer on a surface of the trench; forming a first gate electrode over the gate dielectric layer to fill a bottom portion of the trench; forming a sacrificial layer including a dipole inducing chemical species over the first gate electrode; exposing the sacrificial layer to a thermal treatment to diffuse the dipole inducing chemical species into a portion of a gate dielectric layer that contacts the sacrificial layer; removing the sacrificial layer; and forming a second gate electrode over the first gate electrode in contact with the dipole inducing chemical species.

DETAILED DESCRIPTION

Figure 1:
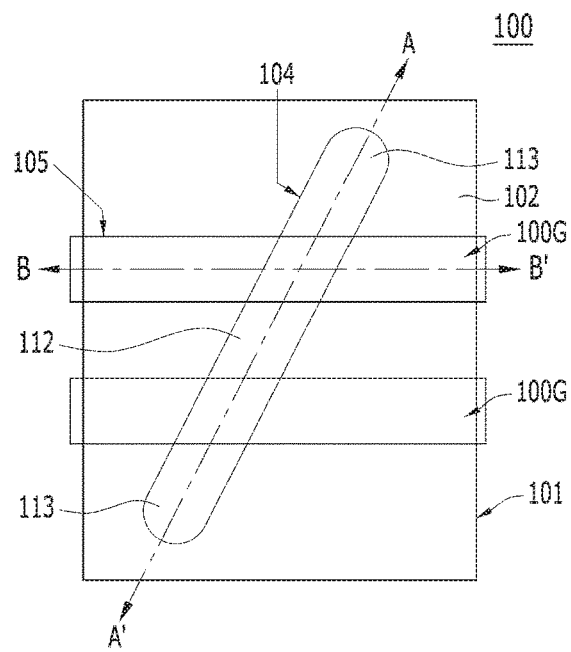
FIG. 1 is a plan view illustrating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The term "or" as used herein means either one of two or more alternatives but not both nor any combinations thereof.

As used herein, the term "and/or" includes any and all combinations of one or more of the associated listed items.

As used herein, singular forms are intended to include the plural forms as well, unless the context clearly indicates otherwise.

It will be further understood that the terms "includes," and "including" are used interchangeably in this specification with the open-ended terms "comprises," and "comprising," to specify the presence of any stated elements and to not preclude the presence or addition of one or more other non-stated elements.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

Hereinafter, in the following embodiments of the present invention, a threshold voltage Vt depends on a flat-band voltage VFB. The flat-band voltage VFB depends on a work function. The work function may be engineered by diverse methods. For example, the work function may be controlled by selecting a gate electrode material and a material for the region disposed between the gate electrode and a channel. The flat-band voltage may be shifted by increasing or decreasing the work function. A high work function may shift the flat-band voltage in a positive direction, and a low work function may shift the flat-band voltage in a negative direction. In the following embodiments, the threshold voltage may be adjusted or modified by shifting the flat-band voltage, regardless of whether a channel dopant concentration is decreased or channel doping is omitted altogether. For example, the flat-band voltage may be lowered by a low work function material or a dipole, thereby enhancing the suppression of a gate-induced drain leakage (GIDL).

Hereinafter, in accordance with embodiments of the present invention, a buried gate structure may be positioned in a gate trench. The buried gate structure may include a gate electrode. The gate electrode may fill the gate trench. Thus, the gate electrode may be referred to also herein as 'a buried gate electrode.' The gate electrode may include a first gate electrode and a second gate electrode. For example, the gate electrode may a dual gate electrode. The first gate electrode may fill a lower portion of the gate trench. The second gate electrode may fill an upper portion of the gate trench. The second gate electrode may be positioned over the first gate electrode. The first gate electrode may overlap with a channel. The second gate electrode may overlap with a first source/drain is region and a second source/drain region.

Figure 2A:
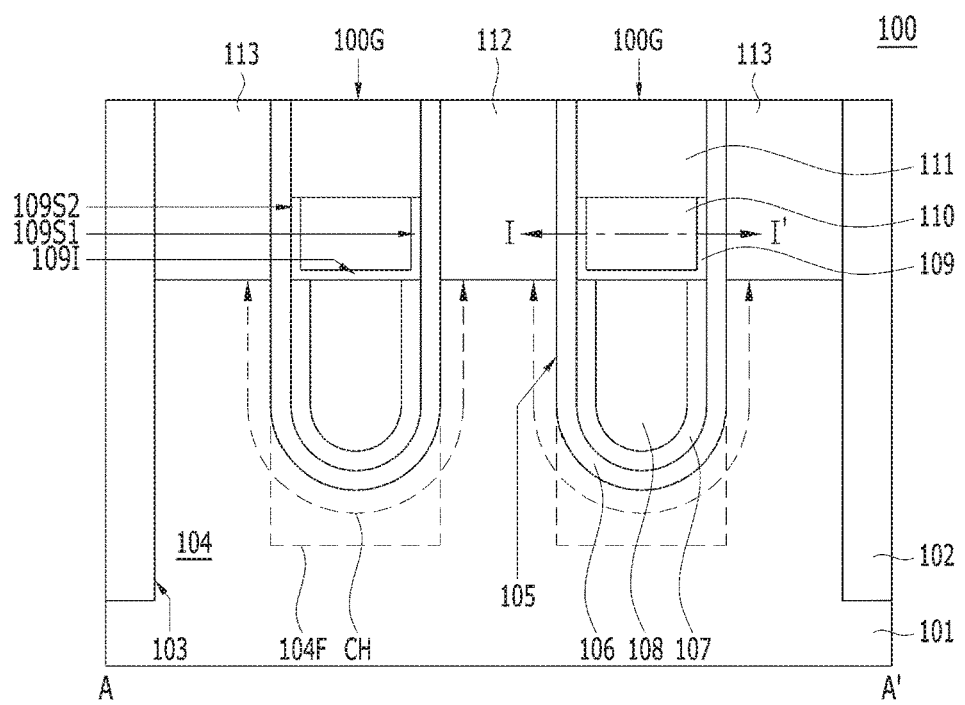
FIG. 2A is a cross-sectional view of the semiconductor device taken along a line A-A' shown in FIG. 1.
Figure 2B:
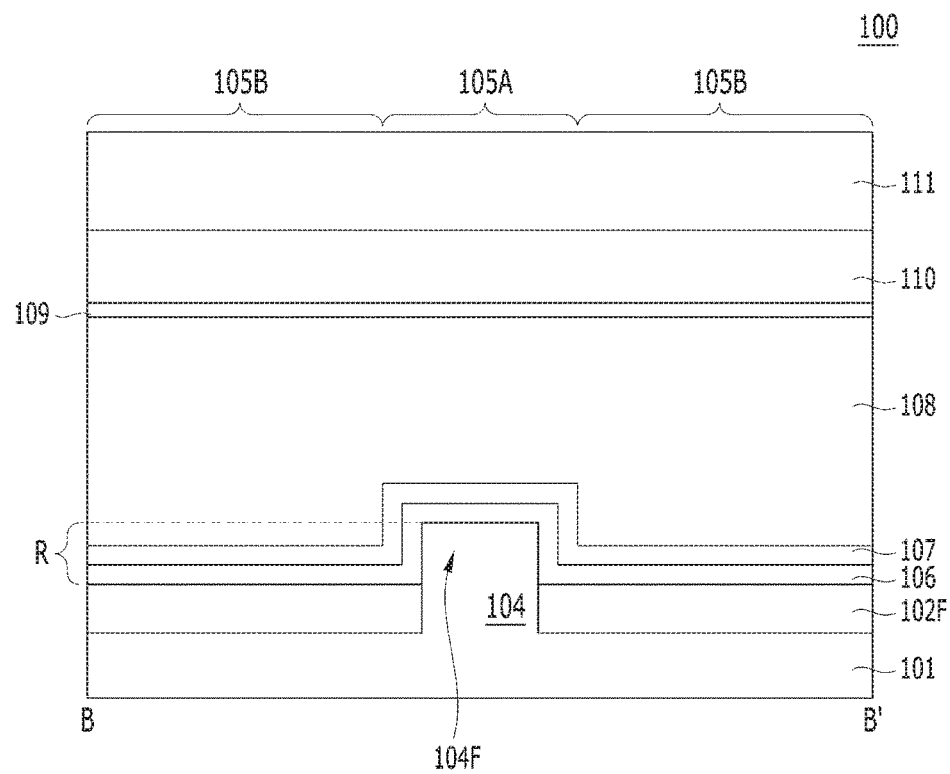
FIG. 2B is a cross-sectional view of the semiconductor device taken along a line B-B' shown in FIG. 1.

FIG. 1 is a plan view illustrating a semiconductor device 100 in accordance with a first embodiment of the present invention. FIG. 2A is a cross-sectional view of the semiconductor device 100 taken along a line A-A' shown in FIG. 1. FIG. 2B is a cross-sectional view of the semiconductor device 100 taken along a line B-B' shown in FIG. 1.

Referring to FIG. 1, the semiconductor device 100 may include a buried gate structure 100G, a first source/drain region 112, and a second source/drain region 113. An isolation layer 102 and an active region 104 may be formed over a substrate 101. The first and the second source/drain regions 112 and 113 may be formed inside the active region 104. A gate trench 105 may cross the active region 104 and the isolation layer 102 and the buried gate structure 100G may be formed inside the gate trench 105. A channel CH may be formed between the first source/drain region 112 and the second source/drain region 113 with the buried gate structure 100G between them. The channel CH may extend conformally along an outside surface of the profile of the gate trench 105. The semiconductor device 100 may be a portion of a memory cell. For example, the semiconductor device 100 may be a cell transistor of a DRAM.

The semiconductor device 100 may be formed over the substrate 101. The substrate 101 may be made of a material suitable for semiconductor processing. The substrate 101 may be any suitable semiconductor substrate. In an embodiment, the substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon doped silicon, combinations thereof or a multilayer thereof. The substrate 101 may include other semiconductor materials such as germanium. The substrate 101 may include a III/V-group semiconductor substrate, for example, a compound semiconductor substrate, such as GaAs. The substrate 101 may include a Silicon-On-Insulator (SOT) substrate.

The isolation layer 102 and the active region 104 may be formed on the substrate 101. The active region 104 may be defined by the isolation layer 102. The isolation layer 102 may be a Shallow Trench Isolation (STI) region formed by trench etching. The isolation layer 102 may be formed by filling a shallow trench, e.g., an isolation trench 103, with a dielectric material. For, example, the isolation layer 102 may include a silicon oxide, a silicon nitride, or a combination thereof.

The gate trench 105 may be formed in the substrate 101. Referring to the plan view of FIG. 1, the gate trench 105 may have an elongated shape extending in one direction. The gate trench 105 may be line-shaped extending in one direction. The gate trench 105 may have a form of a line traversing the active region 104 and the isolation layer 102. The gate trench 105 may have a shallower depth than the isolation trench 103. A bottom portion of the gate trench 105 may have a curvature, i.e., a bottom portion of the gate trench 105 may have a curved surface.

A first source/drain region 112 and a second source/drain region 113 may be formed inside the active region 104. The first source/drain region 112 and the second source/drain region 113 may be doped with a conductive dopant. For example, the conductive dopant may include at least one of phosphorus (P), arsenic (As), antimony (Sb), or boron (B). The first source/drain region 112 and the second source/ drain region 113 may be doped with a dopant of the same conductivity type. The first source/drain region 112 and the second source/drain region 113 may be positioned in the active region 104 on either side of the gate trench 105, meaning that the first source/drain region 112 may be adjacent one side of the gate trench 105 while the second source/drain region 113 may be adjacent the other side of the gate trench 105. The bottom surfaces of the first source/drain region 112 and the second source/drain region 113 may be positioned at a predetermined depth from the top surface of the active region 104. The first source/drain region 112 and the second source/drain region 113 may be in contact with the sidewalls of the gate trench 105. The bottom surfaces of the first source/drain region 112 and the second source/drain region 113 may be higher than the bottom surface of the gate trench 105.

The gate trench 105 may include a first trench 105A and a second trench 105B. The first trench 105A may be formed in the active region 104. The second trenches 105B may be formed in the isolation layer 102. The first trench 105A and the second trench 105B may be formed to be consecutively extended from the first trench 105A and the second trench 105B. In the gate trench 105, the first trench 105A and the second trench 105B may have bottom surfaces positioned at different levels. For example, the bottom surface of the first trench 105A may be positioned at a higher level than the bottom surface of the second trench 105B. The height difference between the first trench 105A and the second trench 105B may be caused as the isolation layer 102 is recessed. Thus, the second trench 105B may include a recessed region R having a lower bottom surface than the bottom surface of the first trench 105A. A fin region 104F may be formed in the active region 104 due to a height difference between the first trench 105A and the second trench 105B. Therefore, the active region 104 may include the fin region 104F.

As described above, the fin region 104F may be formed below the first trench 105A, and the sidewall of the fin region 104F may be exposed by the recessed isolation layer 102F. The fin region 104F may be a portion where a channel is formed. The fin region 104F may be referred to also herein as a saddle fin. The fin region 104F may increase the width of the channel and improve the electrical characteristics.

In accordance with an embodiment, the fin region 104F may be omitted.

The buried gate structure 100G may be positioned in the gate trench 105. The buried gate structure 100G may be extended into the isolation layer 102 as the buried gate structure 100G is disposed in the active region 104 between the first source/drain region 112 and the second source/drain region 113. The bottom surface of a portion of the buried gate structure 100G disposed in the active region 104 and the bottom surface of a portion of the buried gate structure 100G disposed in the isolation layer 102 may be positioned at different levels. When the fin region 104F is omitted, the bottom surface of the portion of the buried gate structure 100G disposed in the active region 104 and the bottom surface of the portion of the buried gate structure 100G disposed in the isolation layer 102 may be positioned at the same level.

The buried gate structure 100G may include a gate dielectric layer 106, a barrier 107, a first gate electrode 108, a dipole inducing layer 109, a second gate electrode 110, and a capping layer 111.

The gate dielectric layer 106 may be conformally formed on the bottom and sidewalls of the gate trench 105. The gate dielectric layer 106 may include a silicon oxide, a silicon nitride, a silicon oxynitride, a high-k material, or a combination thereof. The high-k material may include a material having a greater dielectric constant than the dielectric constant of a silicon oxide. For example, the high-k material may include a material having a greater dielectric constant than 3.9. In accordance with an embodiment, the high-k material may include a material having a greater dielectric constant than 10. In accordance with an embodiment, the high-k material may include a material having a dielectric constant of 10 to 30. The high-k material may include at least one metallic element. The high-k material may include hafnium-containing material. The hafnium containing material may include a hafnium oxide, a hafnium silicon oxide, a hafnium silicon oxynitride, or a combination thereof. In accordance with an embodiment, the high-k material may be selected from a group including a lanthanum oxide, a lanthanum aluminum oxide, a zirconium oxide, a zirconium silicon oxide, a zirconium silicon oxynitride, an aluminum oxide, and combinations thereof. As for the high-dielectric material, other high-k materials known in the art may be optionally used. The gate dielectric layer 106 may include a metal oxide.

The barrier 107 may be formed over the gate dielectric layer 106. A first gate electrode 108 may be formed over the barrier 107. The top surfaces of the barrier 107 and the first gate electrode 108 may be at a lower level than the top surface of the substrate 101. The barrier 107 and the first gate electrode 108 may be formed to fill the bottom portion of the gate trench 105. The barrier 107 and the first gate electrode 108 may be of low resistance materials to lower a gate sheet resistance. The barrier 107 and the first gate electrode 108 may be made of metal-based materials.

The barrier 107 may include a metal nitride. The barrier 107 may be formed of a tantalum nitride (TaN) or a titanium nitride (TiN). In accordance with an embodiment, the barrier 107 may have a high work function. Herein, the high work function may refer to a work function that is higher than a mid-gap work function of silicon. A low work function may refer to a work function that is lower than the mid-gap work function of silicon. The high work function may be higher than approximately 4.5 eV, and the low work function may be lower than approximately 4.5 eV.

The barrier 107 may have an increased high work function. The barrier 107 may include a metal silicon nitride. The metal silicon nitride may be a metal nitride doped with silicon. The barrier 107 may be a metal silicon nitride with a controlled silicon content. For example, the barrier 107 may be a tantalum silicon nitride (TaSiN) or a titanium silicon nitride (TiSiN). A titanium nitride may have a high work function, and the titanium nitride may contain silicon to further increase the work function of the titanium nitride. The titanium silicon nitride may have an adjusted silicon content to have an increased high work function. In order to have the increased high work function, the content (atomic percent: at %) of silicon in the titanium silicon nitride may be approximately 20 at % or less. In a comparative example, for a low work function, the content of silicon in the titanium silicon nitride may be approximately 30 at % or more.

The first gate electrode 108 and the second gate electrode 110 may include a metal or a metal nitride. The first gate electrode 108 and the second gate electrode 110 may include tungsten or a titanium nitride. When tungsten is used as the first gate electrode 108, the gate dielectric layer 106 may be damaged when making the first gate electrode 108. For example, the tungsten layer may be deposited using a tungsten hexafluoride ($WF_6$) gas, and the gate dielectric layer 106 may be attacked by the fluorine used in the making of the tungsten layer. To address this concern the barrier 107 may be formed between the first gate electrode 108 and the gate dielectric layer 106 to prevent the fluorine from contacting the gate dielectric layer 106. In an embodiment, the first gate electrode 108 may be formed of tungsten (W), and the second gate electrode 110 may be formed of a titanium nitride (TiN). The barrier between the second gate electrode 110 and the gate dielectric layer 106 may be omitted.

The stack of the barrier 107 and the first gate electrode 108 may be referred to also herein as 'a lower conductive layer', and the second gate electrode 110 may be referred to also herein as 'an upper conductive layer'. The lower conductive layer may include a metal or a metal nitride. Also, the lower conductive layer may include a metal nitride/metal stack in which a metal is formed over a metal nitride. The upper conductive layer may be formed only of a metal nitride.

The capping layer 111 may be formed over the second gate electrode 110 to protect the second gate electrode 110. The capping layer 111 may be made of a suitable dielectric material including, for example, a silicon nitride, a silicon oxynitride, or a combination thereof. In an embodiment, the capping layer 111 may include a combination of a silicon nitride and a silicon oxide. The capping layer 111 may include a silicon nitride liner and a spin-on-dielectric (SOD) material.

The dipole inducing layer 109 may include an interface portion 109I and side portions 109S1 and 109S2. The interface portion 109I may be formed between the first gate electrode 108 and the second gate electrode 110. The side portions 109S1 and 109S2 may be formed between the second gate electrode 110 and the gate dielectric layer 106. The side portions 109S1 and 109S2 may include a first side portion 109S1 and a second side portion 109S2. The first side portion 109S1 may be positioned between the first source/drain region 112 and the second gate electrode 110. The second side portion 109S2 may be positioned between the second source/drain region 113 and the second gate electrode 110.

As described above, the dipole inducing layer 109 may include the interface portion 109I and the first and second side portions 109S1 and 109S2 that are extended continuously from both ends of the interface portion 109I. The interface portion 109I may directly contact the first gate electrode 108 and the second gate electrode 110. The first and second side portions 109S1 and 109S2 may directly contact the gate dielectric layer 106 and the second gate electrode 110. The first and second side portions 109S1 and 109S2 may be in direct contact with the sidewalls of the second gate electrode 110. Both ends of the interface portion 109I may directly contact the top surface of the barrier 107. The top surface of the first and second side portions 109S1 and 109S2 and the top surface of the second gate electrode 110 may be at the same level. The top surfaces of the first and second side portions 109S1 and 109S2 may be at a lower level than the top surface of the active region 104.

The dipole inducing layer 109 may overlap with the first source/drain region 112 and the second source/drain region 113. The dipole inducing layer 109 may overlap with the first and second source/drain regions 112 and 113 in the horizontal direction, e.g., along line I-I' of FIG. 2A, with the gate dielectric layer 106 disposed therebetween. The dipole inducing layer 109 may partially overlap with the first and second source/drain regions 112 and 113. The first and second side portions 109S1 and 109S2 may partially overlap with the first and second source/drain regions 112 and 113. That is, the top surfaces of the first and second side portions 109S1 and 109S2 may be at a lower level than the top surfaces of the first and second source/drain regions 112 and 113. The second gate electrode 110 may overlap with the first and second source/drain regions 112 and 113 in the horizontal direction (see the reference symbol I-I') with the dipole inducing layer 109 and the gate dielectric layer 106 disposed therebetween. The lowest portion of the dipole inducing layer 109, that is, the interface portion 109I, may be at the same level as the lowest portions of the first portion of the first source/drain region 112 and the second source/drain region 113. The dipole inducing layer 109 may not overlap with the channel CH in the horizontal direction, thus, the dipole inducing layer 109 may not affect the dose of the channel CH.

The dipole inducing layer 109 may be made of any suitable dielectric material. The dipole inducing layer 109 may include a high-k material. The dipole inducing layer 109 and the gate dielectric layer 106 may be made of different materials. The dipole inductive layer 109 may have a higher dielectric constant than that of the gate dielectric layer 106.

The interface portion 109I of the dipole inducing layer 109 may be sufficiently thin for allowing electrical connection between the first gate electrode 108 and the second gate electrode 110. In accordance with an embodiment, the dipole inducing layer 109 may include a monolayer. The dipole inducing layer 109 may have a thickness of approximately 10 Å or less. For example, a lanthanum oxide ($La_2O_3$) having a thickness of approximately 10 Å or less may be employed according to an embodiment and may electrically connect the first gate electrode 108 and the second gate electrode 110 to each other. The dipole inducing layer 109 may be referred to also herein as 'ultra-thin dipole inducing layer'.

The dipole inducing layer 109 may include a material having a lower oxygen atom areal density than that of the gate dielectric layer 106. The dipole inducing layer 109 and the gate dielectric layer 106 may generate a dipole in a direction of decreasing the work function due to the difference of the oxygen atom areal density. The dipole may reduce the effective work function value of the second gate electrode 110. Thus, the dipole inducing layer 109 may also be referred to herein as 'a low work function liner'.

The dipole generation mechanism will be described as follows. The oxygen atom areal density in the dipole inducing layer 109 may be lower than the oxygen atom areal density of the gate dielectric layer 106. Due to the difference in the oxygen atom areal density, the oxygen atoms of the gate dielectric layer 106 may be diffused into the dipole inducing layer 109. As the oxygen atoms diffuse, the gate dielectric layer 106 may become positively charged, and the dipole inducing layer 109 may become negatively charged. Thus, a dipole may be induced on the interface between the positively charged gate dielectric layer 106 and the negatively charged dipole inducing layer 109. When the dipole is induced, the energy band of the second gate electrode 110 may be increased, so that the second gate electrode 110 may have a decreased work function. As a result, the gate-induced drain leakage (GIDL) may be suppressed substantially as the work function of the second gate electrode 110 decreases. The dipole inducing layer 109 may not overlap with the channel CH in the horizontal direction. When the dipole inducing layer 109 and the channel CH overlap with each other, it is difficult to adjust the threshold voltage due to the induction of a low work function. The dipole inducing layer 109 may be in direct contact with the gate dielectric layer 106 and the second gate electrode 110 for decreasing the work function of the second gate electrode 110.

The gate dielectric layer 106 may include a silicon oxide ($SiO_2$), and the dipole inducing layer 109 may be made of a material having a lower oxygen atom areal density than the silicon oxide. The dipole inducing layer 109 may include a metal atom. The dipole inducing layer 109 may include a metal oxide. The dipole inducing layer 109 may include a metal oxide monolayer. The dipole inducing layer 109 may include a lanthanum atom. The dipole inducing layer 109 may include a lanthanum oxide or a lanthanum oxide monolayer. The lanthanum atom may be referred to also herein as 'a dipole inducing chemical species (DICS).' For example, the oxygen atom areal density ratio of the lanthanum oxide to the silicon oxide ($SiO_2$) may be approximately 0.77.

In accordance with an embodiment, the dipole inducing layer 109 may include an yttrium oxide ($Y_2O_3$), a germanium oxide ($GeO_2$), a lutetium oxide ($Lu_2O_3$), or a strontium oxide (SrO).

In accordance with an embodiment, the gate dielectric layer 106 may include a first metal oxide, and the dipole inducing layer 109 may include a second metal oxide having a lower oxygen atom areal density than that of the first metal oxide.

According to the above description, the dipole inducing layer 109 may form a dipole, and the dipole may lower the flat-band voltage. As a result, the suppression of the gate-induced drain leakage (GIDL) may be improved. Since the dipole inducing layer 109 is thin, a conductive path through which the first gate electrode 109 and the second gate electrode 110 are electrically connected may be formed.

In addition, since the second gate electrode 110 has a barrier-less structure, the gate sheet resistance may be lowered. Also, since the upper portion of the gate trench 105 is filled with the second gate electrode 110 and the dipole inducing layer 109 without a barrier, the filling characteristics of the second gate electrode 110 may be improved.

In a comparative example, when a barrier such as TiN is added between the second gate electrode 110 and the dipole inducing layer 109, not only the gate sheet resistance is increased but also defects, such as voids, may be formed in the second gate electrode 110.

As another comparative example, a barrier such as TiN may be added between the dipole inducing layer 109 and the gate dielectric layer 106. For example, DICS, e.g., La, may be diffused from the dipole inducing layer 109 into the TiN barrier. As a result, a lanthanum atom-diffused TiN barrier (La-diffused TiN barrier) may be in direct contact with the gate dielectric layer 106. However, when the lanthanum atom-diffused TiN barrier and the gate dielectric layer 106 are in direct contact with each other, the effect of suppressing the gate-induced drain leakage may be reduced, compared with the case where the gate inducing layer 109 and the gate dielectric layer 106 directly contact with each other. In addition, when the lanthanum atom-diffused TiN barrier (La-diffused TiN barrier) directly contacts the gate dielectric layer 106, it is difficult to obtain the low work function of the second gate electrode 110. Furthermore, in another comparative example, since there is a TiN barrier into which a lanthanum atom is diffused, the gate sheet resistance may be higher than in the case where there is no TiN barrier into which lanthanum atoms are diffused.

As described above, in this embodiment of the present invention, by directly contacting the dipole inducing layer 109 and the gate dielectric layer 106, not only the gate-induced drain leakage but also the gate sheet resistance may be reduced.

In accordance with an embodiment, the buried gate structure 100G may include a lower buried portion and an upper buried portion. The lower buried portion may include the barrier 107 and the first gate electrode 108. The upper buried portion may include the dipole inducing layer 109, the second gate electrode 110, and the capping layer 111. The upper buried region may overlap with the first and second source/drain regions 112 and 113 horizontally. The lower buried portion may not horizontally overlap with the first and second source/drain regions 112 and 113. The lower buried portion may overlap with the channel CH.

Figure 3:
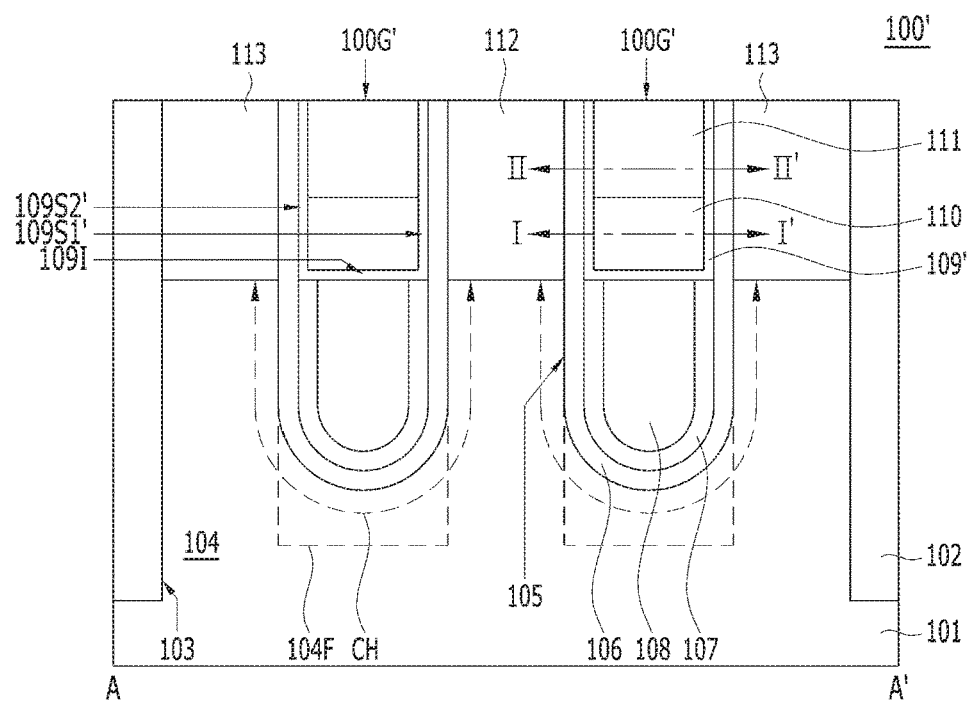
FIG. 3 is a cross-sectional view of a semiconductor device in accordance with an example of the embodiment of the present invention.

FIG. 3 is a cross-sectional view of a semiconductor device 100' in accordance with an example of an embodiment of the present invention. Some constituent elements of the semiconductor device 100' may be the same as those of the semiconductor device 100 of FIG. 2A. More specifically, the other constituent elements except for a dipole inducing layer 109' may be the same as those of the semiconductor device 100 of FIG. 2A.

Referring to FIG. 3, the semiconductor device 100' may have a buried gate structure 100G'. The buried gate structure 100G' may include a dipole inducing layer 109'. The dipole inducing layer 109' may include an interface portion 109I, a first side portion 109S1', and a second side portion 109S2'. The top surface of the second gate electrode 110 may be lower than the top surface of the first and second side portions 109S1' and 109S2'. The top surfaces of the first and second side portions 109S1' and 109S2' and the top surface of the active region 104 may be at the same level. In this case, the first and second side portions 109S1' and 109S2' may be in direct contact with both sidewalls of the capping layer 111.

The dipole inducing layer 109' may overlap with the first and second source/drain regions 112 and 113 in the horizontal direction (see I-I') with the gate dielectric layer 106 between them. The dipole inducing layer 109' may extend to be positioned between the capping layer 111 and the gate dielectric layer 106 (see II-II'). This may allow the dipole inducing layer 109' to fully overlap with the first and second source/drain regions 112 and 113. The second gate electrode 110 may overlap with the first and second source/drain regions 112 and 113 in the horizontal direction (see I-I') with the dipole inducing layer 109' and the gate dielectric layer 106 interposed between them. The lowest portion of the dipole inducing layer 109' may be at the same level as the lowest portion of the first source/drain region 112 and the second source/drain region 113. The dipole inducing layer 109' may not overlap the channel CH in the horizontal directions.

The dipole inducing layer 109' may be made of the same material as the dipole inducing layer 109 of FIG. 2.

FIGS. 4A to 4H illustrate an example of a method for fabricating the semiconductor device 100 shown in FIGS. 2A and 2B.

Figure 4A:
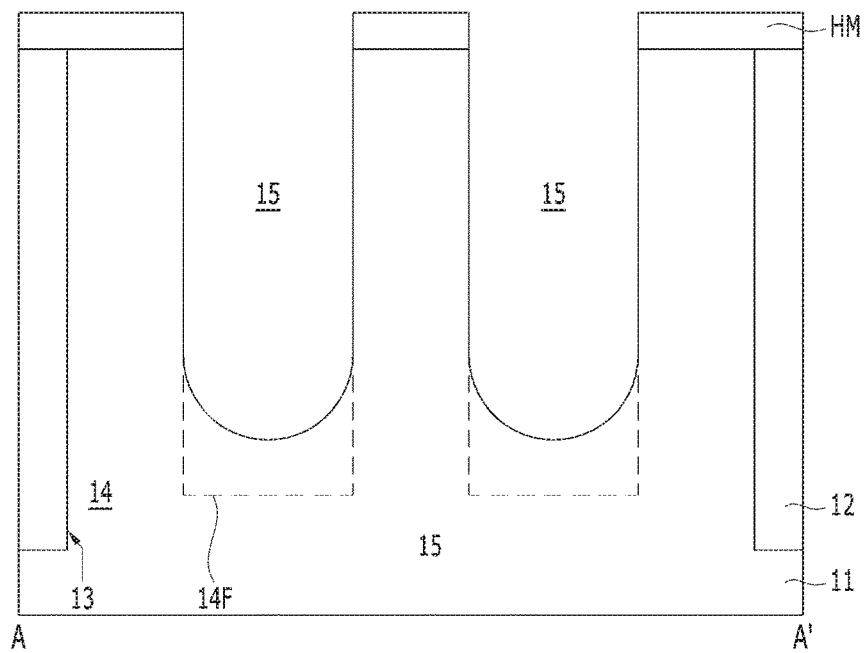
FIGS. 4A to 4H illustrate an example of a method for fabricating the semiconductor device 100 shown in FIGS. 2A and 2B.

Referring to FIG. 4A, an isolation layer 12 may be formed over the substrate 11. An active region 14 may be defined by the isolation layer 12. The isolation layer 12 may be formed by a Shallow Trench Isolation (STI) process. For example, the substrate 11 may be etched to form the isolation trench 13. The isolation trench 13 may be filled with a dielectric material, and thus an isolation layer 12 may be formed. The isolation layer 12 may include a silicon oxide, a silicon nitride, or a combination thereof. Chemical Vapor Deposition (CVD) process or other deposition processes may be used to fill the isolation trench 13 with a dielectric material. A planarization process such as Chemical-Mechanical Polishing (CMP) may be additionally performed for removing excess dielectric material from the isolation trench and creating a flat polished top surface for the isolation layer 12.

A gate trench 15 may be formed in the substrate 11. The gate trench 15 may be formed in the shape of a line traversing the active region 14 and the isolation layer 12. In an embodiment, the gate trench 15 may be formed by using a hard mask HM as an etch mask and performing an etching process. The hard mask HM may be formed over the substrate 11 and may have a line-shaped opening. The hard mask HM may be formed of a material having an etch selectivity with respect to the substrate 11. For example, in an embodiment, the hard mask HM may be a silicon oxide such as TEOS (Tetra-Ethyl-Ortho-Silicate). The gate trench 15 may be formed shallower than the isolation trench 13. The gate trench 15 may have sufficient depth to increase the average cross-sectional area of the subsequent gate electrode. Thus, the resistance of the gate electrode may be reduced. The bottom portion of the gate trench 15 may have a curvature. By forming the trenches to have the curvature, the gate trenches 15 may be filled more readily with the various materials. Also, the curvature may contribute in the alleviation of an electric field at the bottom edge of the gate trench 16.

Subsequently, the fin region 14F may be formed. For forming the fin region 14F, the isolation layer 12 below the gate trench 15 may be recessed. As for the fin region 14F, the fin region 104F of FIG. 2B will be referred to.

Figure 4B:
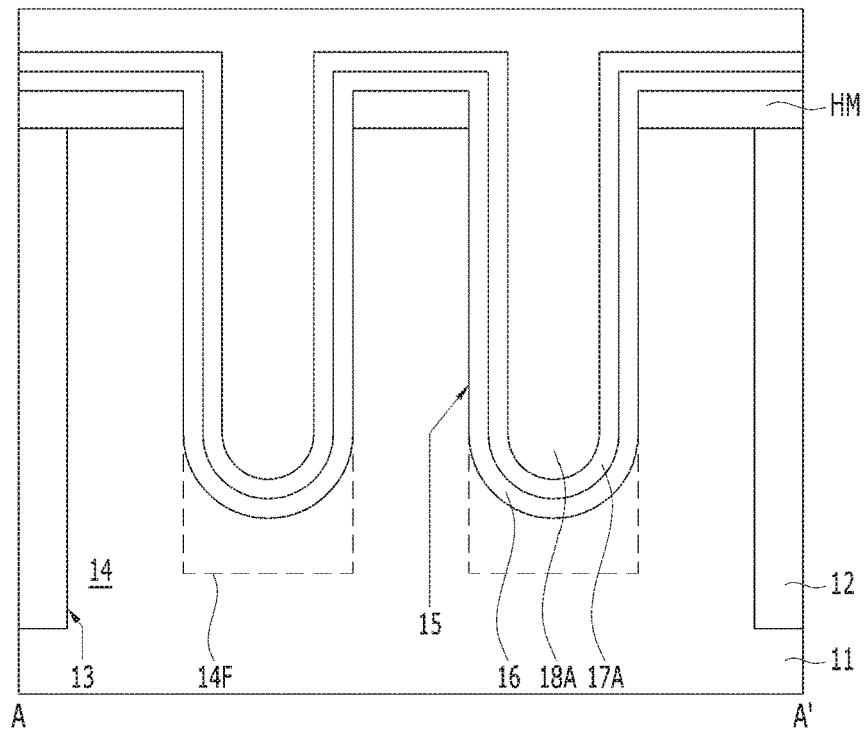

A gate dielectric layer 16 may be formed on the surface of the gate trench 15 and the hard mask HM, as shown in FIG. 4B. The etch damage of the surface of the gate trench 15 may be corrected before the gate dielectric layer 16 is formed. For example, after a sacrificial oxide is formed by a thermal oxidation treatment, the sacrificial oxide may be removed.

The gate dielectric layer 16 may be formed by a thermal oxidation process. In accordance with an embodiment, the gate dielectric layer 16 may be formed by Chemical Vapor Deposition (CVD) or Atomic Layer Deposition (ALD). The gate dielectric layer 16 may include a high dielectric material, an oxide, a nitride, an oxynitride, or a combination thereof. The high dielectric material may include a hafnium-containing material. The hafnium-containing material may include a hafnium oxide, a hafnium silicon oxide, a hafnium silicon oxynitride, or a combination thereof. In accordance with an embodiment, the high-k material may include a lanthanum oxide, a lanthanum aluminum oxide, a zirconium oxide, a zirconium silicon oxide, a zirconium silicon oxynitride, an aluminum oxide, or a combination thereof. As for the high-dielectric material, other high-k materials known in the art may be optionally used. The gate dielectric layer 16 may include a material having a high oxygen atom areal density.

A barrier layer 17A may be formed over the gate dielectric layer 16. The barrier layer 17A may be conformally formed on the surface of the gate dielectric layer 16. The barrier layer 17A may include a metal-based material. The barrier layer 17A may include a metal nitride. The barrier layer 17A may include a titanium nitride or a tantalum nitride. The barrier layer 17A may be formed by performing an Atomic Layer Deposition (ALD) process or a Chemical Vapor Deposition (CVD) process.

A first conductive layer 18A may be formed over the barrier layer 17A. The first conductive layer 18A may fill the gate trench 15. The first conductive layer 18A may include a low resistance metal material. The first conductive layer 18A may include tungsten. The first conductive layer 18A may be formed by a CVD process or an ALD process.

Figure 4C:
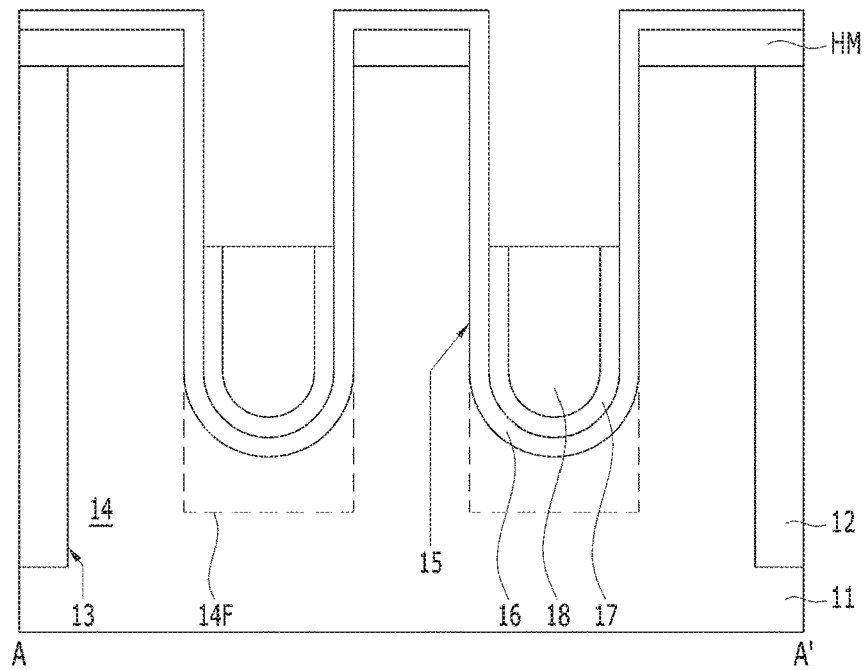

Referring to FIG. 4C, a barrier 17 and a first gate electrode 18 may be formed in the gate trench 15. For forming the barrier 17 and the first gate electrode 18, a recessing process may be performed. The recessing process may include a dry etching process, for example, an etch-back process. The barrier 17 may be formed by an etch-back process of the barrier layer 17A. The first gate electrode 18 may be formed by an etch-back process of the first conductive layer 18A. In accordance with an embodiment, the recessing process may include first performing a planarization process for exposing a top surface of the hard mask HM, and then performing an etch-back process following the planarization process. For example, the planarization process may be a chemical mechanical polishing. The top surfaces of the barrier 17 and the first gate electrode 18 may be positioned at the same level.

The top surfaces of the barrier 17 and the first gate electrode 18 may be formed to be lower than the top surface of the active region 14. The barrier 17 and the first gate electrode 18 may also be referred to herein as 'a lower conductive layer or a lower buried portion'.

Figure 4D:
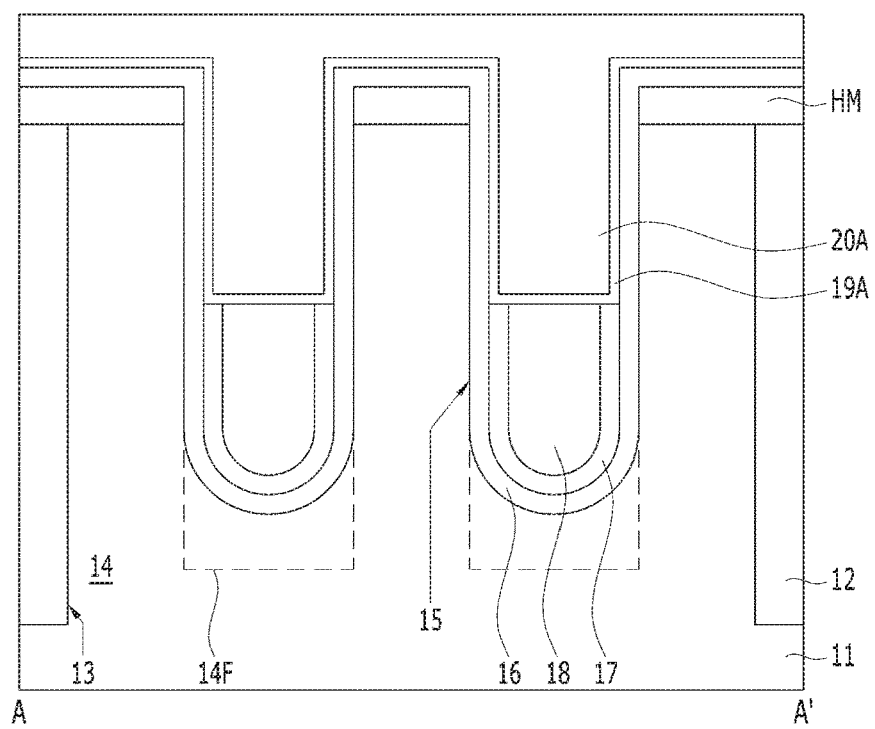

Referring to FIG. 4D, a dipole inducing material 19A may be formed over the top surfaces of the barrier 17 and the first gate electrode 18 and also over the exposed surface of the gate dielectric layer 16. The dipole inducing material 19A may be formed conformally over the aforementioned surfaces. In an embodiment, the dipole inducing material 19A may be formed by performing an atomic layer deposition (ALD) process or a chemical vapor deposition (CVD) process. The thickness of the dipole inducing material 19A may be sufficiently thin for an effective electrical connection between the subsequent first gate electrode and the second gate electrode. The thickness of the dipole inducing material 19A may be thinner than the thickness of the gate dielectric layer 16. Preferably, the dipole inducing material 19A may have a thickness of approximately 10 Å or less. More preferably, the dipole inducing material 19A may have a thickness of approximately 1 to 10 Å. The dipole inducing material 19A may be a monolayer. The dipole inductive material 19A and the gate dielectric layer 16 may form a dipole for adequately reducing an effective work function of the second gate electrode 20. In an embodiment, the dipole inducing material 19A may be a metal oxide or a metal oxide monolayer. The dipole inducing material 19A may include a lanthanum oxide ($La_2O_3$) or a lanthanum oxide monolayer. In accordance with an embodiment, the dipole inducing material 19A may include an yttrium oxide ($Y_2O_3$), a germanium oxide ($GeO_2$), a lutetium oxide ($Lu_2O_3$), or a strontium oxide (SrO). The dipole inductive material 19A may include a material having a lower oxygen atom areal density than the gate dielectric layer 16. Thus, the dipole inducing material 19A and the gate dielectric layer 16 may induce a dipole that reduces a work function.

A second conductive layer 20A may be formed over the dipole inducing material 19A. The second conductive layer 20A may fill the remaining space of the gate trench 15. The second conductive layer 20A may include a low-resistance metal material. The second conductive layer 20A may comprise a titanium nitride. The second conductive layer 20A may be formed by a chemical vapor deposition (CVD) process or an atomic layer deposition (ALD) process. The first gate electrode 18 and the second conductive layer 20A may be made of the same material. In accordance with an embodiment, the first gate electrode 18 and the second conductive layer 20A may be formed of different materials. The first gate electrode 18 and the second conductive layer 20A may be formed of a low-resistance material to lower the gate-sheet resistance.

Figure 4E:
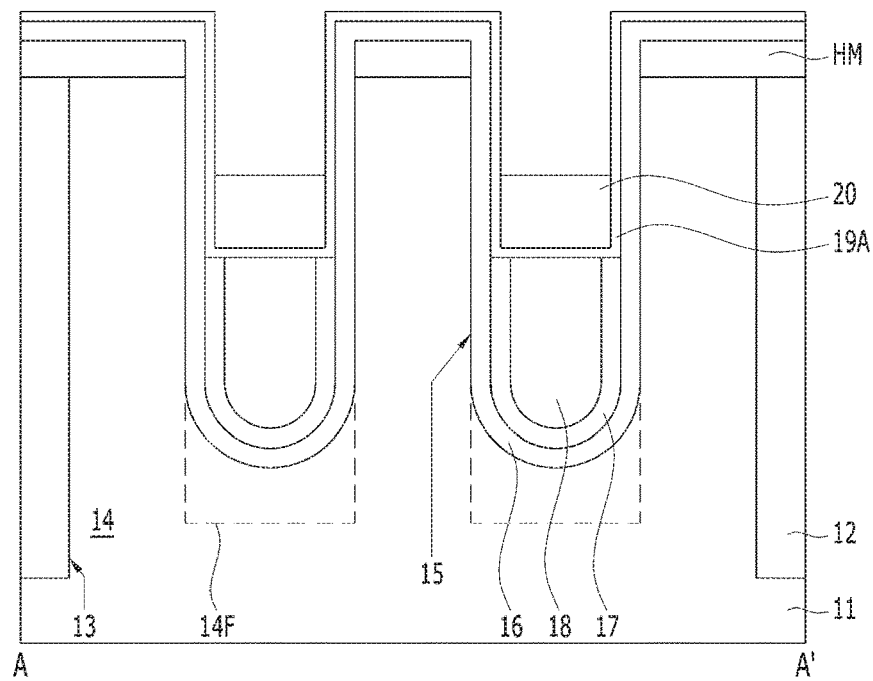

Referring to FIG. 4E, the second gate electrode 20 may be formed inside the gate trench 15. For forming the second gate electrode 20, a recessing process may be performed. The recessing process may include performing dry etching, for example, an etch-back process. The second gate electrode 20 may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14.

Figure 4F:
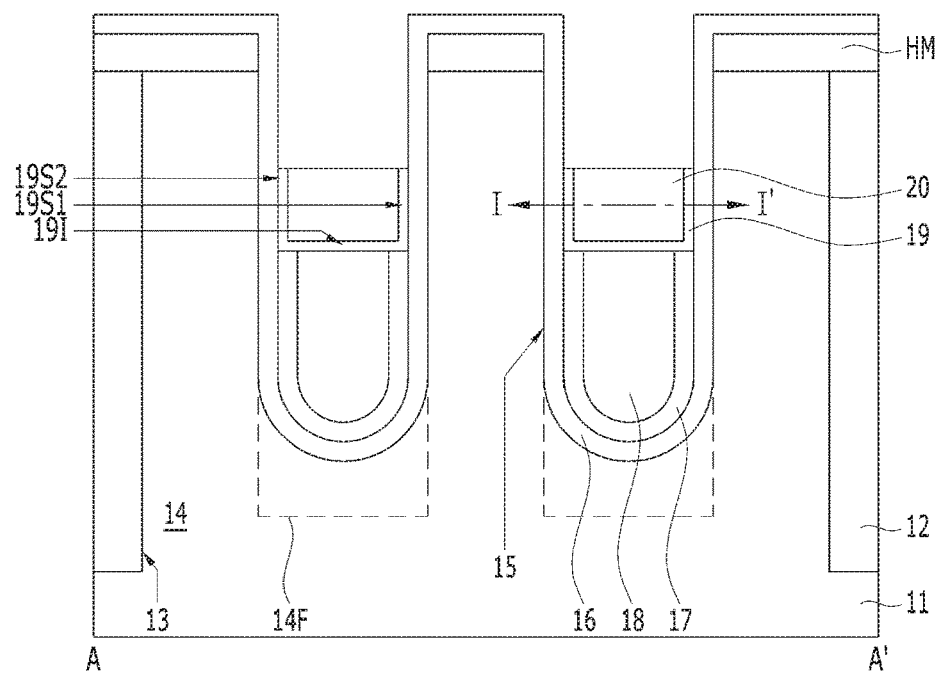

Referring to FIG. 4F, a dipole inducing layer 19 may be formed inside the gate trench 15. For forming the dipole inducing layer 19, a recessing process may be performed. The recessing process may include performing dry etching, for example, an etch-back process. The dipole inducing layer 19 may be formed by an etch-back process of the dipole inducing material 19A. In accordance with an embodiment, the recessing process may include first performing a planarization process for exposing the hard mask HM, and then performing an etch-back process following the planarization process. The top surfaces of the dipole inducing layer 19 and the second gate electrode 20 may be positioned at the same level. The top surface of the dipole inducing layer 19 may be recessed lower than the top surface of the active region 14. In accordance with an embodiment, the recessing process of the dipole inducing material 19A may include performing wet etching. For example, the wet etching may be performed by a mixture of HCl/HF.

The dipole inducing layer 19 may include an interface portion 19I, a first side portion 19S1, and a second side portion 19S2. The first and second side portions 19S1 and 19S2 may have a shape extending vertically upwards from the interface portion 19I. The interface portion 19I may be positioned between and be in direct contact with the first gate electrode 18 and the second gate electrode 20. The interface portion 19I may be coupled to the top surface of the barrier 17. The top surfaces of the first and second side portions 19S1 and 19S2 may be positioned at a lower level than the top surface of the substrate 11. The top surfaces of the first and second side portions 19S1 and 19S2 may be positioned at the same level as the top surface of the second gate electrode 20. The dipole inducing layer 19 may be formed to be in direct contact with the second gate electrode 20 and the gate dielectric layer 16.

The dipole inducing layer 19 and the second gate electrode 20 may be referred to also herein as 'an upper conductive layer or an upper buried portion'.

Figure 4G:
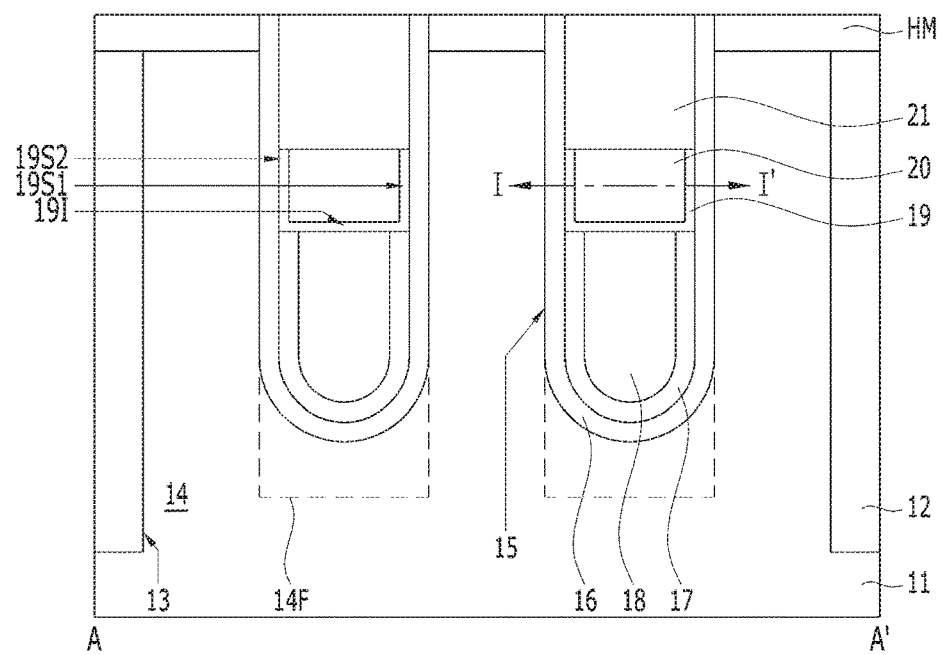

Referring to FIG. 4G, a capping layer 21 is formed on the dipole inducing layer 19 and the second gate electrode 20. The capping layer 21 may fill the remaining of the gate trench 15. Subsequently, the capping layer 21 may be planarized so that a top surface of the hard mask HM is exposed. During the planarization process or after the planarization process of the capping layer 21, the gate dielectric layer 16 which extended on the top surface of the hard mask HM may be removed. The gate dielectric layer 16 may remain in the gate trench 15. The capping layer 21 may be formed of any suitable dielectric material. For example, the capping layer 21 may include a silicon nitride. In an embodiment, the capping layer 21 may have an ONO (Oxide-Nitride-Oxide) structure.

Through the above-described processes, the buried gate structure may be formed. The buried gate structure may include the gate dielectric layer 16, the barrier 17, the first gate electrode 18, the dipole inducing layer 19, the second gate electrode 20 and the capping layer 21. The top surface of the second gate electrode 20 may be positioned lower than the top surface of the active region 14. Thus, as the top surface of the second gate electrode 20 is physically recessed, an effective physical distance between the second gate electrode 20 and the surrounding conductive material (e.g., a contact plug) may be sufficiently secured.

Figure 4H:
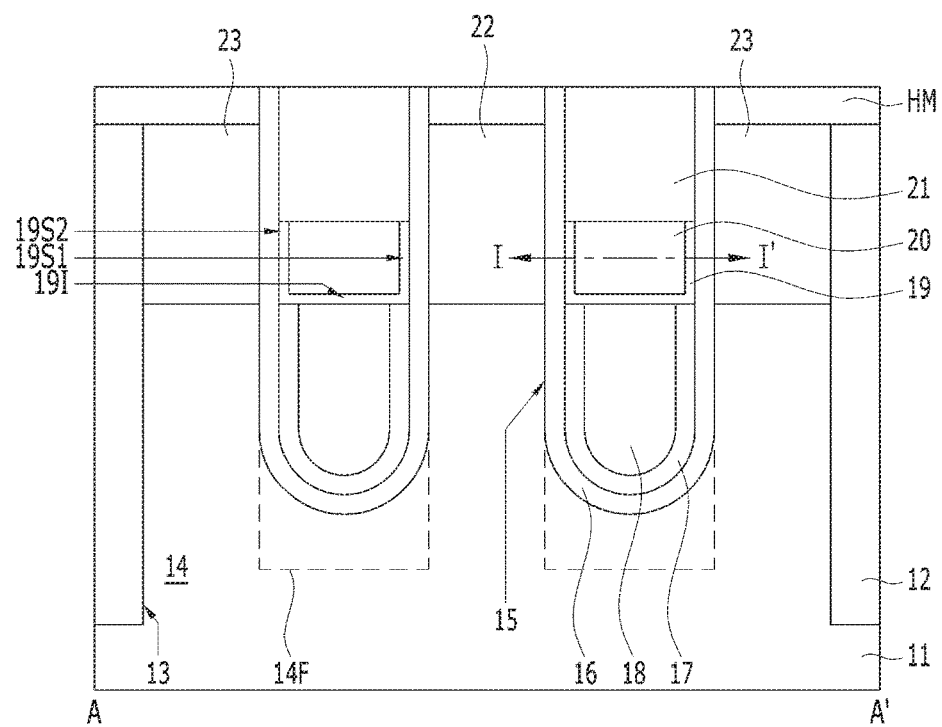

After the capping layer 21 is formed, as illustrated in FIG. 4H, a doping process of doping an impurity may be performed by an implantation or other doping techniques. Thus, a first source/drain region 22 and a second source/drain region 23 may be formed in the substrate 11. The first source/drain region 22 and the second source/drain region 23 may overlap with the second gate electrode 20 and the dipole inducing layer 19 in the horizontal direction. The dipole inductive layer 19 may overlap horizontally (see I-I') with the first and second source/drain regions 22 and 23. The barrier 17 and the first gate electrode 18 may not horizontally overlap (see I-I') with the first and second source/drain regions 22 and 23. The lowest portion of the dipole inducing layer 19 may be at the same level as the lowest portion of the first source/drain region 22 and the second source/drain region 23.

As described above, since the dipole inducing layer 19 and the gate dielectric layer 16 are in direct contact with each other, gate-induced drain leakage may be suppressed substantially.

In a comparative example, the dipole inducing material 19A is etched back before forming the second conductive layer 20A. This allows the dipole inductive layer 19 to remain in the form of a spacer on the sidewalls of the gate dielectric layer 16 and subsequently form the second gate electrode 20 by depositing the second conductive layer 20A and performing an etch-back process. However, this process of the comparative example may damage the underlying first gate electrode 18 during the etch-back process of the dipole inducing material 19A. In addition, in the process of the comparative example, the height of the dipole inducing layer 19 may not be adjusted.

Figure 5A:
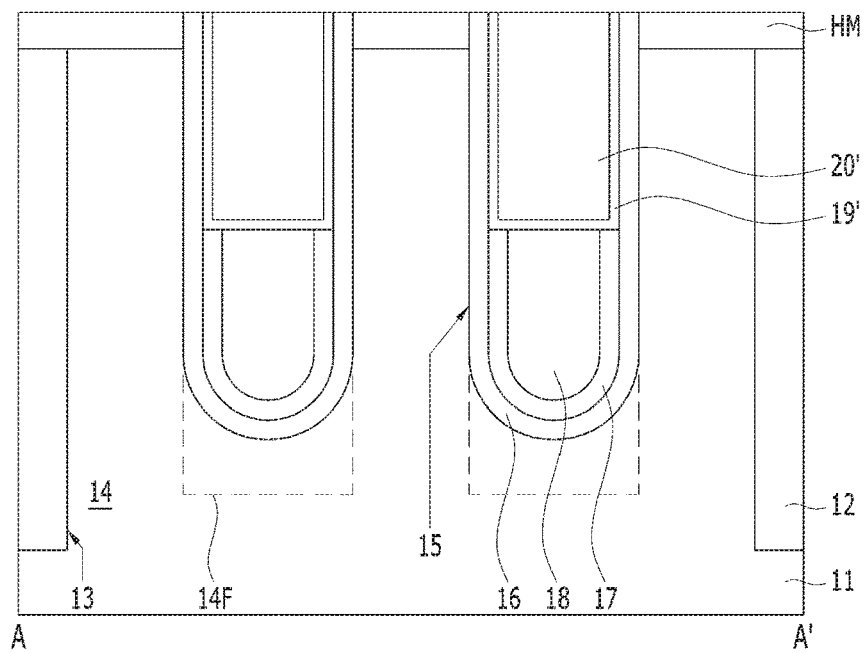
FIGS. 5A to 5C illustrate an example of a method for fabricating the semiconductor device 100' shown in FIG. 3.
Figure 5B:
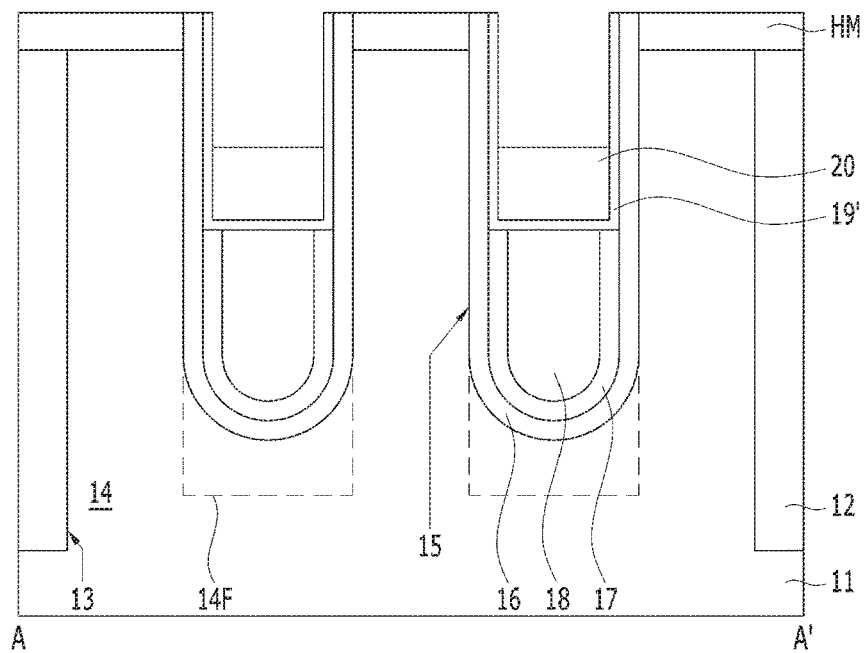
Figure 5C:
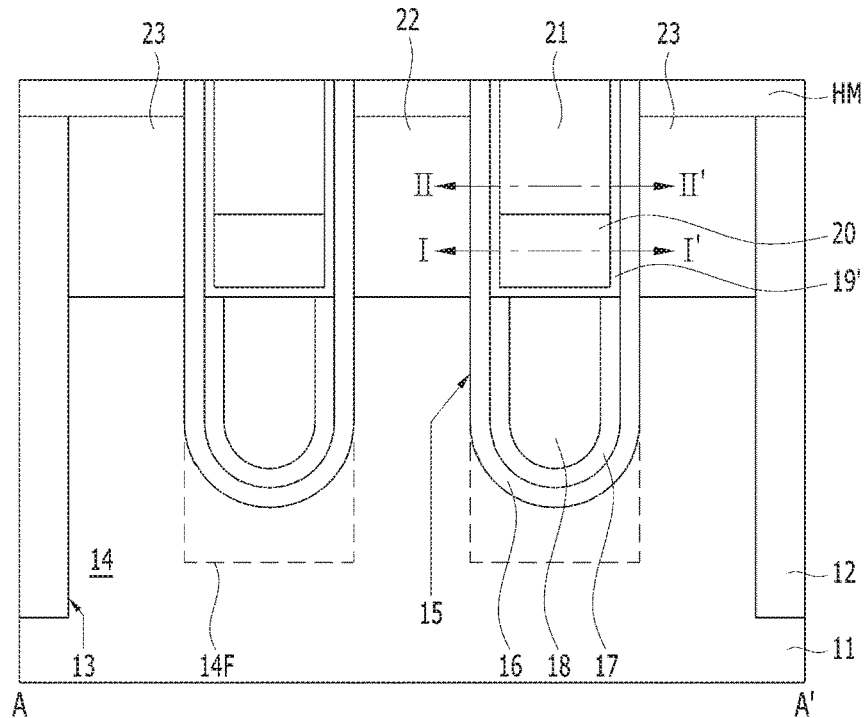

FIGS. 5A to 5C illustrate an example of a method for fabricating the semiconductor device 100' shown in FIG. 3.

First, a dipole inducing material 19A and a second conductive layer 20A may be formed by the method described in FIGS. 4A to 4D.

Subsequently, as shown in FIG. 5A, a second gate electrode 20' that is planarized in the gate trench 15 may be formed. For forming the planarized second gate electrode 20', a planarization process such as a chemical mechanical polishing may be performed. The planarization process may expose the top surface of the hard mask HM. Therefore, the top surface of the planarized second gate electrode 20' may be positioned at the same level as the top surface of the hard mask HM.

Subsequently, the dipole inducing layer 19' may be formed in the gate trench 15. To form the dipole inducing layer 19', a chemical mechanical polishing may be performed. The chemical mechanical polishing may be performed such that the top surface of the hard mask HM is exposed. Thus, the top surface of the dipole inducing layer 19' may be positioned at the same level as the top surface of the hard mask HM.

Referring to FIG. 5B, a second gate electrode 20 may be formed in the gate trench 15. For forming the second gate electrode 20, a recessing process of the planarized second gate electrode 20' may be performed. The recessing process may include performing dry etching, for example, an etch-back process. The top surface of the dipole inducing layer 19' and the second gate electrode 20 may be positioned at different levels. The top surface of the dipole inducing layer 19' may be positioned higher than the top surface of the active region 14, and the top surface of the second gate electrode 20 may be positioned lower than the active region 14.

The height of the dipole inducing layer 19' may be different from the height of the dipole inducing layer 19 of FIG. 4H. For example, the uppermost surface of the dipole inducing layer 19' may be positioned at a higher level than the top surface of the dipole inducing layer 19 of FIG. 4H.

Referring to FIG. 5C, a capping layer 21 may be formed over the dipole inducing layer 19' and the second gate electrode 20. Subsequently, the capping layer 21 may be planarized to expose the top surface of the hard mask HM. The capping layer 21 may include any suitable dielectric material. For example, the capping layer 21 may include a silicon nitride. In an embodiment, the capping layer 21 may have an ONO (Oxide-Nitride-Oxide) structure.

Through the above-described processes, a buried gate structure may be formed. The buried gate structure may include the gate dielectric layer 16, the barrier 17, the first gate electrode 18, the dipole inducing layer 19', the second gate electrode 20 and the capping layer 21. The top surface of the second gate electrode 20 may be positioned lower than the top surface of the substrate 11.

After the capping layer 21 is formed, a first source/drain region 22 and a second source/drain region 23 may be formed in the active region 14. The dipole inducing layer 19' may fully overlap with the first and second source/drain regions 22 and 23 horizontally (see (I-I'). The barrier 17 and the first gate electrode 18 may not overlap with the first and second source/drain regions 22 and 23.

The dipole inducing layer 19' and the gate dielectric layer 16 may be positioned between the capping layer 21 and the first and second source/drain regions 22 and 23 (see II-II'). The dipole inducing layer 19' and the gate dielectric layer 16 may be positioned between the second gate electrode 20 and the first and second source/drain regions 22 and 23 (see I-I'). The dipole inducing layer 19' may be positioned between and be in direct contact with the first gate electrode 18 and the second gate electrode 20. The dipole inducing layer 19' may be positioned between the second gate electrode 20 and the gate dielectric layer 16.

Figure 6:
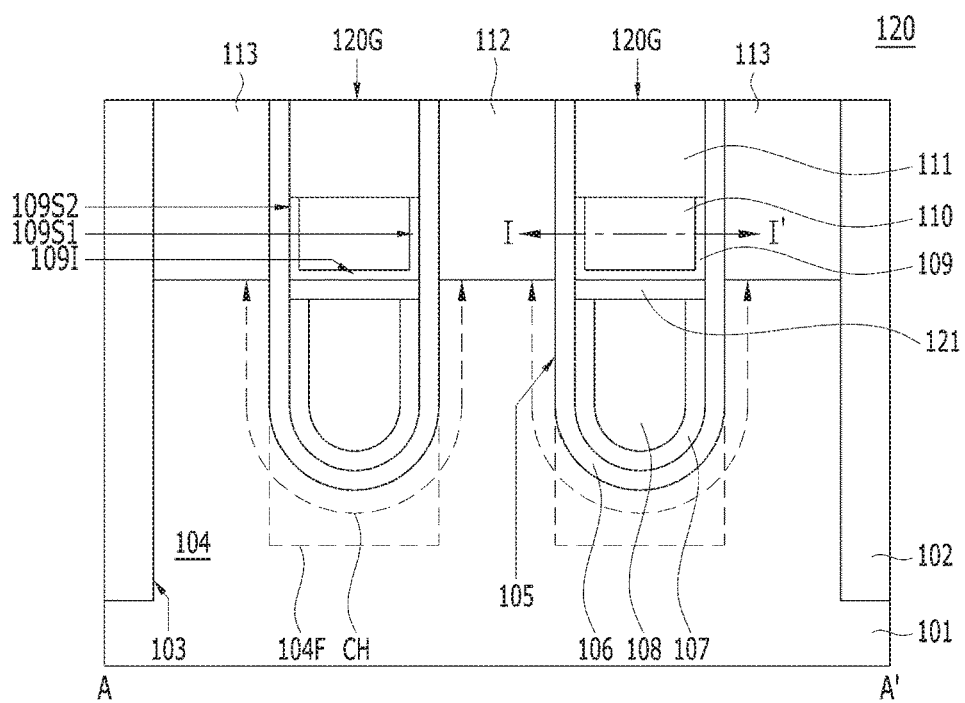
FIG. 6 is a cross-sectional view illustrating a semiconductor device 120 in accordance with a second embodiment of the present invention.

FIG. 6 is a cross-sectional view illustrating a semiconductor device 120 in accordance with a second embodiment of the present invention. Some constituent elements of the semiconductor device 120 may be the same as those of the semiconductor device 100 shown in FIG. 2A. More specifically, the other constituent elements except for an anti-oxidation barrier 121 may be the same as those of the semiconductor device 100 shown in FIG. 2A.

Referring to FIG. 6, the semiconductor device 120 may include a buried gate structure 120G. The buried gate structure 120G may include a gate dielectric layer 106, a barrier 107, a first gate electrode 108, an anti-oxidation barrier 121, a dipole inducing layer 109, a second gate electrode 110, and a capping layer 111. The anti-oxidation barrier 121 may be positioned between and be in direct contact with the first gate electrode 108 and the dipole inducing layer 109. A portion of the anti-oxidation barrier 121 may be extended to be positioned between the barrier 107 and the dipole inducing layer 109. The anti-oxidation barrier 121 may prevent the first gate electrode 108 from being oxidized. For example, the top surface of the first gate electrode 108 may be prevented from being oxidized during the formation of the dipole inducing layer 109.

The anti-oxidation barrier 121 may include a conductive material. The anti-oxidation barrier 121 may be a metal-based material for the buried gate structure 120G to have a low resistance. The anti-oxidation barrier 121 may be of a metal nitride. For example, the anti-oxidation barrier 121 may be formed of a titanium nitride. The barrier 107 and the anti-oxidation barrier 121 may be made of the same material.

The anti-oxidation barrier 121 may not horizontally overlap with the first and second source/drain regions 112 and 113. For example, the anti-oxidation barrier 121 may not be extended to the interface between the dipole inducing layer 109 and the gate dielectric layer 106.

FIGS. 7A to 7E illustrate an example of a method for fabricating the semiconductor device 120 shown in FIG. 6.

First, a barrier 17 and a first gate electrode 18 may be formed in a gate trench 15 by the method described in FIGS. 4A to 4C.

Subsequently, referring to FIG. 7A, an anti-oxidation layer 31A may be formed over the barrier 17 and the first gate electrode 18. The anti-oxidation layer 31A may include a material for preventing the oxidation of the first gate electrode 18. The anti-oxidation layer 31A may include a metal-based material. The anti-oxidation layer 31A may be formed of a metal nitride. The anti-oxidation layer 31A may be formed of a titanium nitride. An anti-oxidation layer 31A may be formed over the barrier 17, the first gate electrode 18, and the gate dielectric layer 16.

The anti-oxidation layer 31A may be deposited by a physical vapor deposition (PVD) process. Accordingly, the anti-oxidation layer 31A may be non-conformally deposited. For example, the thickness deposited over a flat surface (hereinafter, which will be denoted by 'D1') may be thicker than the thickness deposited over a vertical surface (hereinafter, which will be denoted by 'D1').

The thickness D1 deposited over the barrier 17 and the first gate electrode 18 may be thicker than the thickness D2 deposited over the gate dielectric layer 16 of the sidewall of the gate trench 15. The thickness D1 deposited over the gate dielectric layer 16 over the hard mask HM may also be thicker than the thickness D2 deposited over the gate dielectric layer 16 of the sidewall of the gate trench 15. The anti-oxidation layer 31A may be of the same thickness over the barrier 17, the first gate electrode 18 and the hard mask HM.

Figure 7A:
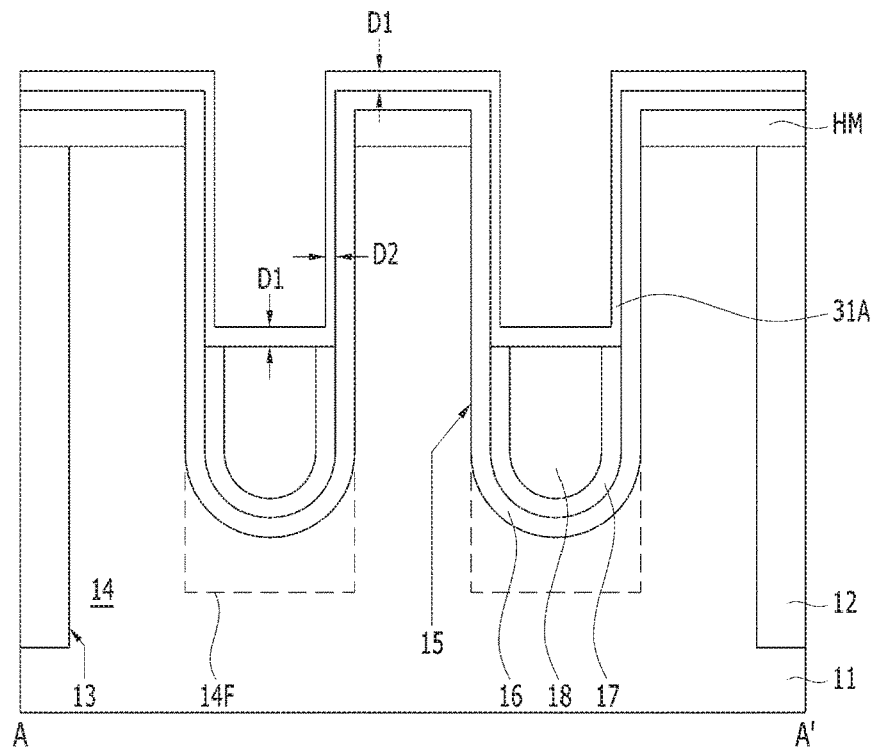
FIGS. 7A to 7E illustrate an example of a method for fabricating the semiconductor device 120 shown in FIG. 6.
Figure 7B:
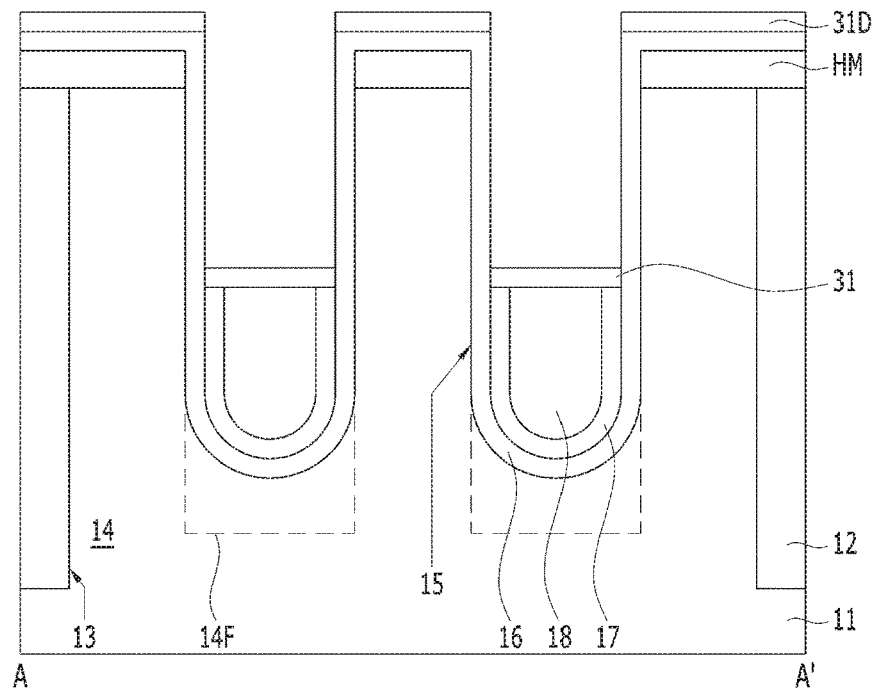

Referring to FIG. 7B, the anti-oxidation barrier 31 may be formed. The anti-oxidation barrier 31 may be formed by selectively etching the anti-oxidation layer 31A. The anti-oxidation barrier 31 may be positioned over the barrier 17 and the first gate electrode 18. The anti-oxidation layer 31A may be etched back to form the oxidation preventing barrier 31. The dummy anti-oxidation layer 31D may remain over the gate dielectric layer 16 over the hard mask HM. The anti-oxidation barrier 31 and the dummy anti-oxidation layer 31D may be discontinuous. The anti-oxidation layer may not remain on the sidewall of the upper portion of the gate trench 15.

Figure 7C:
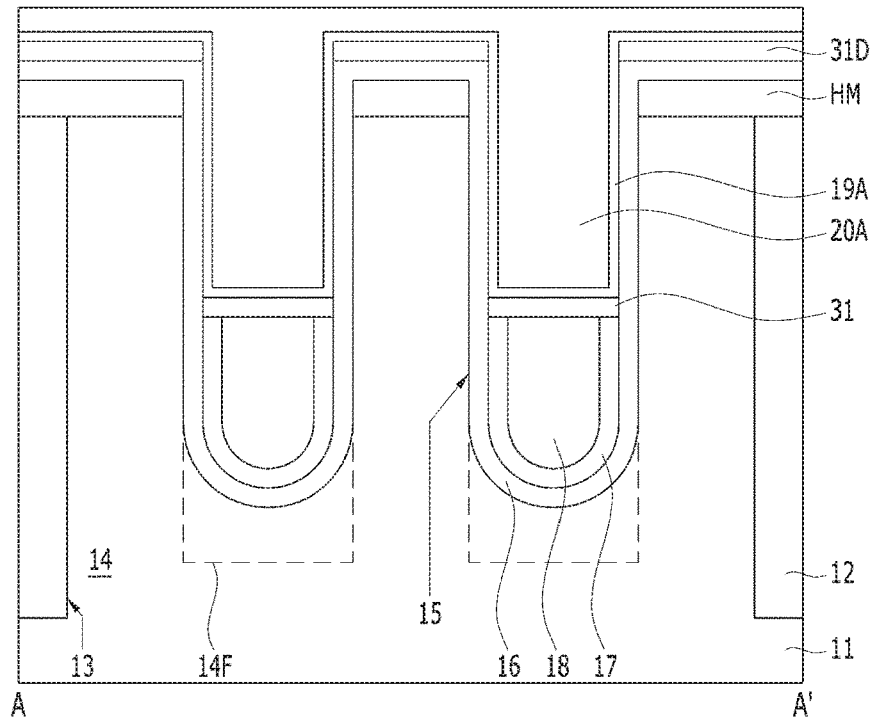

Referring to FIG. 7C, a dipole inducing material 19A may be formed. The dipole inducing material 19A may be conformally formed on the anti-oxidation barrier 31 and the gate dielectric layer 16.

A second conductive layer 20A may be formed over the dipole inducing material 19A. The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

The dipole inducing material 19A and the second conductive layer 20A may be the same as the dipole inducing material 19A and the second conductive layer 20A of FIG. 4D.

Figure 7D:
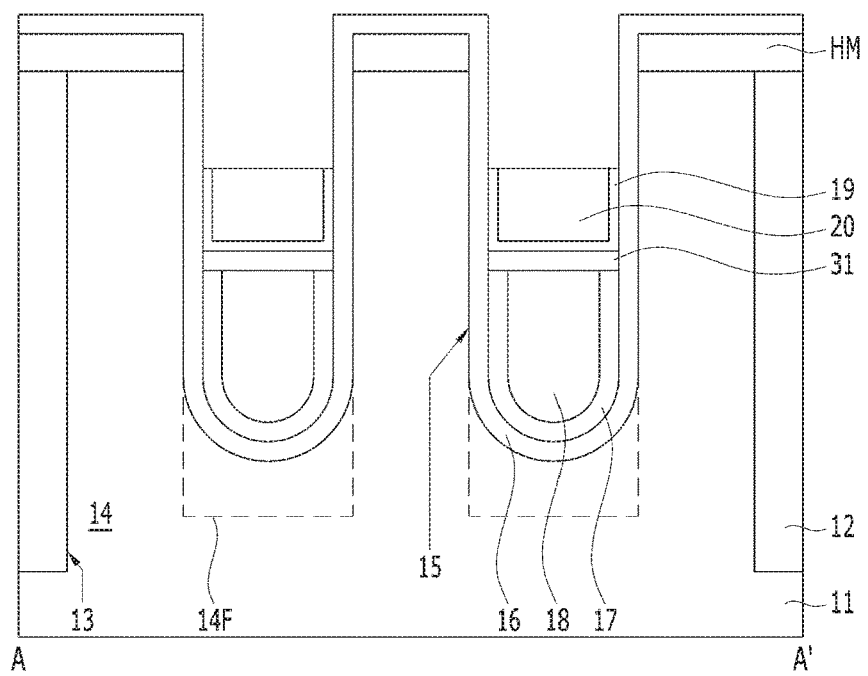

Referring to FIG. 7D, the second gate electrode 20 may be formed in the gate trench 15. For forming the second gate electrode 20, a recessing process may be performed. The recessing process may include performing dry etching, for example, an etch-back process. The second gate electrode 20 may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14. The dummy anti-oxidation layer 31D may be removed during the etch-back process of the second conductive layer 20A.

Subsequently, the dipole inducing layer 19 may be formed in the gate trench 15. For forming the dipole inducing layer 19, a recessing process may be performed. The recessing process may include performing dry etching, for example, an etch-back process. The dipole inducing layer 19 may be formed by an etch-back process of the dipole inducing material 19A. In accordance with an embodiment, the recessing process may include first performing a planarization process for exposing the hard mask HM, and then performing an etch-back process following the planarization process. The top surfaces of the dipole inducing layer 19 and the second gate electrode 20 may be positioned at the same level. The top surface of the dipole inducing layer 19 may be recessed lower than the top surface of the active region 14. In accordance with an embodiment, the recessing process of the dipole inducing material 19A may include performing wet etching. For example, the wet etching may be performed by a mixture of HCl/HF. The dipole inducing layer 19 may be positioned at the same as the dipole inducing layer 19 of FIG. 4F. For example, referring back to FIG. 4F, the dipole inducing layer 19 may include an interface portion 19I, a first side portion 19S1, and a second side portion 19S2. The first and second side portions 19S1 and 19S2 may extend vertically from the ends of the horizontal interface portion 19I. The interface portion 19I may be positioned between and be in direct contact with the first gate electrode 18 and the second gate electrode 20.

Figure 7E:
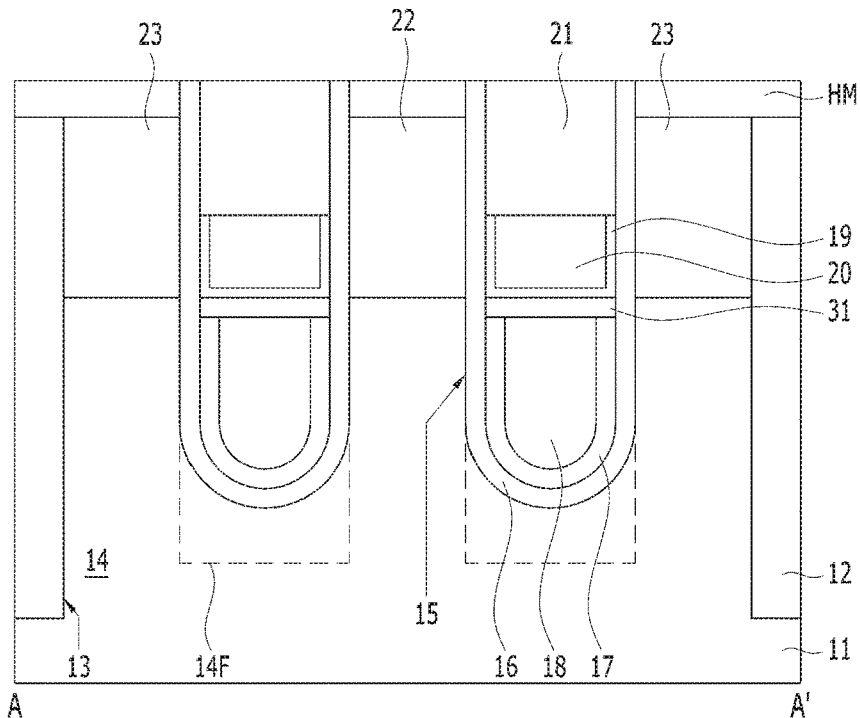

Referring to FIG. 7E, the capping layer 21 may be formed over the dipole inducing layer 19 and the second gate electrode 20. Subsequently, the capping layer 21 may be planarized so as for exposing the top surface of the hard mask HM. During the planarization process of the capping layer 21 or after the planarization process of the capping layer 21, the gate dielectric layer 16 on the top surface of the hard mask HM may be removed. The capping layer 21 may include any suitable dielectric material. For example, the capping layer 21 may include a silicon nitride. In an embodiment, the capping layer 21 may have a structure of ONO (Oxide-Nitride-Oxide).

Through the processes described above, a buried gate structure may be formed. The buried gate structure may include the gate dielectric layer 16, the barrier 17, the first gate electrode 18, the anti-oxidation barrier 31, the dipole inducing layer 19, the second gate electrode 20, and a capping layer 21. The top surface of the second gate electrode 20 may be positioned lower than the top surface of the substrate 11.

After the capping layer 21 is formed, a first source/drain region 22 and a second source/drain region 23 may be formed in the active region 14. The anti-oxidation barrier 31 may not horizontally overlap with the first and second source/drain regions 22 and 23. The dipole inducing layer 19 may be positioned between the anti-oxidation barrier 31 and the second gate electrode 20. The dipole inducing layer 19 may be positioned between the second gate electrode 20 and the gate dielectric layer 16.

Figure 8A:
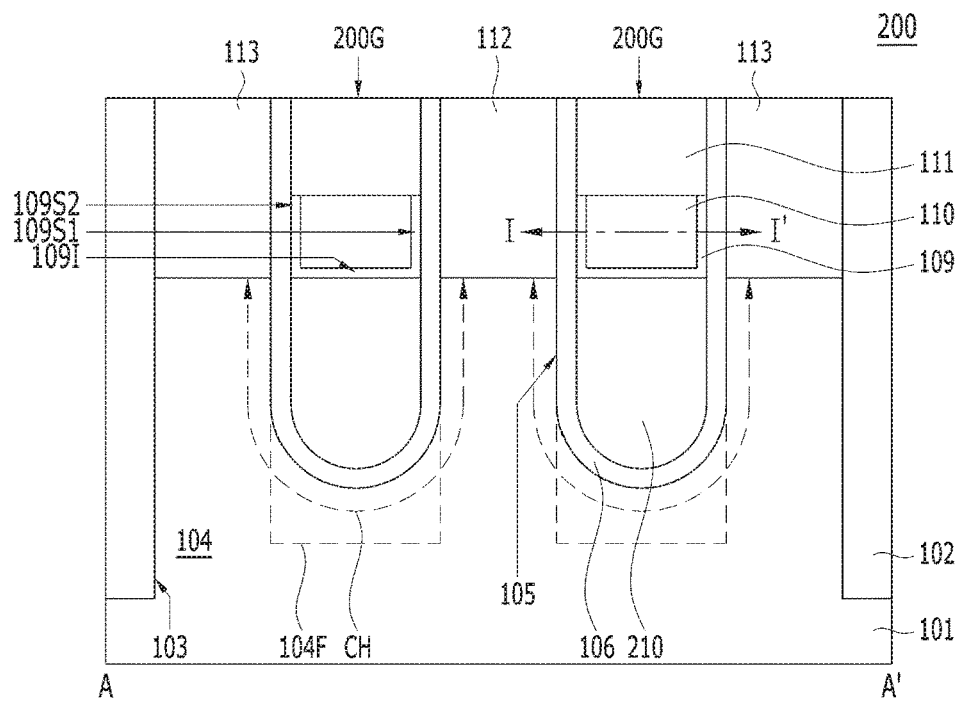
FIG. 8A is a cross-sectional view illustrating a semiconductor device 200 in accordance with a third embodiment of the present invention.

FIG. 8A is a cross-sectional view illustrating a semiconductor device 200 in accordance with a third embodiment of the present invention. Some constituent elements of the semiconductor device 200 may be the same as those of the semiconductor device 100 of FIG. 2A. More specifically, the other constituent elements except for a first gate electrode 210 may be the same as those of the semiconductor device 100 of FIG. 2A.

Referring to FIG. 8A, the semiconductor device 200 may include a buried gate structure 200G. The buried gate structure 200G may include a gate dielectric layer 106, a first gate electrode 210, a dipole inducing layer 109, a second gate electrode 110, and a capping layer 111. The first gate electrode 210 may be formed of a material that does not attack the gate dielectric layer 106. For example, the first gate electrode 210 may be formed of a material that does not contain any impurity, e.g., fluorine, i.e., a fluorine-free material. Thus, the barrier between the first gate electrode 210 and the gate dielectric layer 106 may be omitted. The first gate electrode 210 may include a titanium nitride. Since the first gate electrode 210 includes a fluorine-free material, the first gate electrode 210 may be referred to also herein as 'a barrier-less gate electrode'. The first gate electrode 108 of FIG. 2A may be referred to also herein as 'a barrier-included gate electrode' which requires a barrier 107. The first gate electrode 108 of FIG. 2A may include tungsten, and the first gate electrode 210 of FIG. 8A may include a titanium nitride. The titanium nitride may not attack the gate dielectric layer 106. Since the barrier is omitted, the filling characteristics of the first gate electrode 210 may be improved, and the gate sheet resistance may be further reduced.

The first gate electrode 210 and the second gate electrode 110 may be made of the same material. For example, the first gate electrode 210 and the second gate electrode 110 may each be formed of a titanium nitride. Accordingly, the first gate electrode 210 and the second gate electrode 110 may become a 'TiN-Only' gate electrode. The dipole inducing layer 109 may be positioned between and be in direct contact with the first gate electrode 210 and the second gate electrode 110. In an example the structure of the first gate electrode 210/the dipole inducing layer 109/the second gate electrode 110 may be formed of TiN/La$_2$O$_3$/TiN.

The top surface of the dipole inducing layer 109 may be positioned at a lower level than the top surface of the substrate 101. In accordance with an embodiment, the top surface of the dipole inducing layer 109 may be positioned at the same level as the top surface of the substrate 101, as shown in FIG. 3.

Figure 8B:
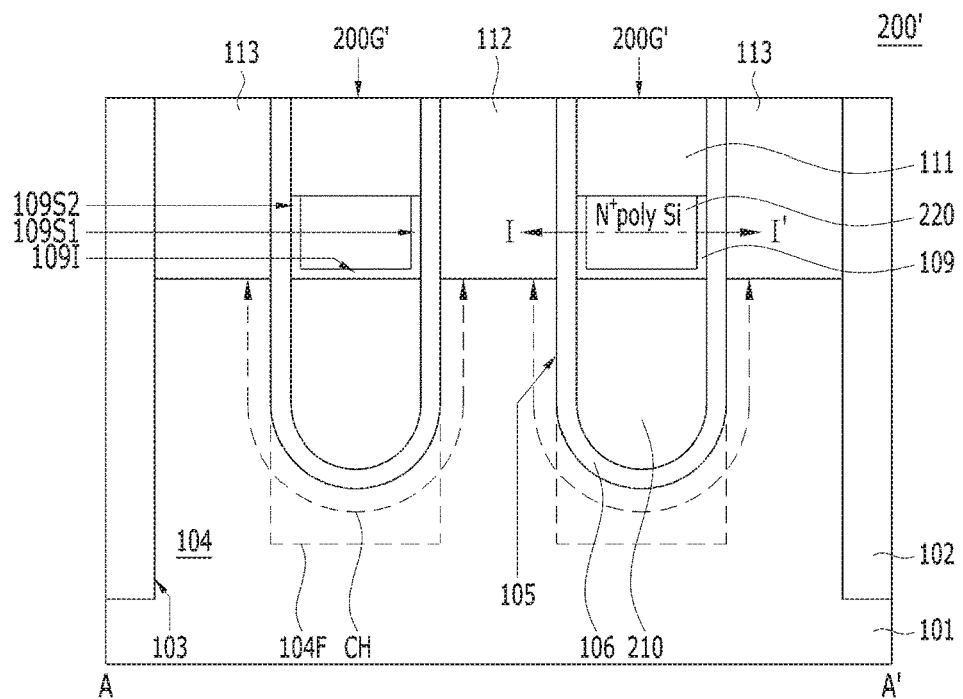
FIG. 8B is a cross-sectional view illustrating a semiconductor device in accordance with a fourth embodiment of the present invention.

FIG. 8B is a cross-sectional view illustrating a semiconductor device 200' in accordance with a fourth embodiment of the present invention. Some constituent elements of the semiconductor device 200' may be the same as those of the semiconductor device 200 of FIG. 8A. More specifically, the other constituent elements except for a second gate electrode 220 may be the same as those of the semiconductor device 200 of FIG. 8A.

Referring to FIG. 8B, the semiconductor device 200' may include a buried gate structure 200G'. The buried gate structure 200G' may include a gate dielectric layer 106, a first gate electrode 210, a dipole inducing layer 109, a second gate electrode 220, and a capping layer 111.

The first gate electrode 210 may be formed of a material that does not attack the gate dielectric layer 106. For example, the first gate electrode 210 may be formed of a material that does not contain any impurity, e.g., fluorine, i.e., a fluorine-free material. The first gate electrode 210 may comprise a titanium nitride.

The first gate electrode 210 and the second gate electrode 220 may be formed of different materials. For example, the second gate electrode 220 may be formed of polysilicon. The second gate electrode 220 may be formed of polysilicon having a low work function. The second gate electrode 220 may be formed of polysilicon doped with an N-type impurity (hereinafter, which will be referred to as an N-type polysilicon). When the N-type polysilicon is applied as the second gate electrode 220, the agglomeration issues may be improved. The second gate electrode 220 may include N$^+$ polysilicon (N$^+$ poly Si) doped with a high-concentration N-type impurity. The N-type impurity may include, for example, phosphorus (P) or arsenic (As).

In an embodiment, the first gate electrode 210 may be formed of a titanium nitride and the second gate electrode may be formed of an N-type polysilicon. The dipole inducing layer 109 may be positioned between and be in direct contact with both the first gate electrode 210 and the second gate electrode 220.

The top surface of the dipole inducing layer 109 may be positioned at a lower level than the top surface of the substrate 101. In accordance with an embodiment, the top surface of the dipole inducing layer 109 may be positioned at the same level as the top surface of the substrate 101, as shown in FIG. 3.

The gate-induced drain leakage may be further suppressed by the dipole inducing layer 109 and the second gate electrode 220. For example, since the second gate electrode 220 has a low work function and the work function of the second gate electrode 220 is lowered by the dipole inducing layer 109 and the gate dielectric layer 106, the gate-induced drain leakage may be further suppressed.

FIGS. 9A to 9E illustrate an example of a method for fabricating the semiconductor device 200 shown in FIG. 8A.

Figure 9A:
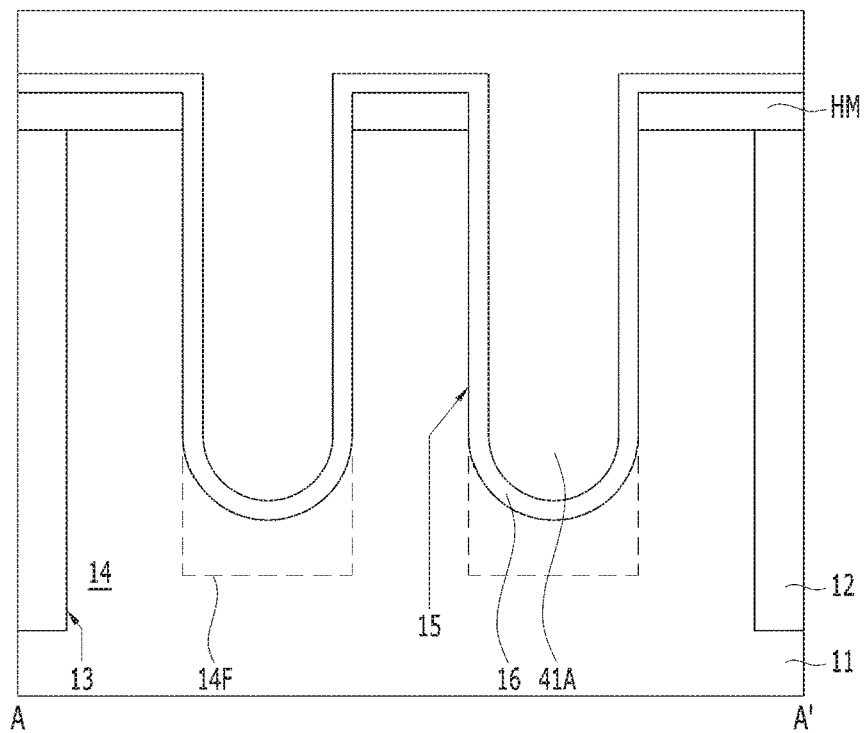
FIGS. 9A to 9E illustrate an example of a method for fabricating the semiconductor device 200 shown in FIG. 8A.

Referring to FIG. 9A, an isolation layer 12 may be formed over a substrate 11 to define an active region 14. The isolation layer 12 may be formed inside an isolation trench 13.

A gate trench 15 may be formed in the substrate 11. The gate trench 15 may be formed in the shape of a line traversing the active region 14 and the isolation layer 12. In an embodiment, the gate trench 15 may be formed by using a hard mask HM as an etch mask and performing an etch process.

Subsequently, a fin region 14F may be formed. For forming the fin region 14F, the isolation layer 12 below the gate trench 15 may be recessed.

Subsequently, a gate dielectric layer 16 may be formed over the surfaces of the gate trench 15 and the hard mask HM. The gate dielectric layer 16 may be made of any suitable high-k material, an oxide, a nitride, an oxynitride, or a combination thereof.

A first conductive layer 41A may be formed over the gate dielectric layer 16 to fill the remainder of the gate trench 15. The first conductive layer 41A may be made of any suitable low-resistance metal material. The first conductive layer 41A may include a metal material that does not contain any impurities such as fluorine. In an embodiment, the first conductive layer 41A may include a titanium nitride. The first conductive layer 41A may be formed by a Chemical Vapor Deposition (CVD) process or an Atomic Layer Deposition (ALD) process. In accordance with an embodiment, the first conductive layer 41A may be a fluorine-free tungsten layer (fluorine-free W).

Figure 9B:
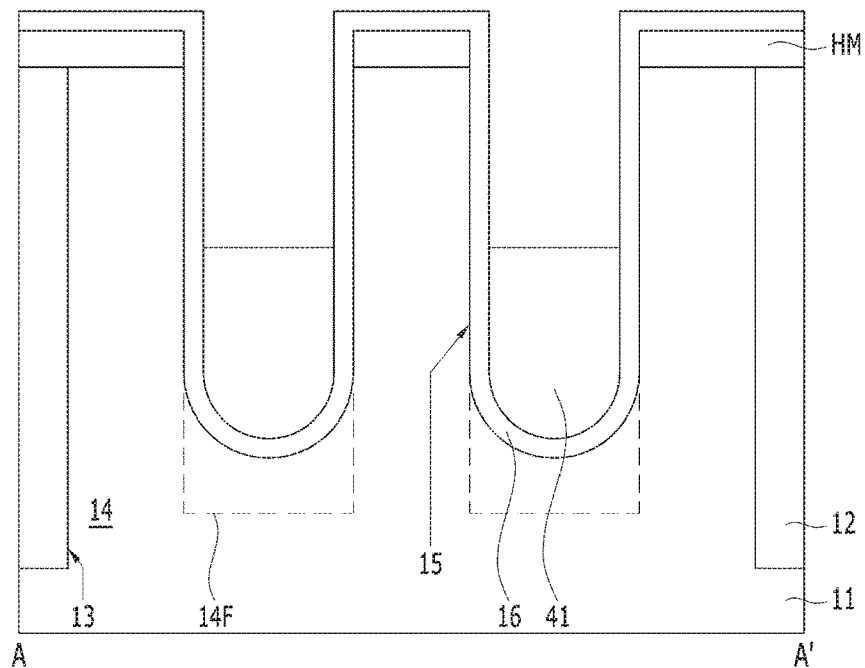

Referring to FIG. 9B, a first gate electrode 41 may be formed in the gate trench 15. For forming the first gate electrode 41, a recessing process may be performed. The recessing process may include performing dry etching, for example, an etch-back process. The first gate electrode 41 may be formed by an etch-back process of the first conductive layer 41A. In accordance with an embodiment, the recessing process may include first performing a planarization process for exposing the top surface of the hard mask HM, and then performing an etch-back process following the planarization process. The planarization process may be any suitable planarization process including but not limited to a chemical mechanical polishing. The top surface of the first gate electrode 41 may be recessed lower than the top surface of the active region 14.

Figure 9C:
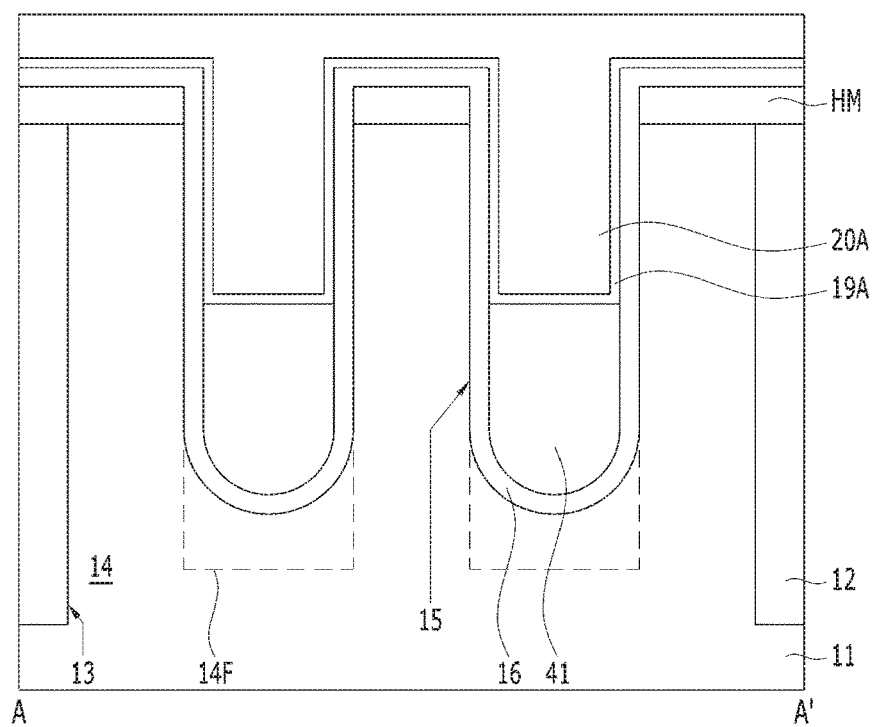

Referring to FIG. 9C, a dipole inducing material 19A may be formed over the first gate electrode 41 and the gate dielectric layer 16. The dipole inducing material may be formed conformally with the internal walls of the gate trench 15.

A second conductive layer 20A may be formed over the dipole inducing material 19A. The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

The dipole inducing material 19A and the second conductive layer 20A may be formed of the same material as the dipole inducing material 19A and the second conductive layer 20A of FIG. 4D.

In accordance with an embodiment, a suitable material for the second conductive layer 20A may include an N-type polysilicon. Thus, following the aforementioned steps the second gate electrode 220 of the semiconductor device 200' shown in FIG. 8B may be formed.

Figure 9D:
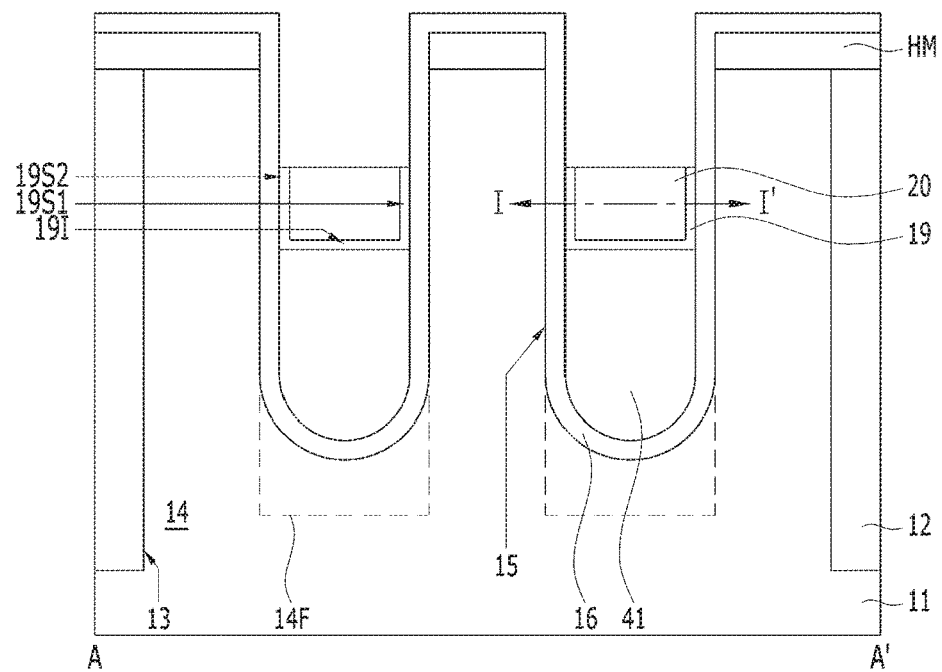

Referring to FIG. 9D, a second gate electrode 20 may be formed in the gate trench 15. For forming the second gate electrode 20, a recessing process may be performed. The recessing process may include performing dry etching, for example, an etch-back process. The second gate electrode 20 may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14.

Subsequently, a dipole inducing layer 19 may be formed in the gate trench 15. For forming the dipole inducing layer 19, a recessing process may be performed. The recessing process may include performing dry etching, for example, an etch-back process. The dipole inducing layer 19 may be formed by an etch-back process of the dipole inducing material 19A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. In accordance with an embodiment, the recessing process of the dipole inducing material 19A may include performing wet etching. For example, the wet etching may be performed by a mixture of HCl/HF. The top surfaces of the dipole inducing layer 19 and the second gate electrode 20 may be positioned at the same level. The top surface of the dipole inducing layer 19 may be recessed lower than the top surface of the active region 14. The dipole inducing layer 19 may be the same as the dipole inducing layer 19 of FIG. 4F. For example, the dipole inducing layer 19 may include an interface portion 19I, a first side portion 19S1, and a second side portion 19S2. The first and second side portions 19S1 and 19S2 may extend vertically from the ends of the horizontal interface portion 19I. The interface portion 19I may be positioned between and be in direct contact with the first gate electrode 18 and the second gate electrode 20.

Figure 9E:
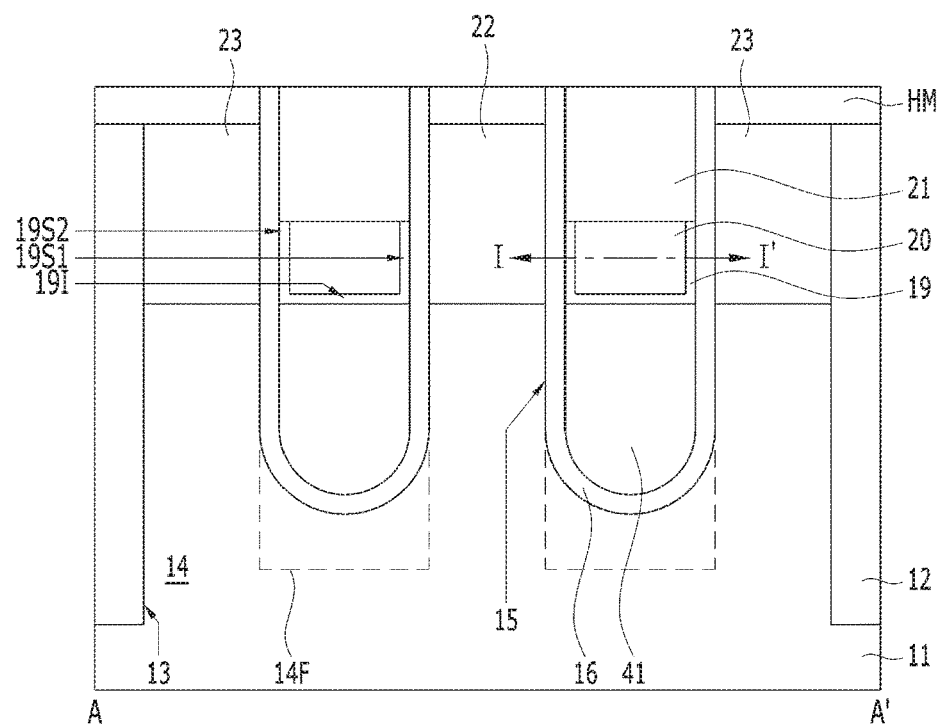

Referring to FIG. 9E, a capping layer 21 may be formed over the dipole inducing layer 19 and the second gate electrode 20 and may fill the remainder of the gate trench 15.

After the capping layer 21 is formed, a first source/drain region 22 and a second source/drain region 23 may be formed in the active region 14. The dipole inducing layer 19 may horizontally overlap with the first and second source/drain regions 22 and 23 (see I-I').

In the above-described embodiments of the present invention, the dipole inducing layer 109, 109', 19 and 19' may be formed to have a predetermined thickness. In the following embodiments of the present invention, the buried gate structure may include a dipole inducing portion that is locally positioned in the gate dielectric layer. The dipole inducing portion may include diffused dipole chemical species.

Figure 10A:
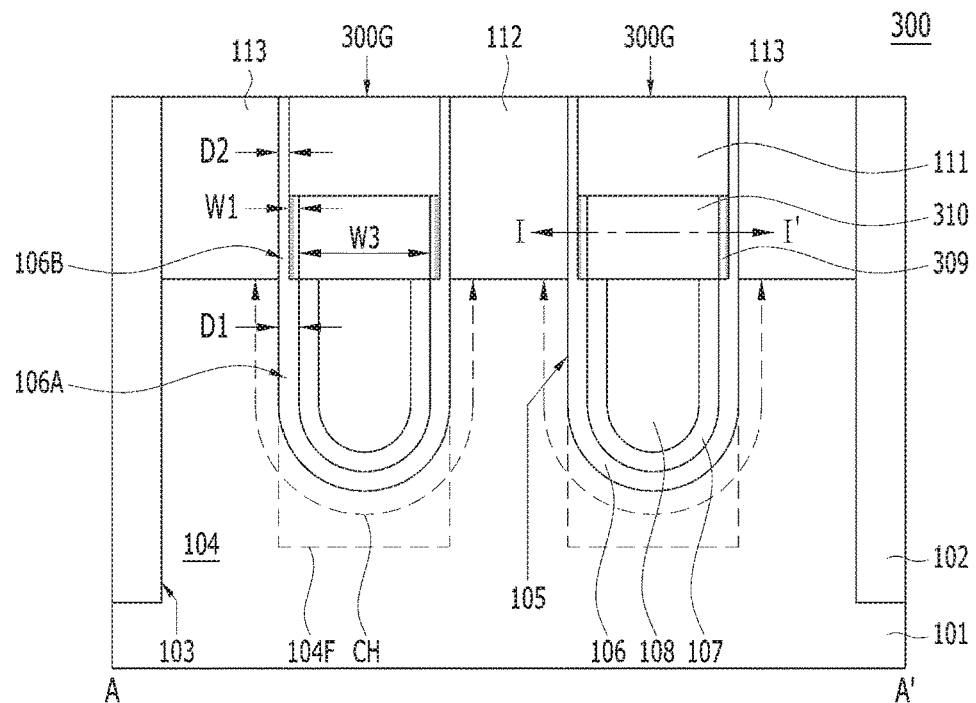
FIG. 10A is a cross-sectional view illustrating a semiconductor device in accordance with a fifth embodiment of the present invention.
Figure 10B:
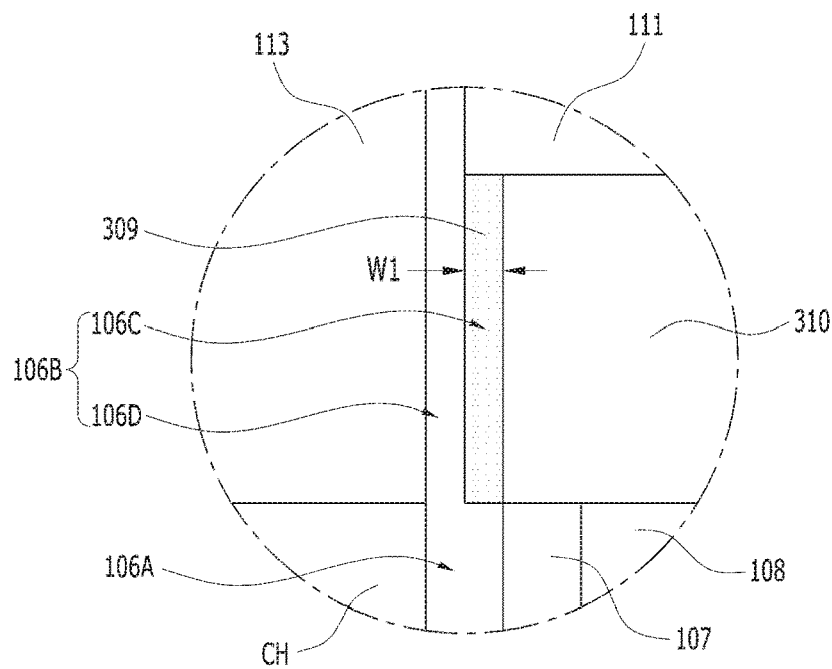
FIG. 10B is a magnified view of a dipole inducing portion shown in FIG. 10A.

FIG. 10A is a cross-sectional view illustrating a semiconductor device 300 in accordance with a fifth embodiment of the present invention. FIG. 10B is a magnified view of a dipole inducing portion shown in FIG. 10A. Some constituent elements of the semiconductor device 300 may be the same as those of the semiconductor device 100 of FIG. 2A. More specifically, the constituent elements other than the dipole inducing portion 309 and the second gate electrode 310 may be similar to the semiconductor device 100 of FIG. 2A.

Referring to FIGS. 10A and 10B, the semiconductor device 300 may include a buried gate structure 300G. The buried gate structure 300G may include a gate dielectric layer 106, a barrier 107, a first gate electrode 108, a dipole inducing portion 309, a second gate electrode 310, and a capping layer 111. The semiconductor device 300 may further include first and second source/drain regions 112 and 113.

The dipole inducing portion 309 may be positioned between the second gate electrode 310 and the gate dielectric layer 106. Unlike, the aforementioned embodiments of the invention, in the embodiment of FIG. 10A, the dipole inducing portion 309 may not be positioned between the first gate electrode 108 and the second gate electrode 110. Also, the dipole inducing portion 309 may not be positioned between the barrier 107 and the second gate electrode 310. The first gate electrode 108 and the barrier 107 may be in direct contact with the second gate electrode 310. The dipole inducing portion 309 may include a plurality of DICS.

The dipole inducing portion 309 may be locally positioned in the gate dielectric layer 106. In other words, the dipole inducing portion 309 may be positioned in the gate dielectric layer 106. The gate dielectric layer 106 may include a first portion 106A and a second portion 106B. The second portion 106B may include a dipole inducing portion 309, and the first portion 106A may not include the dipole inducing portion 309. The upper portion of the second portion 106B may be thinner than the first portion 106A (D1>D2). The first portion 106A and the second portion 106B may be one continuous layer. The first portion 106A and the second portion 106B may be made of the same material. The second gate electrode 310 may have a wider width than the first gate electrode 108.

The second portion 106B of the gate dielectric layer 106 may include a third portion 106C and a fourth portion 106D. The dipole inducing portion 309 may be included in the third portion 106C, and the dipole inducing portion 309 may not be included in the fourth portion 106D. The third portion 106C may be in direct contact with the second gate electrode 310. The fourth portion 106D may be in direct contact with the first and second source/drain regions 112 and 113. The dipole inducing portion 309 may be diffused and positioned in the third portion 106C.

The first portion 106A and the fourth portion 106D of the gate dielectric layer 106 may be of a silicon oxide. The third portion 106C of the gate dielectric layer 106 may be of a silicon oxide containing the dipole inducing portion 309. The third portion 106C of the gate dielectric layer 106 may be of a lanthanum-diffused silicon oxide (La diffused $SiO_2$). The lanthanum-diffused silicon oxide (La diffused $SiO_2$) may be referred to also herein as 'a lanthanum silicate'.

The dipole inducing portion 309 may overlap with the first and second source/drain regions 112 and 113 in the horizontal direction (see I-I'). The lowest portion of the third portion 106C of the gate dielectric layer 106 may be positioned at the same level as the lowest portion of the first and second source/drain regions 112 and 113. The dipole inducing portion 309 may not be positioned between the first gate electrode 108 and a channel CH.

Since the dipole inducing portion 309 is positioned in the gate dielectric layer 106, the filling characteristics of the second gate electrode 310 may be improved. The dipole may be induced in the gate dielectric layer 106 by the dipole inducing portion 309. Therefore, the suppression of the gate-induced drain leakage (GIDL) may be improved.

Figure 11A:
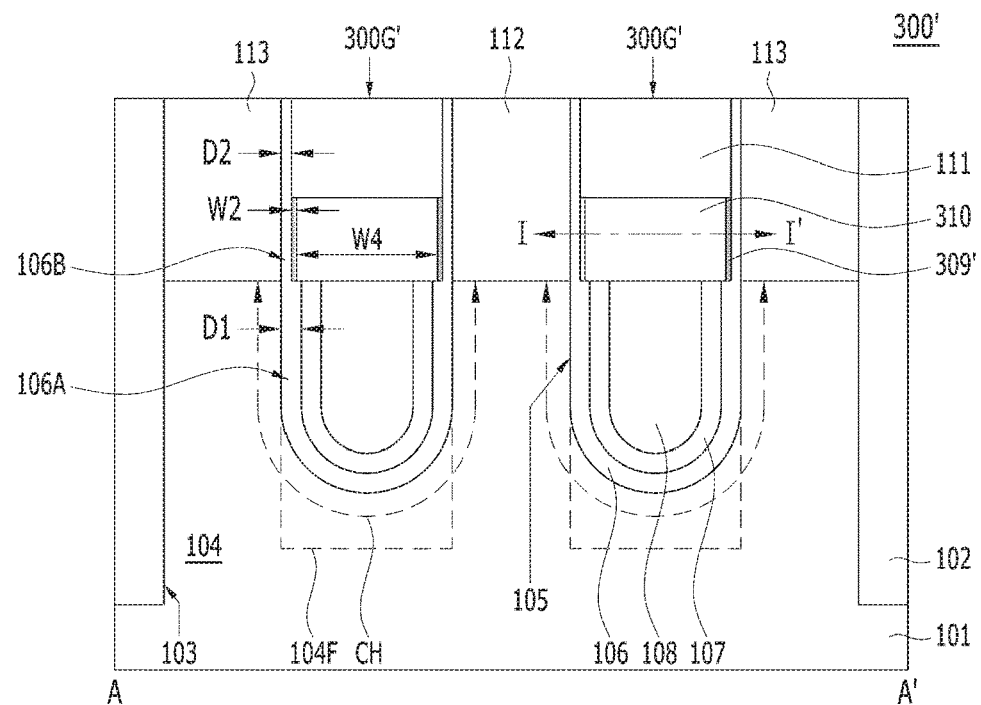
FIG. 11A is a cross-sectional view illustrating a semiconductor device in accordance with a sixth embodiment of the present invention.
Figure 11B:
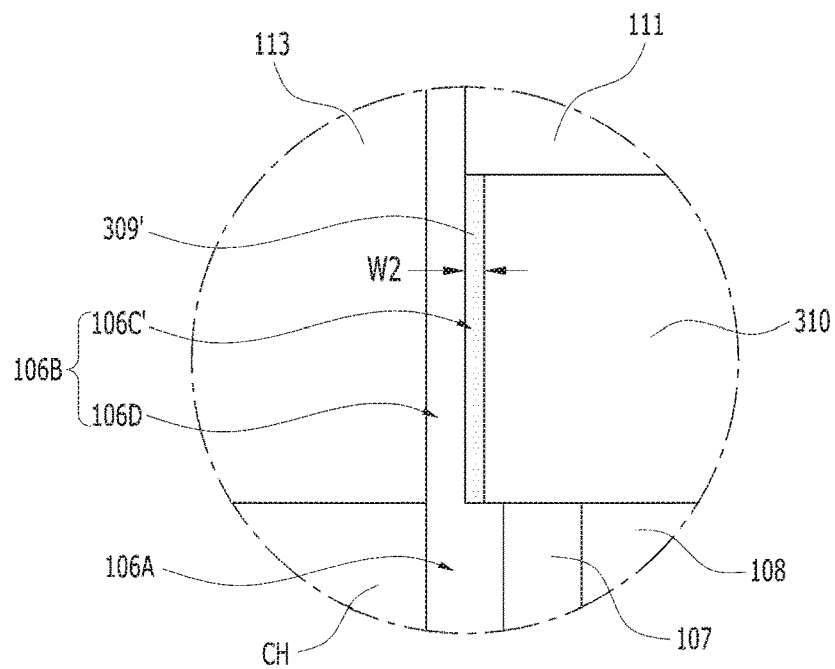
FIG. 11B is a magnified view of a dipole inducing portion.

FIG. 11A is a cross-sectional view illustrating a semiconductor device 300' in accordance with a sixth embodiment of the present invention. FIG. 11B is a magnified view of a dipole inducing portion. Some constituent elements of the semiconductor device 300' may be the same as those of the semiconductor device 300 of FIG. 10A. More specifically, the constituent elements other than the second gate electrode 310 and the dipole inducing portion 309' may be the same as those of the semiconductor device 300 of FIG. 10A.

Referring to FIGS. 11A and 11B, the semiconductor device 300' may include a buried gate structure 300G'. The buried gate structure 300G' may include a gate dielectric layer 106, a barrier 107, a first gate electrode 108, a dipole inducing portion 309', a second gate electrode 310, and a capping layer 111.

The dipole inducing portion 309' may be positioned between the second gate electrode 310 and the gate dielectric layer 106. The dipole inducing portion 309' may not be positioned between the first gate electrode 108 and the second gate electrode 310. The dipole inducing portion 309' may not be positioned between the barrier 107 and the second gate electrode 310. The first gate electrode 108 and the barrier 107 may be in direct contact with the second gate electrode 310.

The dipole inducing portion 309' may be locally positioned in the gate dielectric layer 106. In other words, the dipole inducing portion 309' may be positioned in the gate dielectric layer 106.

The dipole inducing portion 309' may be contained in the third portion 106C' of the gate dielectric layer 106. The thickness of the third portion 106C' of the gate dielectric layer 106 may be thinner than the thickness of the third portion 106C of FIG. 10A (W2<W1). The width of the second gate electrode 310 may be wider than the width of the second gate electrode 310 of FIG. 10A (W4>W3). As a result, the volume of the second gate electrode 310, which is a low-resistance material, increases, and the gate sheet resistance may be further reduced. In addition, the filling characteristics of the second gate electrode 310 may be further improved.

The dipole inducing portion 309 and 309' of FIGS. 10A and 11A may be formed, as DICS diffuse from the dipole inducing source layer. This will be described later. The dipole inducing source layer may contain DICS. For example, a dipole inducing source layer deposition process, a heat treatment, and a dipole inducing source layer removing process may be performed for diffusing the DICS. As described above, the third portion 106C and 106C' of the gate dielectric layer 106 may be referred to also herein as 'DICS-doped layer' by the diffused DICS. The difference in thickness between the third portion 106C and the third portion 106C' of the gate dielectric layer 106 may be caused as a portion of the third portion 106C is removed upon removal of the dipole inducing source layer.

FIGS. 12A to 12G illustrate an example of a method for fabricating the semiconductor device 300.

First, a barrier 17 and a first gate electrode 18 may be formed in a gate trench 15 by the method described in FIGS. 4A to 4C.

Subsequently, referring to FIG. 12A, a dipole inducing source layer 51A may be formed. The dipole inducing source layer 51A may be formed over the gate dielectric layer 16 and conformally to the interior walls of the gate trench 15. The dipole inducing source layer 51A may be formed by using an Atomic Layer Deposition (ALD) process or a Chemical Vapor Deposition (CVD) process. The dipole inducing source layer 51A may include DICS. The DICS may include lanthanum atoms. The dipole inducing source layer 51A may include a lanthanum oxide ($La_2O_3$) or lanthanum oxide monolayer. In accordance with an embodiment, the dipole inducing source layer 51A may include an yttrium oxide ($Y_2O_3$), a germanium oxide ($GeO_2$), a lutetium oxide ($Lu_2O_3$), or a strontium oxide (SrO). The dipole inducing source layer 51A may have a thickness of approximately 20 Å or less. The dipole inducing source layer 51A may have a thickness of approximately 1 to 20 Å.

Figure 12A:
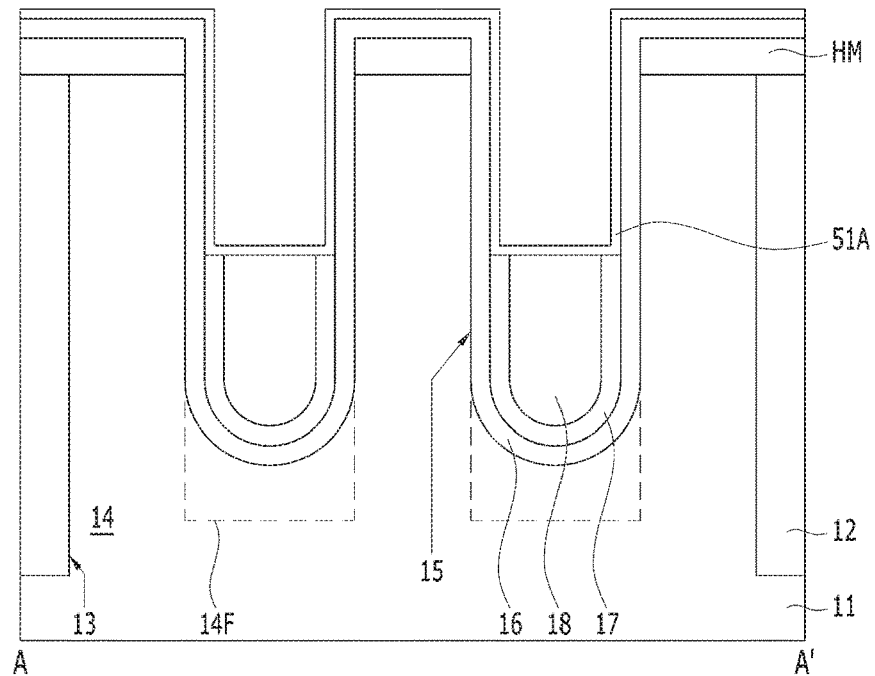
FIGS. 12A to 12G illustrate an example of a method for fabricating the semiconductor device 300.
Figure 12B:
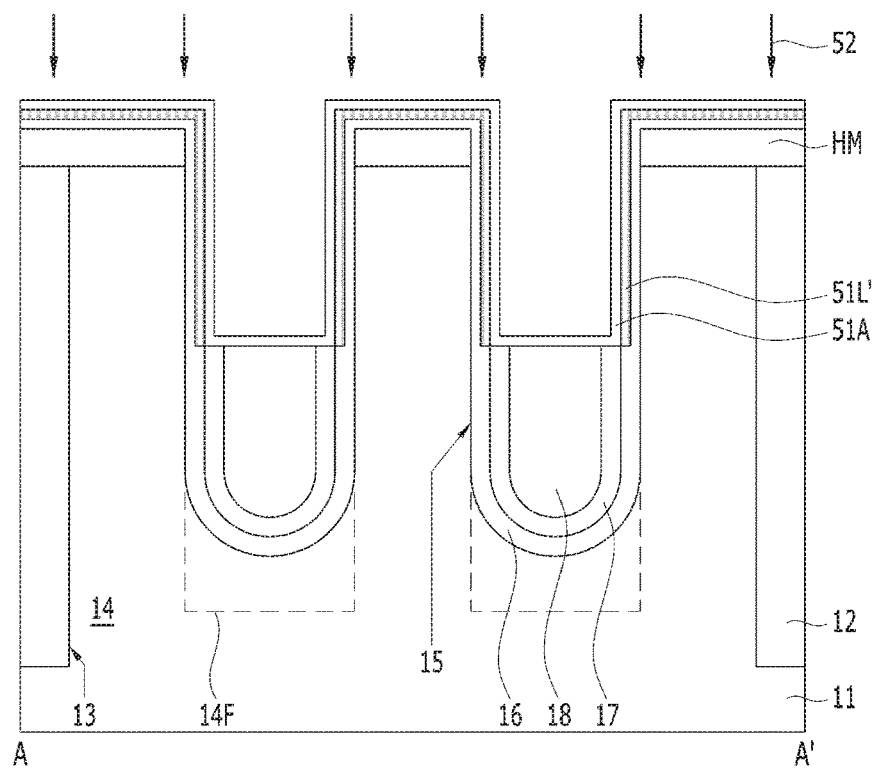

Referring to FIG. 12B, a heat treatment 52 may be performed. The heat treatment 52 may include a Rapid Thermal Annealing (RTA). The dipole inducing source layer 51A may be exposed to the heat treatment 52. When the heat treatment 52 is performed, DICS may be diffused from the dipole inducing source layer 51A. The diffused DICS may be locally positioned inside the gate dielectric layer 16. The DICS may be diffused into a portion where the gate dielectric layer 16 contacts with the dipole inducing source layer 51A. Thus, a DICS-diffused portion 51L' may be locally formed in the gate dielectric layer 16. The DICS diffusion 51L' may include the diffused DICS. The DICS diffused portion 51L' may include lanthanum atoms. The DICS diffusion portion 51L' may be of a lanthanum-diffused silicon oxide. The DICS diffused portion 51L' may be of a lanthanum silicate.

Figure 12C:
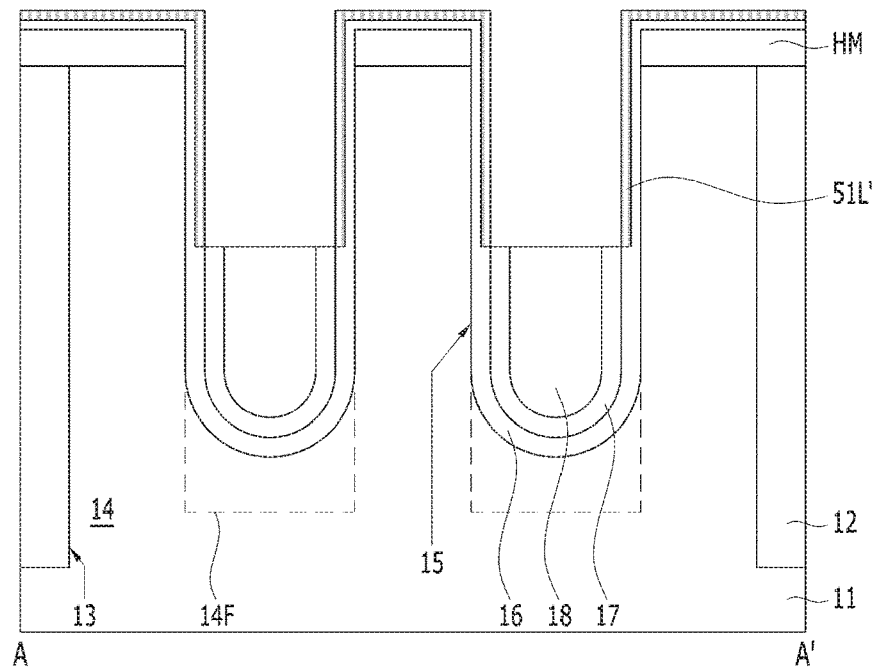

Referring to FIG. 12C, the dipole inducing source layer 51A may be removed. The dipole inducing source layer 51A may be removed by a wet etching process. By applying the wet etching process, the dipole inducing source layer 51A may be selectively removed without attacking the gate dielectric layer 16. Herein, the dipole inducing source layer 51A that is removed after the heat treatment 52 may be referred to also herein as 'a sacrificial layer including DICS'. In accordance with an embodiment, the wet etching process may be performed by a mixture of HCl/HF.

Figure 12D:
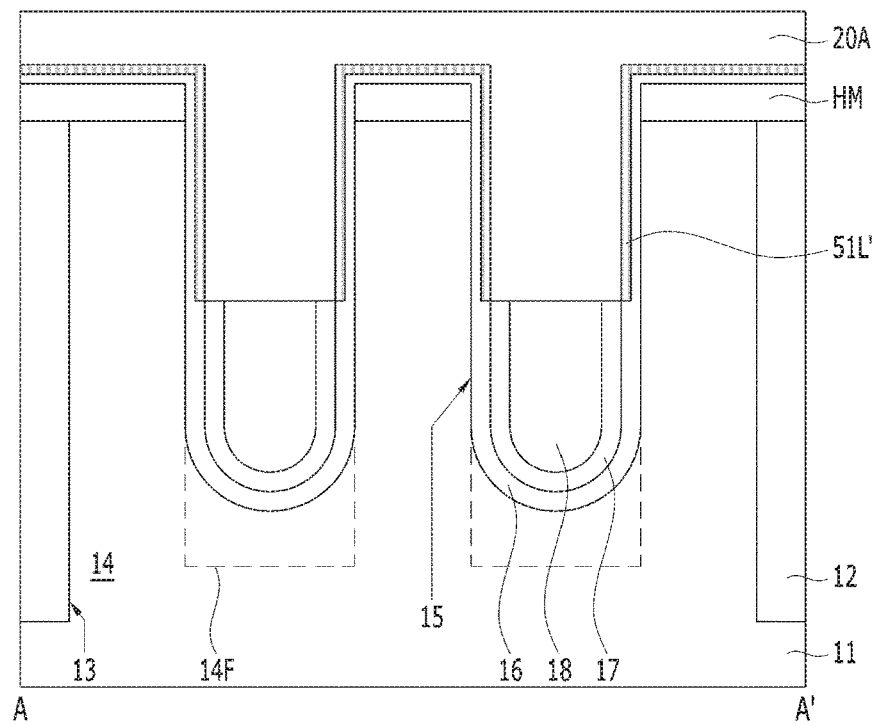

Referring to FIG. 12D, the second conductive layer 20A may be formed over the DICS diffused portion 51L'. The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

Figure 12E:
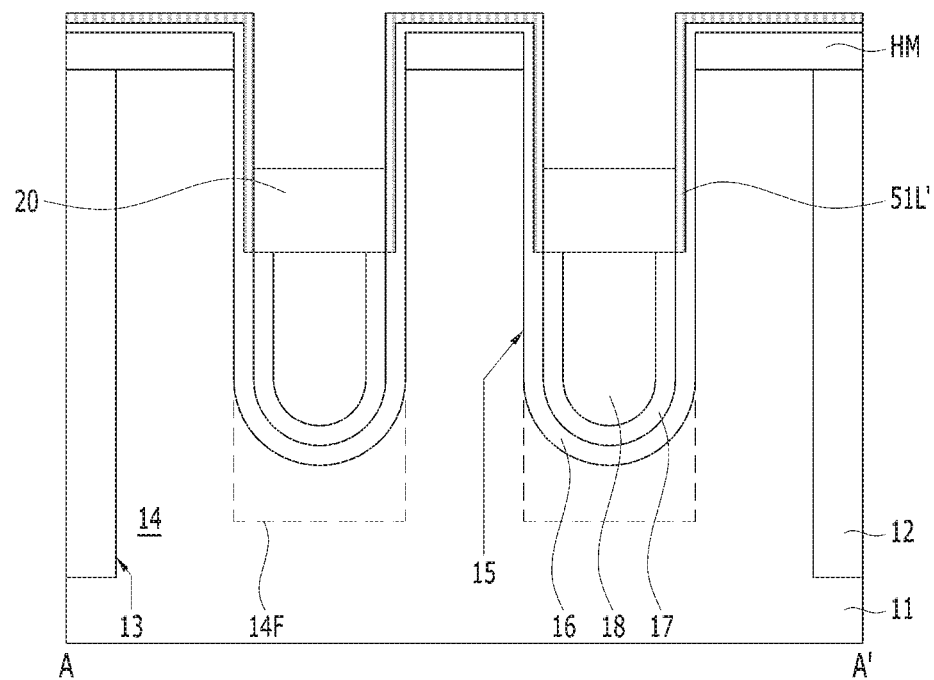

Referring to FIG. 12E, a second gate electrode 20 may be formed in the gate trench 15. For forming the second gate electrode 20, a recessing process may be performed. The recessing process may include performing dry etching, for example, an etch-back process. The second gate electrode 20 may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14. A portion of the DICS diffused portion 51L' may be exposed by the second gate electrode 20.

Figure 12F:
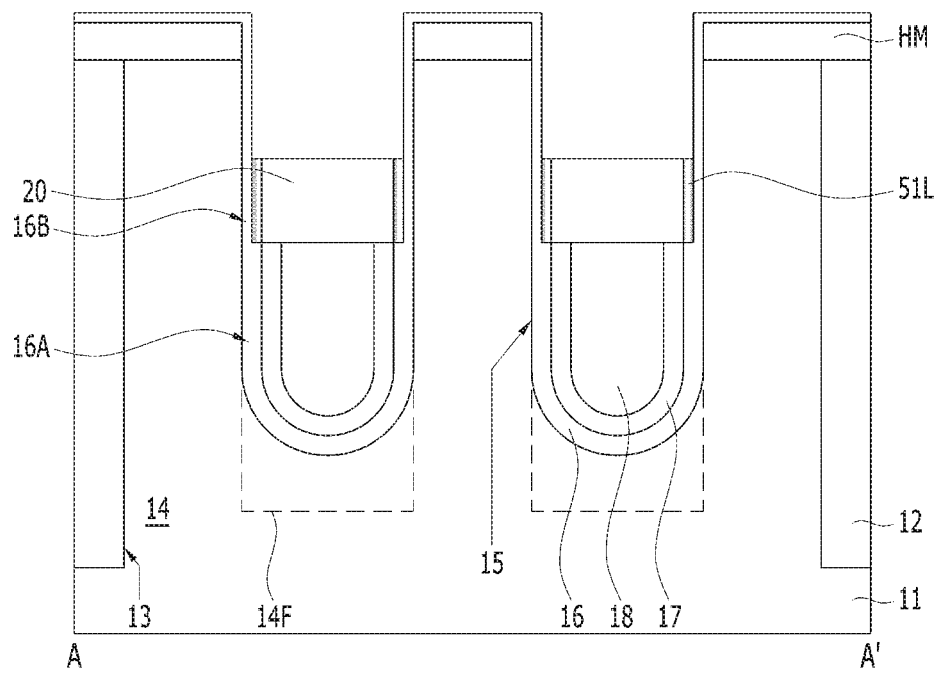

Referring to FIG. 12F, a dipole inducing portion 51L may be formed. The dipole inducing portion 51L may contact both sidewalls of the second gate electrode 20. For forming the dipole inducing portion 51L, the exposed portion of the DICS diffused portion 51L' may be selectively removed. For example, the DICS diffused portion 51L' that is not in contact with the second gate electrode 20 may be removed by a wet etching process. In accordance with an embodiment, the wet etching process may be performed by a mixture of HCl/HF. The top surfaces of the dipole inducing portion 51L and the second gate electrode 20 may be positioned at the same level. The top surface of the dipole inducing portion 51L may be recessed lower than the top surface of the active region 14.

The dipole inducing portion 51L may be in the form of a spacer contacting the sidewall of the second gate electrode 20. The dipole inducing portion 51L may not be positioned between the first gate electrode 18 and the second gate electrode 20.

After the dipole inducing portion 51L is formed, the gate dielectric layer 16 may remain as a first portion 16A and a second portion 16B. The second portion 16B may include the dipole inducing portion 51L, and the dipole inducing portion 51L may include DICS. The dipole inducing portion 51L may correspond to the third portion 106C of FIG. 10B.

As a result, the dipole inducing portion 51L may be formed in the gate dielectric layer 16. After the dipole inducing portion 51L is formed, a portion of the second portion 16B of the gate dielectric layer 16 where the dipole inducing portion 51L is not formed may be exposed.

Figure 12G:
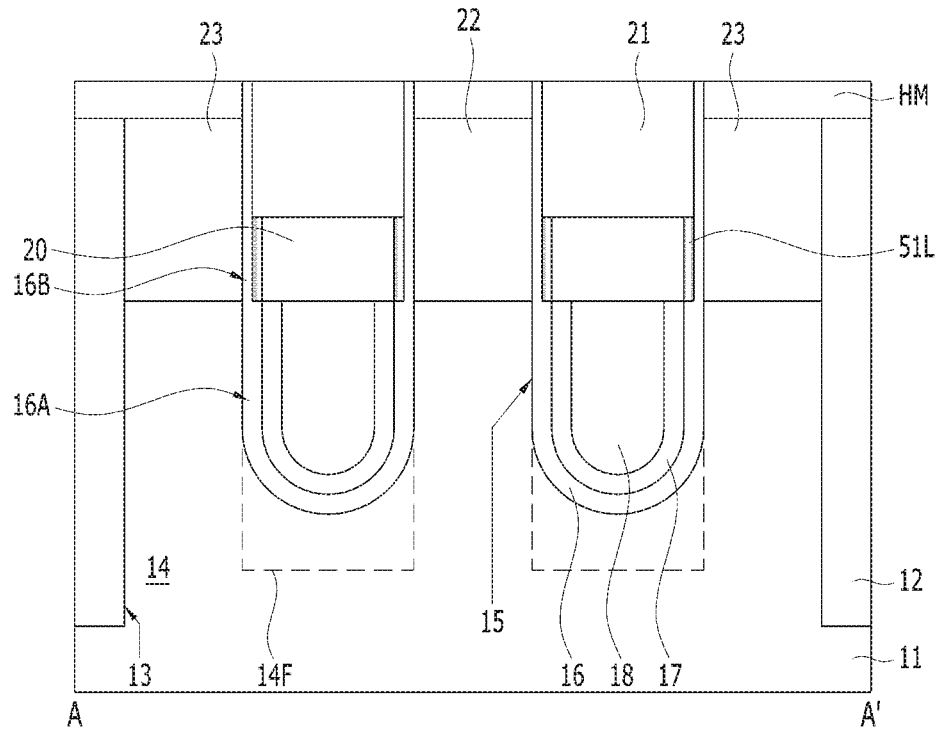

Referring to FIG. 12G, a capping layer 21 may be formed over the dipole inducing portion 51L and the second gate electrode 20.

After the capping layer 21 is formed, a first source/drain region 22 and a second source/drain region 23 may be formed in the active region 14.

FIGS. 13A to 13E illustrate an example of a method for fabricating the semiconductor device 300'.

Referring to FIGS. 12A and 12B, a process of forming the dipole inducing source layer 51A and a process of performing the heat treatment 52 may be sequentially performed. Accordingly, the DICS diffused portion 51L' may be locally formed in the gate dielectric layer 16.

Figure 13A:
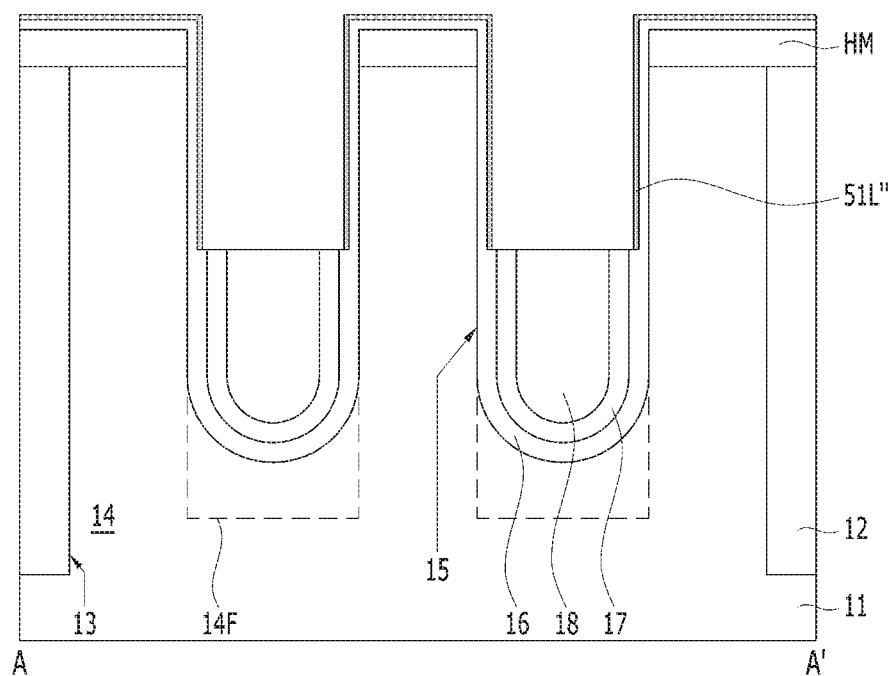
FIGS. 13A to 13E illustrate an example of a method for fabricating the semiconductor device 300'.

Subsequently, referring to FIG. 13A, the dipole inducing source layer 51A may be removed. When the dipole inducing source layer 51A is removed, the surface of the DICS diffused portion 51L' may be partially removed. As a result, a thin DICS diffused portion 51L" may be formed in the gate dielectric layer 16.

Figure 13B:
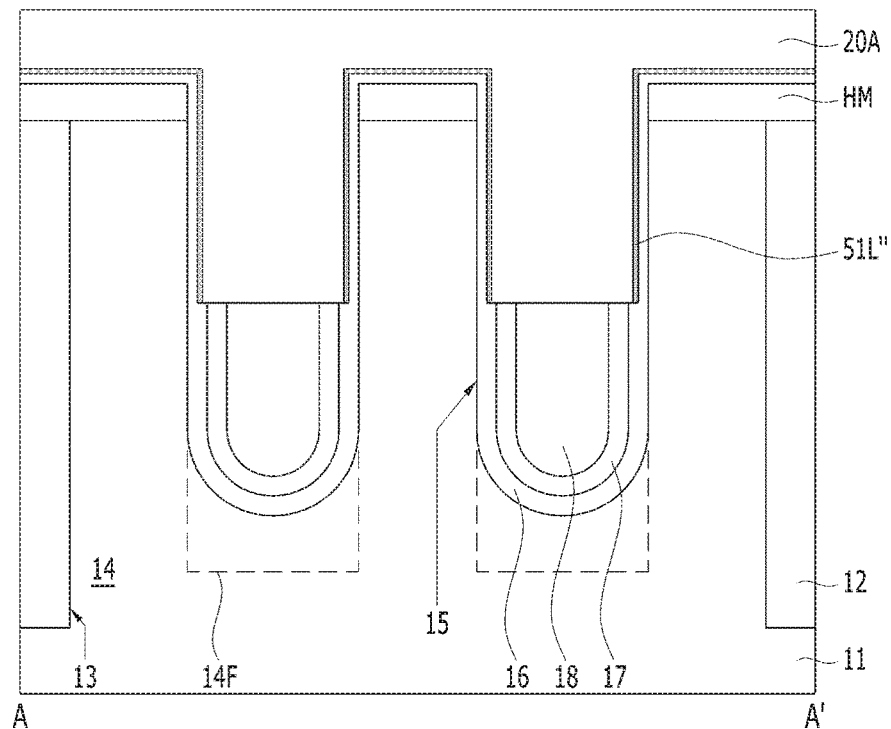

Referring to FIG. 13B, a second conductive layer 20A may be formed over the thin DICS diffused portion 51L". The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

Figure 13C:
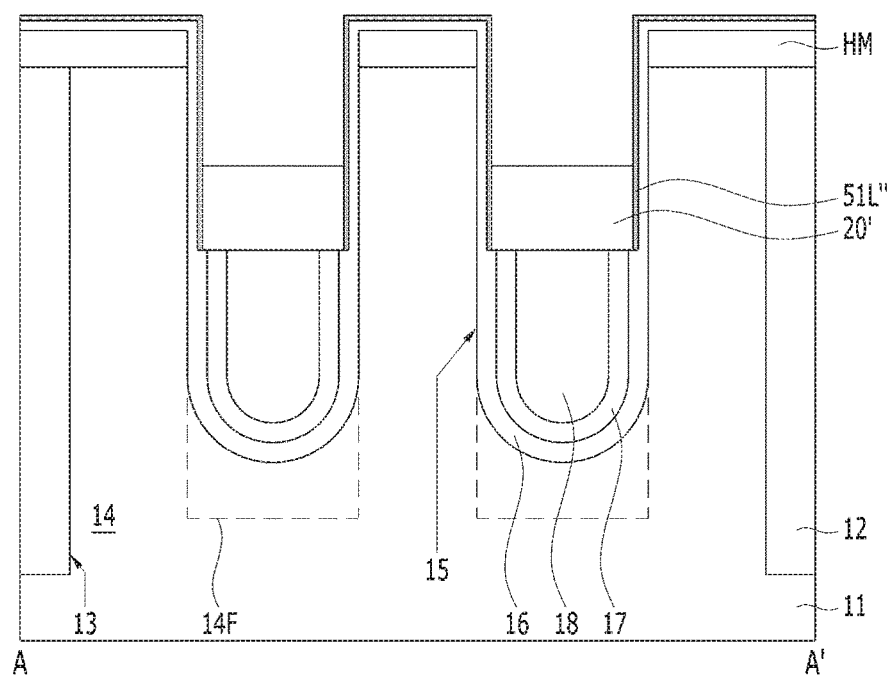

Referring to FIG. 13C, a second gate electrode 20' may be formed in the gate trench 15. For forming the second gate electrode 20', a recessing process may be performed. The recessing process may include performing dry etching, for example, an etch-back process. The second gate electrode 20' may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20' may be recessed lower than the top surface of the active region 14. The width of the second gate electrode 20' may be wider than the width of the second gay electrode 20 of FIG. 12E. A portion of the thin DICS diffused portion 51L" may be exposed by the second gate electrode 20'.

Figure 13D:
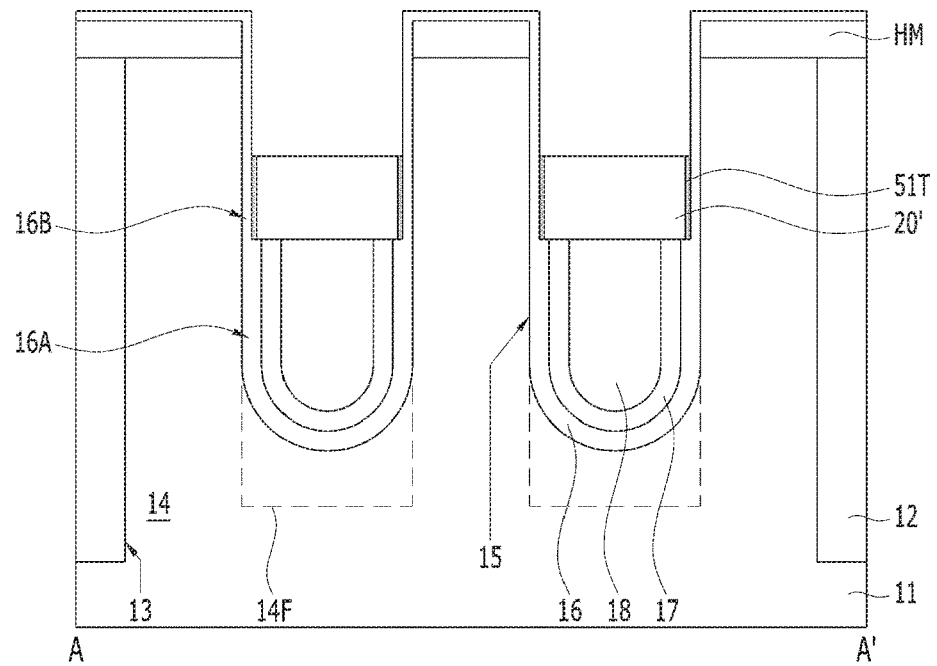

Referring to FIG. 13D, a dipole inducing portion 51T may be formed. The dipole inducing portion 51T may contact both sidewalls of the second gate electrode 20'. The thin DICS diffused portion 51L" may be selectively removed to form the dipole inducing portion 51T. For example, the thin DICS diffused portion 51L" that does not contact the second gate electrode 20' may be removed by a wet etching process.

The top surfaces of the dipole inducing portion 51T and the second gate electrode 20' may be positioned at the same level. The top surface of the dipole inducing portion 51T may be recessed lower than the top surface of the active region 14.

The dipole inducing portion 51T may have a form of a spacer. The dipole inducing portion 51T may not be positioned between and be in direct contact with the first gate electrode 18 and the second gate electrode 20'.

After the dipole inducing portion 51T is formed, the gate dielectric layer 16 may remain as a first portion 16A and a second portion 16B. The thickness of the second portion 16B may be thinner than the thickness of the first portion 16A. After the dipole inducing portion 51T is formed, a portion of the second portion 16B of the gate dielectric layer 16 where the dipole inducing portion 51T is not formed may be exposed.

Figure 13E:
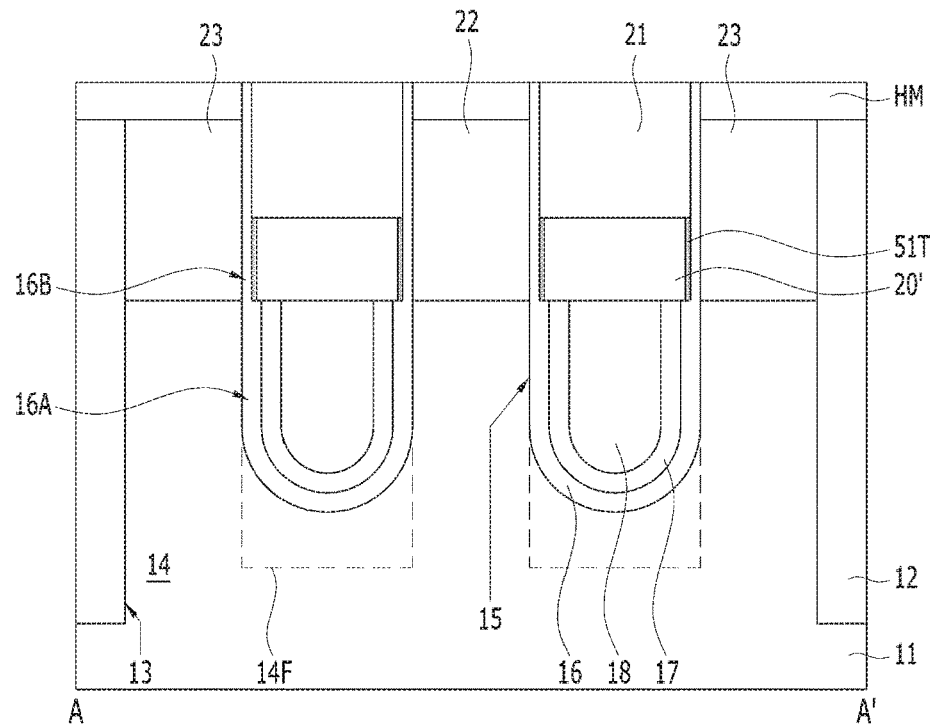

Referring to FIG. 13E, a capping layer 21 may be formed over the dipole inducing portion 51T and the second gate electrode 20'.

After the capping layer 21 is formed, a first source/drain region 22 and a second source/drain region 23 may be formed in the active region 14.

Figure 14:
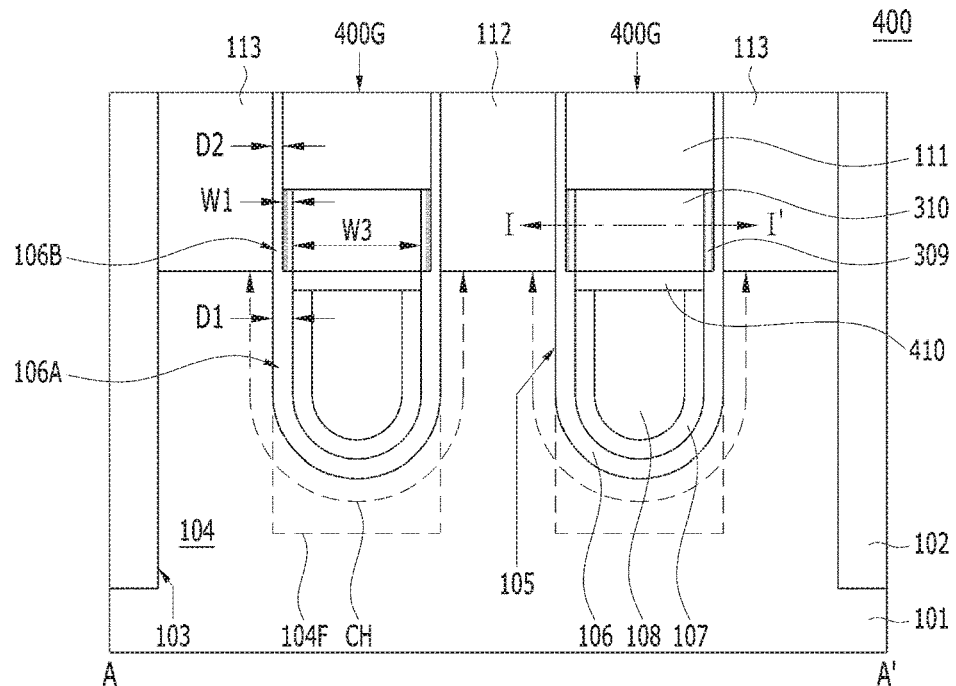
FIG. 14 is a cross-sectional view illustrating a semiconductor device in accordance with a seventh embodiment of the present invention.

FIG. 14 is a cross-sectional view illustrating a semiconductor device 400 in accordance with a seventh embodiment of the present invention. Some constituent elements of the semiconductor device 400 may be the same as those of the semiconductor device 300 of FIG. 10A. More specifically, the other constituent elements except for an anti-oxidation barrier 410 may be the same as those of the semiconductor device 300 of FIG. 10A.

Referring to FIG. 14, the semiconductor device 400 may include a buried gate structure 400G. The buried gate structure 400G may include a gate dielectric layer 106, a barrier 107, a first gate electrode 108, an anti-oxidation barrier 410, a dipole inducing portion 309, a second gate electrode 310, and a capping layer 111. The dipole inducing portion 309 may be positioned in the gate dielectric layer 106.

The anti-oxidation barrier 410 may be positioned between and be in direct contact with the first gate electrode 108 and the second gate electrode 310. The anti-oxidation barrier 410 may be extended to be positioned between the barrier 107 and the dipole inducing portion 309. The anti-oxidation barrier 410 may prevent the first gate electrode 108 from being oxidized. For example, it may be possible to prevent the top surface of the first gate electrode 108 from being oxidized during the formation of the dipole inducing portion 309.

The anti-oxidation barrier 410 may include a conductive material. The anti-oxidation barrier 410 may be a metal-based material for the buried gate structure 400G to have low resistance. The anti-oxidation barrier 410 may be of a metal nitride. For example, the anti-oxidation barrier 410 may be formed of a titanium nitride. The barrier 107 and the anti-oxidation barrier 410 may be made of the same material. The first gate electrode 108 and the anti-oxidation barrier 410 may be of different materials.

Figure 15:
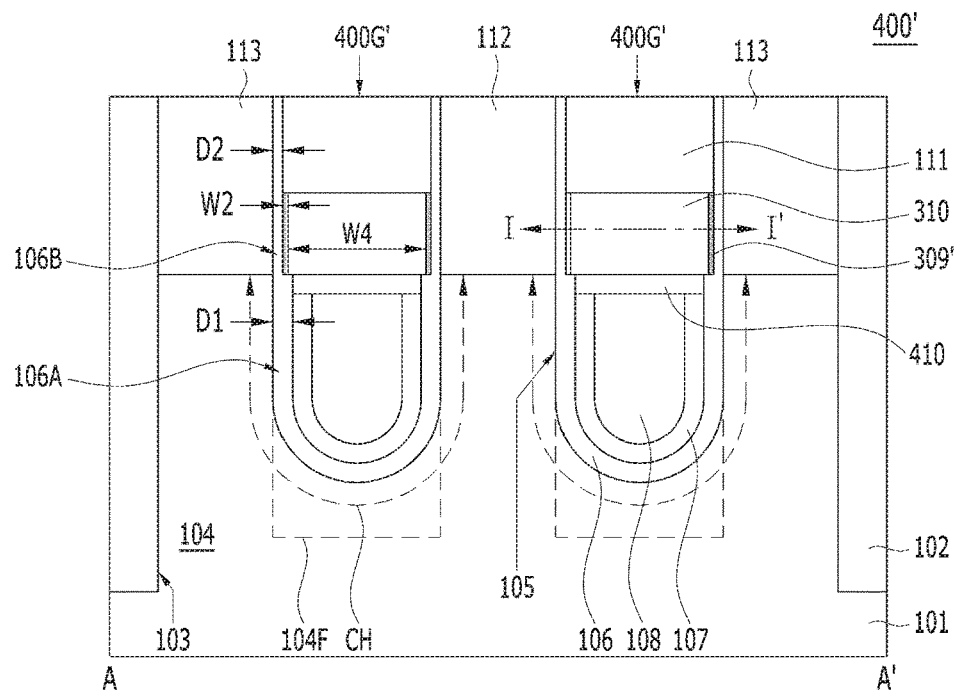
FIG. 15 is a cross-sectional view illustrating a semiconductor device in accordance with an eighth embodiment of the present invention.

FIG. 15 is a cross-sectional view illustrating a semiconductor device 400' in accordance with an eighth embodiment of the present invention. Some constituent elements of the semiconductor device 400' may be the same as those of the semiconductor device 400 of FIG. 14. More specifically, the other constituent elements except for a dipole inducing portion 309' may be the same as those of the semiconductor device 400 of FIG. 14.

Referring to FIG. 15, the semiconductor device 400' may include a buried gate structure 400G'. The buried gate structure 400G may include a gate dielectric layer 106, a barrier 107, a first gate electrode 108, an anti-oxidation barrier 410, a dipole inducing portion 309', a second gate electrode 310, and a capping layer 111.

The dipole inducing portion 309' may be positioned between the second gate electrode 310 and the gate dielectric layer 106. The dipole inducing portion 309' may not be positioned between and be in direct contact with the first gate electrode 108 and the second gate electrode 310. The dipole inducing portion 309' may be spaced from the barrier 107 and the second gate electrode 310 by the anti-oxidation barrier 410. The first gate electrode 108 and the barrier 107 may be electrically connected to the second gate electrode 310 through the anti-oxidation barrier 410. Both ends of the anti-oxidation barrier 410 may not contact the bottom portion of the dipole inducing portion 309'.

The dipole inducing portion 309' may be locally positioned in the gate dielectric layer 106. In other words, the dipole inducing portion 309' may be positioned in the gate dielectric layer 106.

The thickness of the dipole inducing portion 309' may be thinner than the thickness of the dipole inducing portion 309 of FIG. 14 (W2<W1). The width of the second gate electrode 310 may be wider than the width of the second gate electrode 310 of FIG. 14 (W4>W3). As a result, the volume of the second gate electrode 310, which is a low-resistance material, increases, and the gate sheet resistance may be further reduced. In addition, the filling characteristics of the second gate electrode 310 may be further improved.

FIGS. 16A to 16G illustrate an example of a method for fabricating the semiconductor device 400. More specifically, the other constituent elements except for an anti-oxidation barrier 31 may be similar to those of the method described in FIGS. 12A to 12G.

First, by the method described in FIGS. 7A and 7B, the anti-oxidation barrier 31 and the dummy anti-oxidation layer 31D may be formed.

Figure 16A:
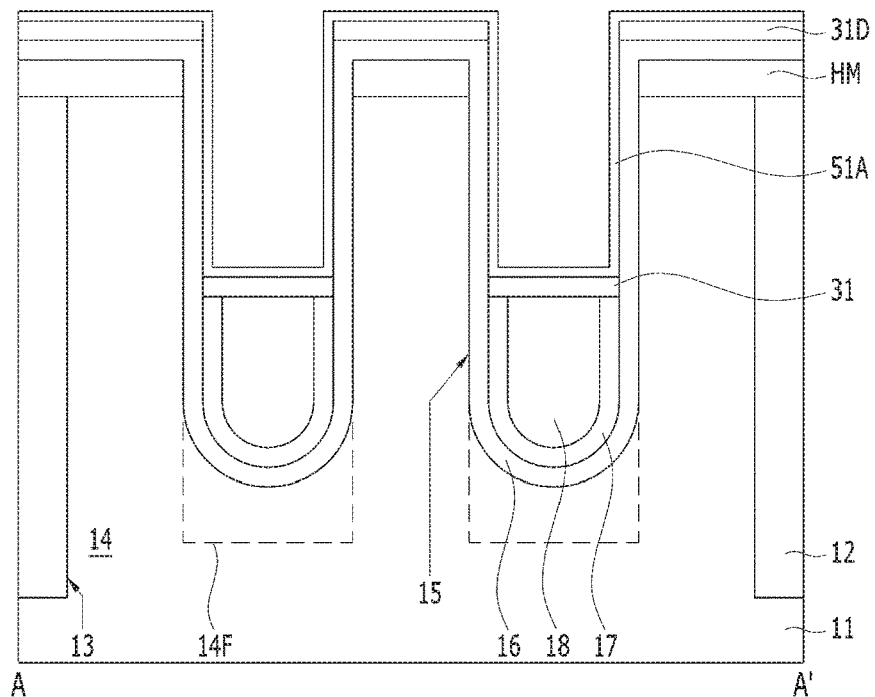
FIGS. 16A to 16G illustrate an example of a method for fabricating the semiconductor device 400.

Subsequently, referring to FIG. 16A, a dipole inducing source layer 51A may be formed. The dipole inducing source layer 51A may be conformally formed. The dipole inducing source layer 51A may be formed by using a Chemical Vapor Deposition (CVD) process or an Atomic Layer Deposition (ALD) process. The dipole inducing source layer 51A may include DICS. The DICS may include lanthanum atoms. The dipole inducing source layer 51A may include a lanthanum oxide ($La_2O_3$). In accordance with an embodiment, the dipole inducing source layer 51A may include an yttrium oxide ($Y_2O_3$), a germanium oxide ($GeO_2$), a lutetium oxide ($Lu_2O_3$), or a strontium oxide (SrO).

Figure 16B:
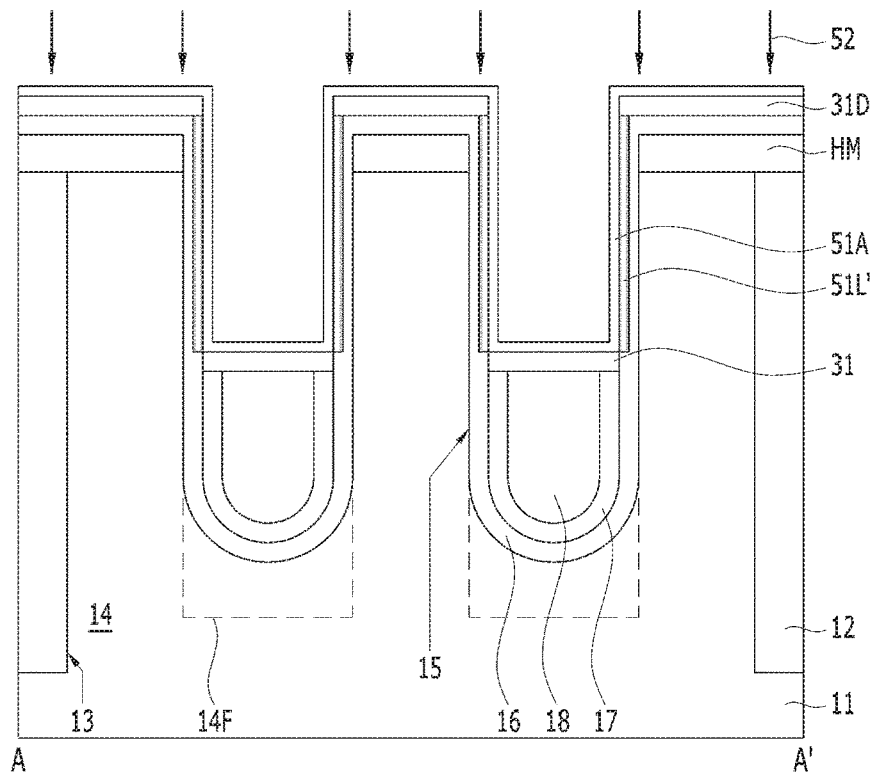

Referring to FIG. 16B, a heat treatment 52 may be performed. The heat treatment 52 may include a Rapid Thermal Annealing (RTA). The dipole inducing source layer 51A may be exposed to the heat treatment 52. When the heat treatment 52 is performed, DICS may be diffused from the dipole inducing source layer 51A. The diffused DICS may be locally positioned in the gate dielectric layer 16. The DICS may be diffused into a portion of the gate dielectric layer 16 contacting the dipole inducing source layer 51A. Thus, DICS diffused portion 51L' may be locally formed in the gate dielectric layer 16. The DICS diffused portion 51L' may include DICS. The DICS diffused portion may include lanthanum atoms. The DICS diffused portion 51L' may be of a lanthanum-diffused silicon oxide. The DICS diffused portion 51L' may be of a lanthanum silicate.

Meanwhile, the DICS may not be diffused into the gate dielectric layer 16 in contact with the dummy anti-oxidation layer 31D.

Figure 16C:
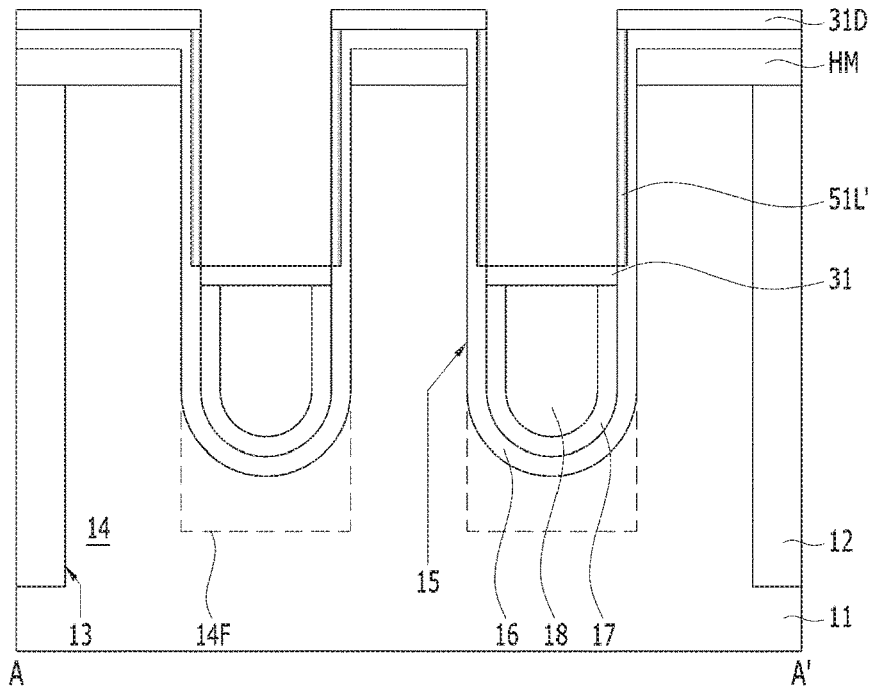

Referring to FIG. 16C, the dipole inducing source layer 51A may be removed. The dipole inducing source layer 51A may be removed by a wet etching process. By applying the wet etching process, the dipole inducing source layer 51A may be selectively removed without attacking the gate dielectric layer 16. In accordance with an embodiment, the wet etching process may be performed by a mixture of HCl/HF.

Figure 16D:
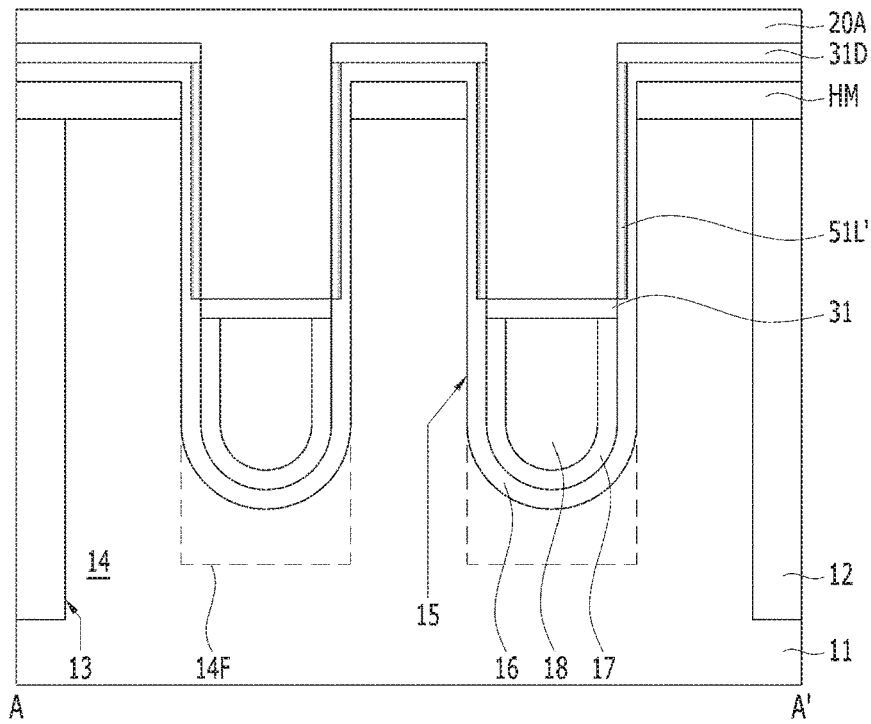

Referring to FIG. 16D, the second conductive layer 20A may be formed over the diffused inducing chemical species diffused portion 51L'. The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

Figure 16E:
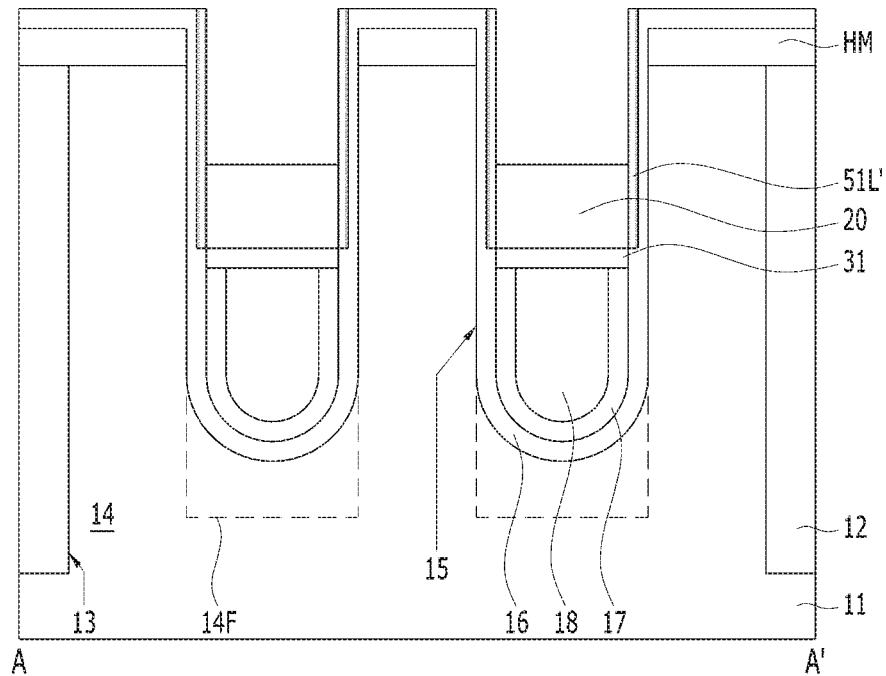

Referring to FIG. 16E, the second gate electrode 20 may be formed in the gate trench 15. For forming the second gate electrode 20, a recessing process may be performed. The recessing process may include performing dry etching, for example, an etch-back process. The second gate electrode 20 may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14.

Figure 16F:
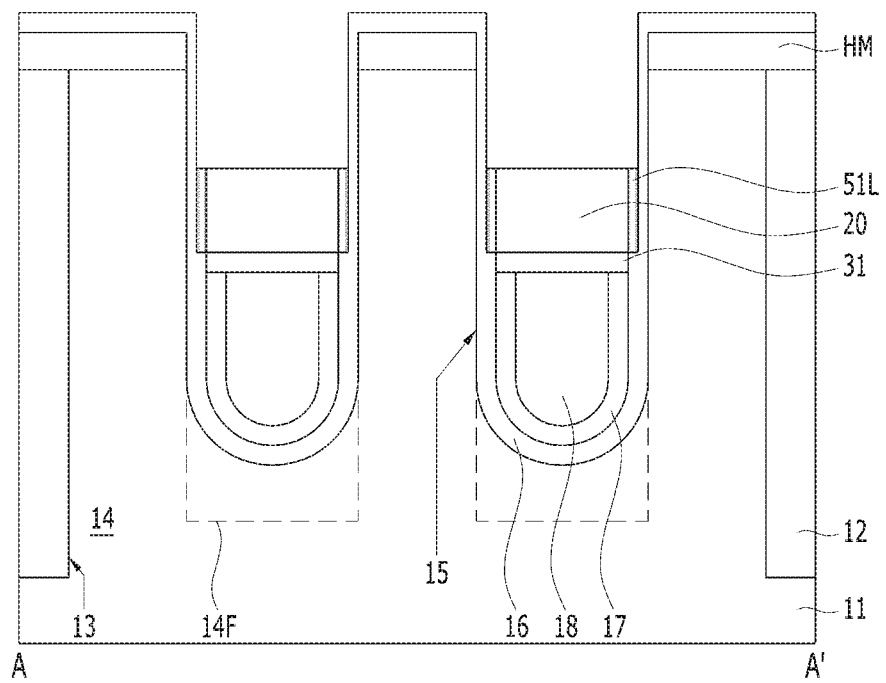

Referring to FIG. 16F, a dipole inducing portion 51L may be formed. The dipole inducing portion 51L may contact both sidewalls of the second gate electrode 20. For forming the dipole inducing portion 51L, the DICS diffused portion 51L' may be selectively removed. For example, the DICS diffused portion 51L' that is not in contact with the second gate electrode 20 may be removed by wet etching. The top surfaces of the dipole inducing portion 51L and the second gate electrode 20 may be positioned at the same level. The top surface of the dipole inducing portion 51L may be recessed lower than the top surface of the active region 14.

The dipole inducing portion 51L may have a form of a spacer. The dipole inducing portion 51L may not be positioned between and be in direct contact with the first gate electrode 18 and the second gate electrode 20.

After the dipole inducing portion 51L is formed, the gate dielectric layer 16 may remain as a first portion 16A and a second portion 16B (see FIG. 12F). The thickness of the second portion 16B may be thinner than the thickness of the first portion 16A. After formation of the dipole inducing portion 51L, a portion of the second portion 16B of the gate dielectric layer 16 may be exposed.

Figure 16G:
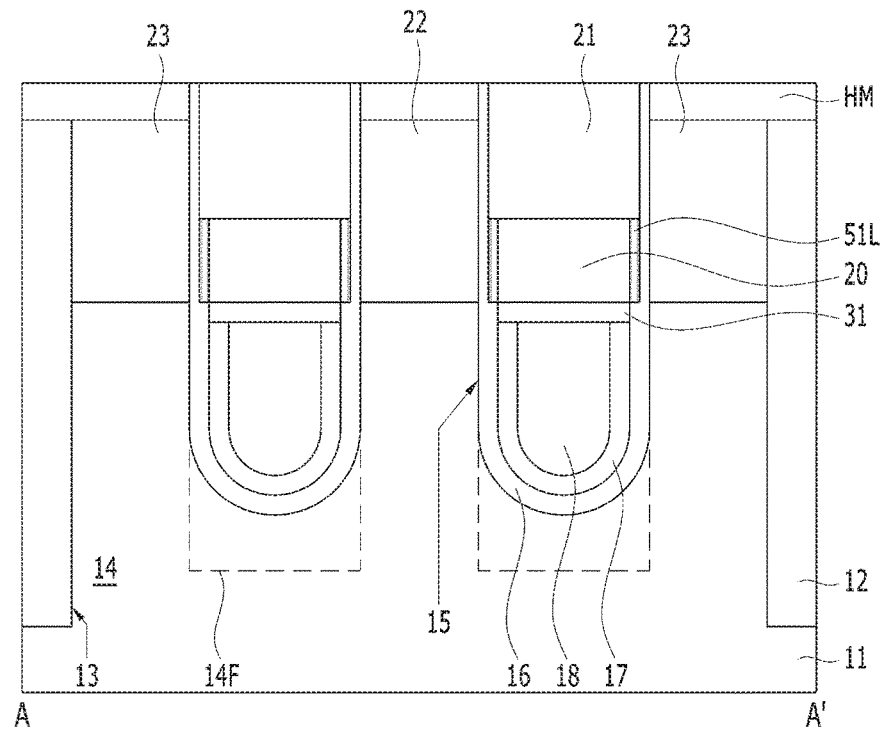

Referring to FIG. 16G, a capping layer 21 may be formed over the dipole inducing portion 51L and the second gate electrode 20. After formation of the capping layer 21, a first source/drain region 22 and a second source/drain region 23 may be formed in the active region 14.

Figure 17:
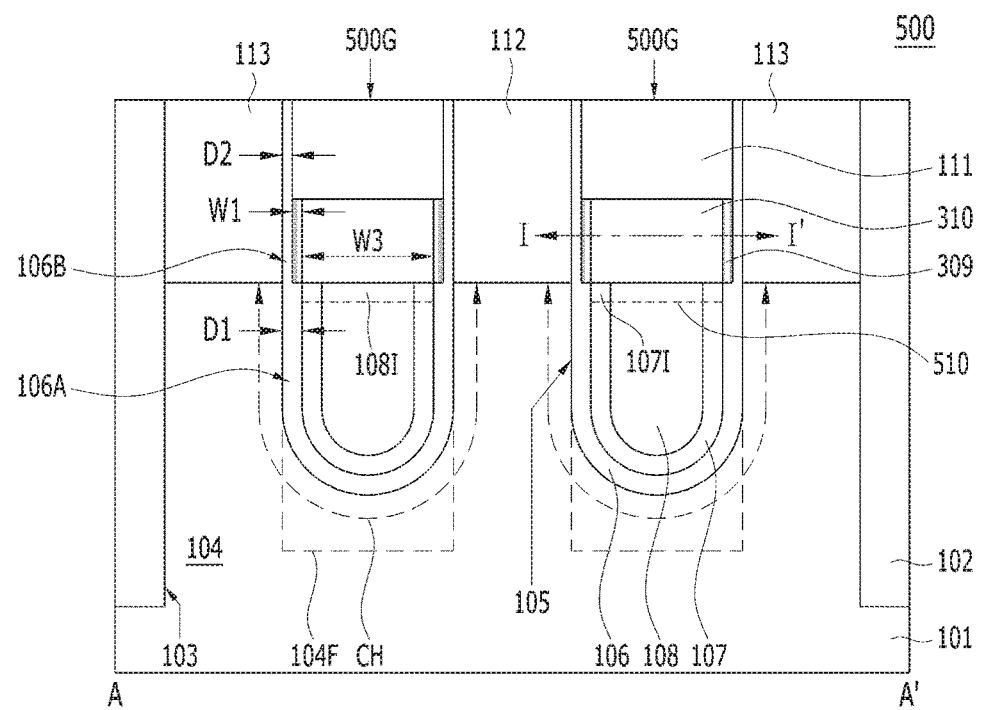
FIG. 17 is a cross-sectional view illustrating a semiconductor device in accordance with a ninth embodiment of the present invention.

FIG. 17 is a cross-sectional view illustrating a semiconductor device 500, in accordance with a ninth embodiment of the present invention. Some constituent elements of the semiconductor device 500 may be the same as those of the semiconductor device 300 of FIG. 10A. More specifically, the other constituent elements except for a doped interface layer 510 may be the same as those of the semiconductor device 300 of FIG. 10A.

Referring to FIG. 17, the semiconductor device 500 may include a buried gate structure 500G. The buried gate structure 500G may include a gate dielectric layer 106, a barrier 107, a first gate electrode 108, a dipole inducing portion 309, a second gate electrode 310, and a capping layer 111. The buried gate structure 500G may further include a doped interface layer 510 between the first gate electrode 108 and the second gate electrode 310.

The doped interface layer 510 may include a first doped interface layer 107I and a second doped interface layer 108I. The first doped interface layer 107I may be positioned over the barrier 107. The second doped interface layer 108I may be positioned over the first gate electrode 108. The first doped interface layer 107I may be positioned between the barrier 107 and the second gate electrode 310. The second doped interface layer 108I may be positioned between and be in direct contact with the first gate electrode 108 and the second gate electrode 310. The first doped interface layer 107I and the second doped interface layer 108I may be of different materials.

The doped interface layer 510 may include DICS. The DICS may include lanthanum atoms. The doped interface layer 510 may be of a lanthanum atom-doped material. The first doped interface layer 107I and the second doped interface layer 108I may be of a material doped with lanthanum atoms. For example, the first doped interface layer 107I may include a titanium nitride doped with lanthanum atoms. The second doped interface layer 108I may include tungsten doped with lanthanum atoms.

The dipole inducing portion 309 may include DICS. The dipole inducing portion 309 and the doped interface layer 510 may include the same DICS. The dipole inducing portion 309 and the doped interface layer 510 may include lanthanum atoms. The doped interface layer 510 may be of a conductive material. The dipole inducing portion 309 may be of a lanthanum atom-doped silicon oxide.

Figure 18:
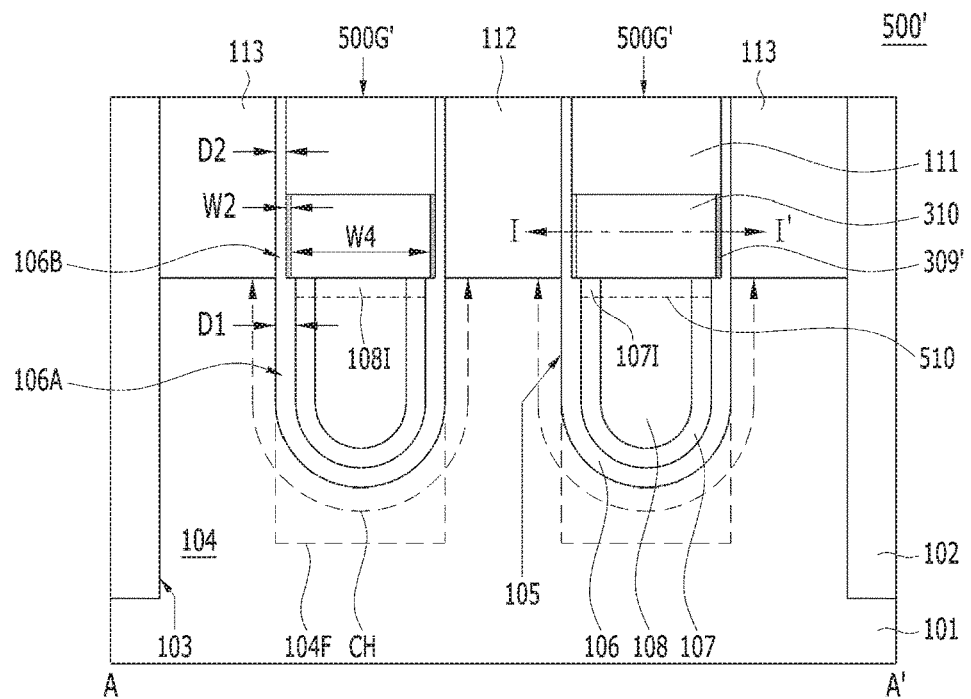
FIG. 18 is a cross-sectional view illustrating a semiconductor device in accordance with a $10^{th}$ embodiment of the present invention.

FIG. 18 is a cross-sectional view illustrating a semiconductor device 500' in accordance with a $10^{th}$ embodiment of the present invention. Some constituent elements of the semiconductor device 500' may be the same as those of the semiconductor device 500 of FIG. 17. The constituent elements except for a second gate electrode 310 and a dipole inducing portion 309' may be the same as those of the semiconductor device 500 of FIG. 17.

Referring to FIG. 18, the semiconductor device 500' may include a buried gate structure 500G'. The buried gate structure 500G' may include a gate dielectric layer 106, a barrier 107, a first gate electrode 108, a dipole inducing portion 309', a second gate electrode 310, and a capping layer 111. The buried gate structure 500G' may further include a doped interface layer 510 between the first gate electrode 108 and the second gate electrode 310.

The thickness of the dipole inducing portion 309' may be thinner than the thickness of the dipole inducing portion 309 of FIG. 17 (W2<W1). The width of the second gate electrode 310 may be wider than the width of the second gate electrode 310 of FIG. 17 (W4>W3). As a result, the volume of the second gate electrode 310, which is a low-resistance material, increases, and the gate sheet resistance may be further reduced. In addition, the filling characteristics of the second gate electrode 310 may be further improved.

The doped interface layer 510 and the dipole inducing portion 309' may not contact each other.

FIGS. 19A to 19F illustrate an example of a method for fabricating the semiconductor device shown in FIG. 17.

First, the barrier 17 and the first gate electrode 18 may be formed in the gate trench 15 by the method described in FIGS. 4A to 4C.

Figure 19A:
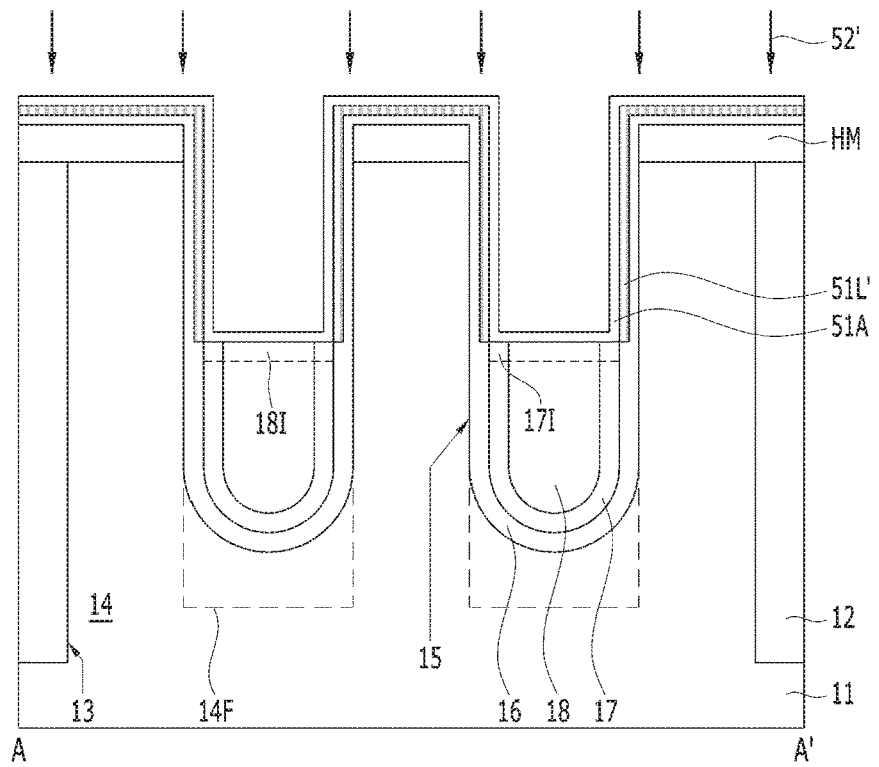
FIGS. 19A to 19F illustrate an example of a method for fabricating the semiconductor device shown in FIG. 17.

Subsequently, Referring to FIG. 19A, a dipole inducing source layer 51A may be formed. The dipole inducing source layer 51A may be conformally formed. The dipole inducing source layer 51A may be formed by using a Chemical Vapor Deposition (CVD) process or an Atomic Layer Deposition (ALD) process. The dipole inducing source layer 51A may include a dipole inducing chemical species (hereinafter "DICS". The DICS may include lanthanum atoms. The dipole inducing source layer 51A may include a lanthanum oxide ($La_2O_3$). In accordance with an embodiment, the dipole inducing source layer 51A may include an yttrium oxide ($Y_2O_3$), a germanium oxide ($GeO_2$), a lutetium oxide ($Lu_2O_3$), or a strontium oxide (SrO).

Subsequently, a heat treatment 52' may be performed. The heat treatment 52' may include a Rapid Thermal Annealing (RTA) of the dipole inducing source layer 51A. When the heat treatment 52' is performed, DICS may be diffused from the dipole inducing source layer 51A. The diffused DICS may be locally positioned in the gate dielectric layer 16. The DICS may be diffused into a portion that the gate dielectric layer 16 contacts the dipole inducing source layer 51A. Thus, a DICS diffused portion 51L' may be locally formed in the gate dielectric layer 16. The DICS diffused portion 51L' may include DICS. The DICS diffused portion 51L' may include lanthanum atoms. The DICS diffused portion 51L' may be of a lanthanum-doped silicon oxide. The DICS diffused portion 51L' may be of a lanthanum silicate.

During the heat treatment 52', the DICS may be diffused into the barrier 17 and the first gate electrode 18. The DICS may be diffused from the dipole inducing source layer 51A into the barrier 17 and the first gate electrode 18. As a result, a first doped interface layer 17I may be formed in the top surface of the barrier 17, and a second doped interface layer 18I may be formed in the top surface of the first gate electrode 18. Since the barrier 17 is of a titanium nitride, the first doped interface layer 17I may be of a lanthanum atom-diffused titanium nitride. Since the first gate electrode 18 is of tungsten, the second doped interface layer 18I may be of lanthanum atoms-diffused tungsten.

Figure 19B:
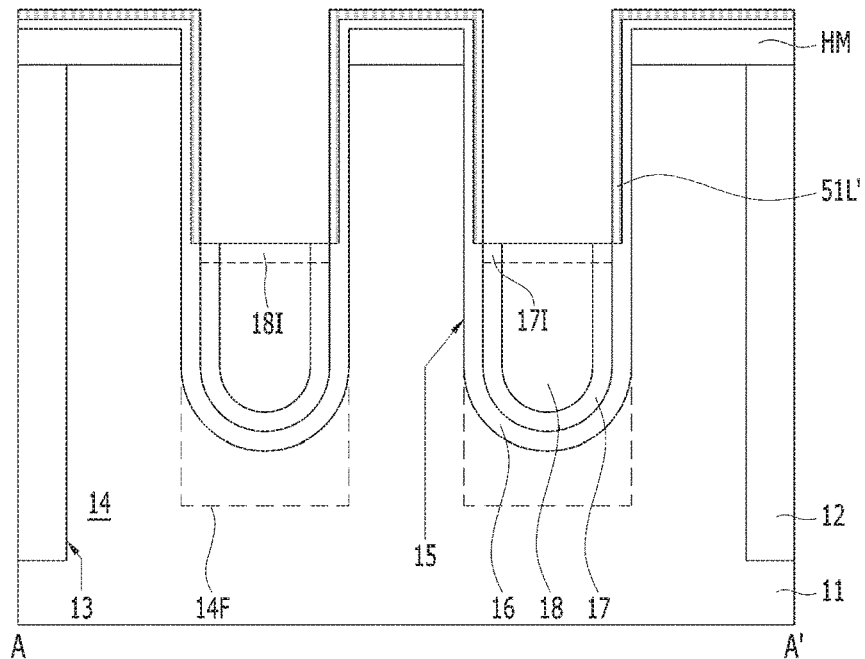

Referring to FIG. 19B, the dipole inducing source layer 51A may be removed. The dipole inducing source layer 51A may be removed by a wet etching process. By applying the wet etching process, the dipole inducing source layer 51A may be selectively removed without attacking the gate dielectric layer 16. In accordance with an embodiment, the wet etching process may be performed by a mixture of HCl/HF.

Figure 19C:
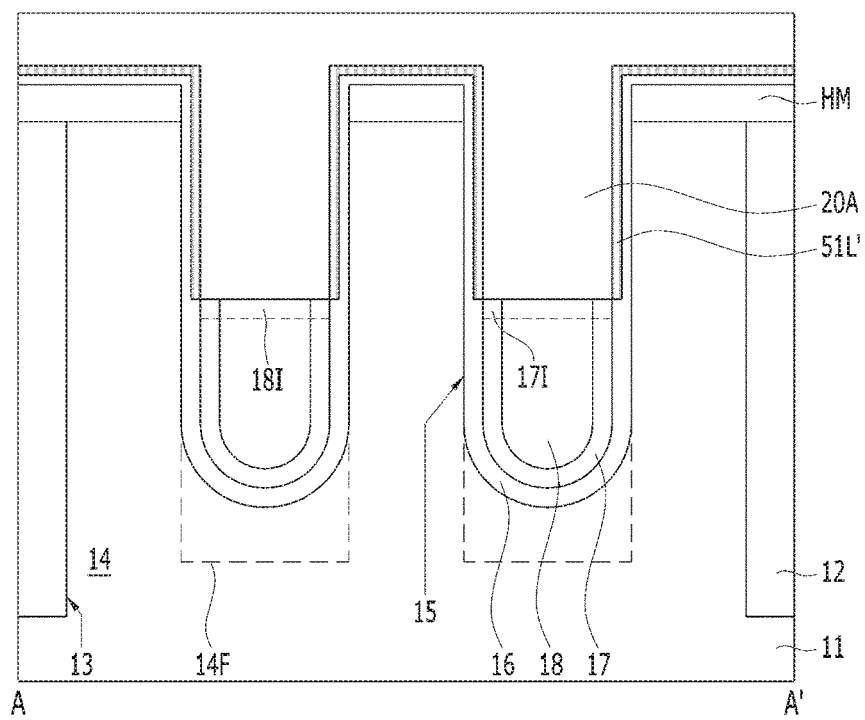

Referring to FIG. 19C, a second conductive layer 20A may be formed over the DICS diffused portion 51L' and the first and second doped interface layers 17I and 18I. The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

Figure 19D:
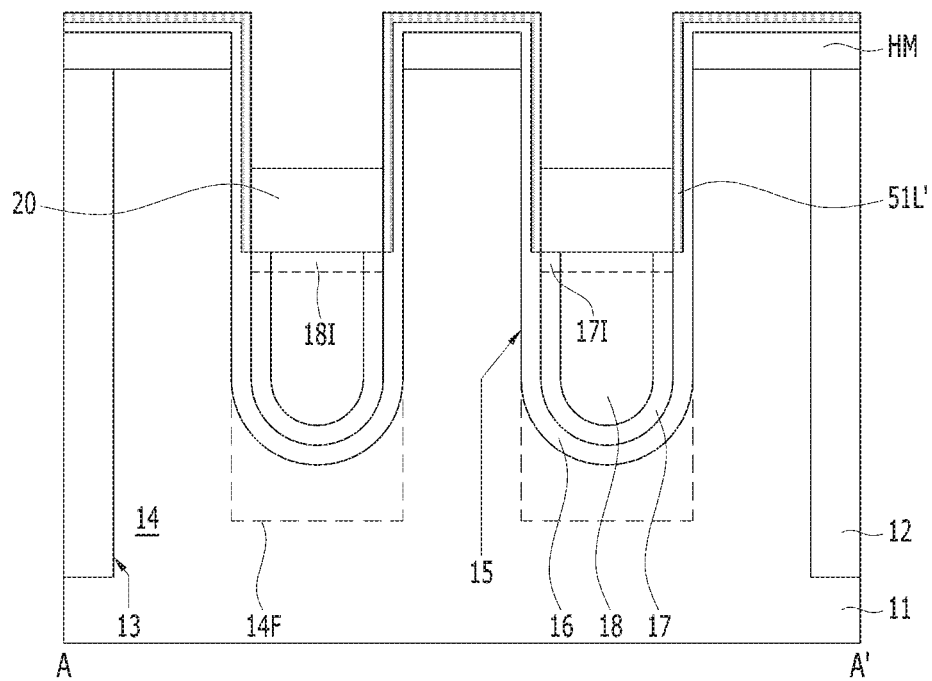

Referring to FIG. 19D, a second gate electrode 20 may be formed in the gate trench 15. For forming the second gate electrode 20, a recessing process may be performed. The recessing process may include a dry etching process, for example, an etch-back process. The second gate electrode 20 is formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14.

Figure 19E:
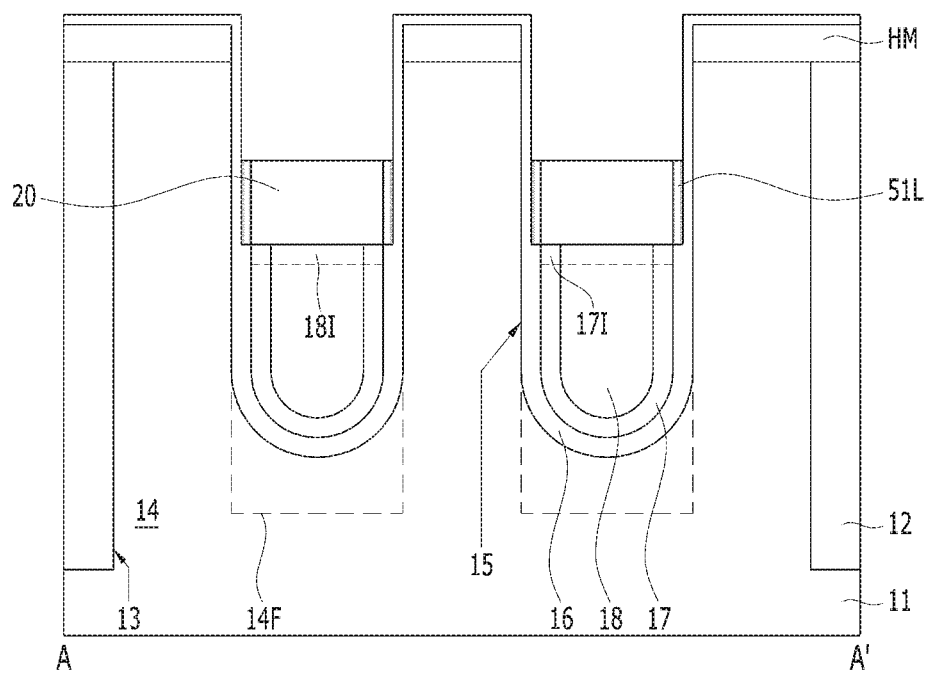

Referring to FIG. 19E, a dipole inducing portion 51L may be formed. The dipole inducing portion 51L may contact both sidewalls of the second gate electrode 20. For forming the dipole inducing portion 51L, the DICS diffused portion 51L' may be selectively removed. For example, the DICS diffused portion 51L' that is not in contact with the second gate electrode 20 may be removed by a wet etching process. The top surfaces of the dipole inducing portion 51L and the second gate electrode 20 may be positioned at the same level. The top surface of the dipole inducing portion 51L may be recessed lower than the top surface of the active region 14.

The dipole inducing portion 51L may have a form of a spacer. The dipole inducing portion 51L may not be positioned between and be in direct contact with the first gate electrode 18 and the second gate electrode 20.

After formation of the dipole inducing portion 51L, the gate dielectric layer 16 may remain as a first portion 16A and a second portion 16B (see FIG. 12F). The thickness of the second portion 16B may be thinner than the thickness of the first portion 16A. After formation of the dipole inducing portion 51L, a portion of the second portion 16B of the gate dielectric layer 16 may be exposed.

Figure 19F:
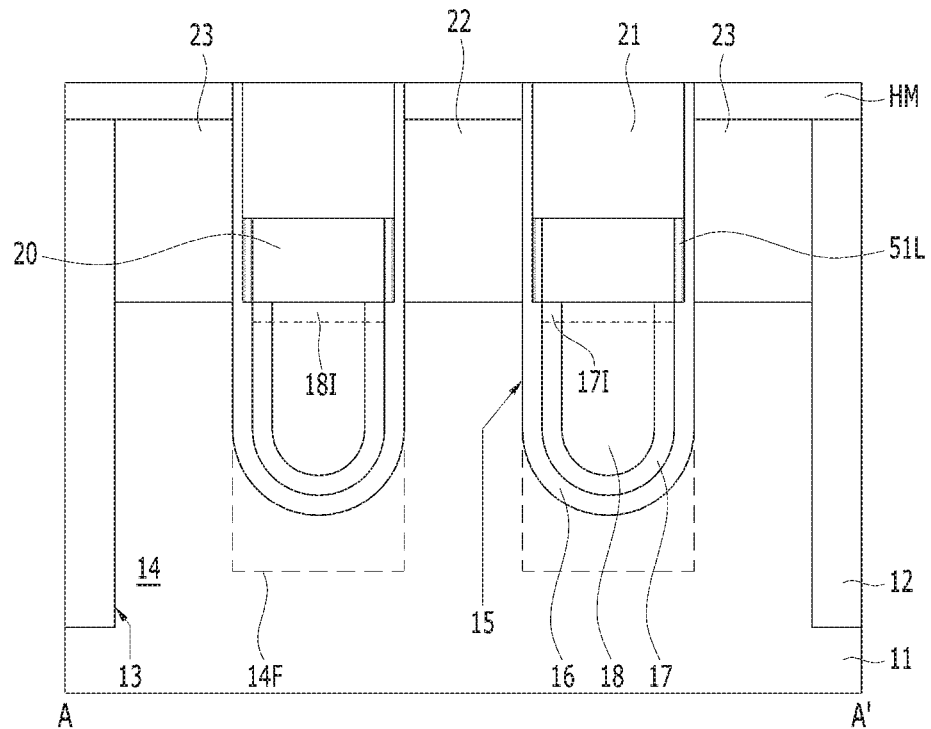

Referring to FIG. 19F, a capping layer 21 may be formed over the dipole inducing portion 51L and the second gate electrode 20.

After formation of the capping layer 21, a first source/drain region 22 and a second source/drain region 23 may be formed in the active region 14.

Figure 20A:
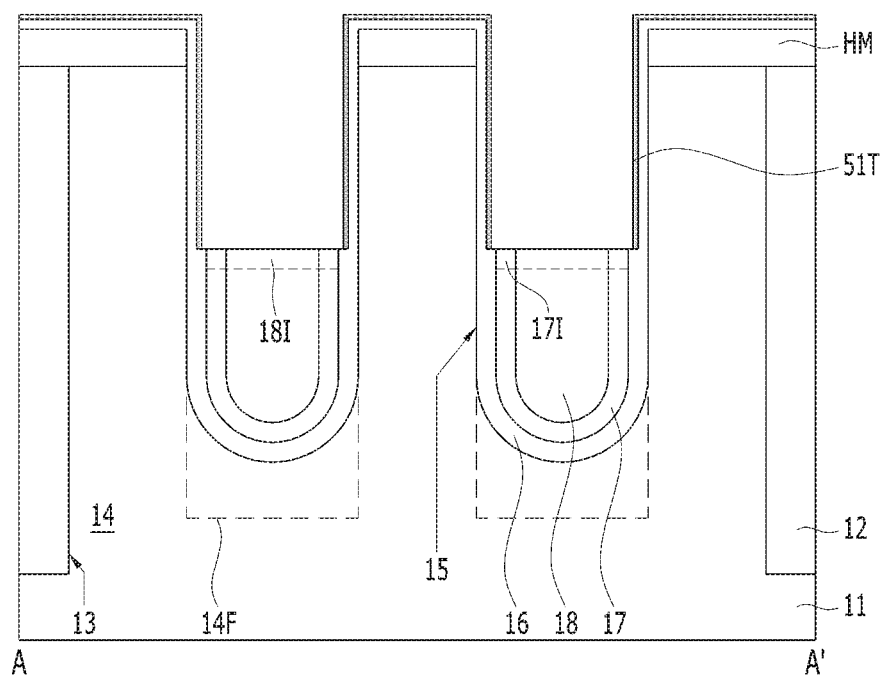
FIGS. 20A and 20B illustrate an example of a method for fabricating the semiconductor device shown in FIG. 18.
Figure 20B:
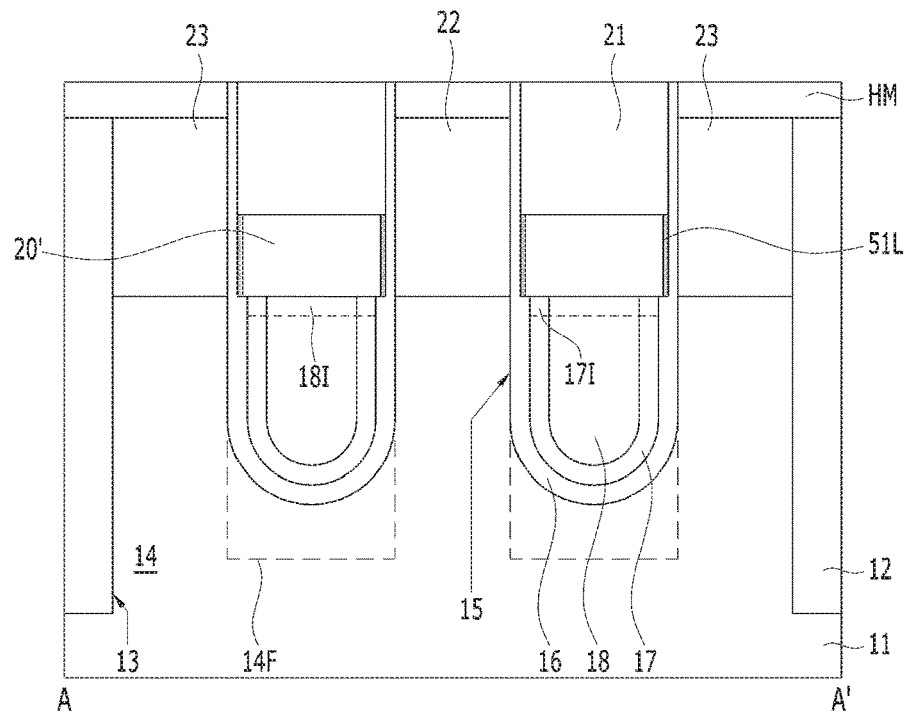

FIGS. 20A and 20B illustrate an example of a method for fabricating the semiconductor device shown in FIG. 18.

First, a barrier 17 and a first gate electrode 18 may be formed in the gate trench 15 by the method described in FIGS. 4A to 4C.

Subsequently, referring to FIG. 19A, a dipole inducing source layer 51A may be formed. The dipole inducing source layer 51A may be conformally formed. The dipole inducing source layer 51A may be formed by using a Chemical Vapor Deposition (CVD) process or an Atomic Layer Deposition (ALD) process. The dipole inducing source layer 51A may include DICS. The DICS may include lanthanum atoms. The dipole inducing source layer 51A may include a lanthanum oxide ($La_2O_3$). In accordance with an embodiment, the dipole inducing source layer 51A may include an yttrium oxide ($Y_2O_3$), a germanium oxide ($GeO_2$), a lutetium oxide ($Lu_2O_3$), or a strontium oxide (SrO).

Subsequently, a heat treatment 52' may be performed. The heat treatment 52' may include a Rapid Thermal Annealing (RTA). The dipole inducing source layer 51A may be exposed to the heat treatment 52'. When the heat treatment 52' is performed, DICS may be diffused from the dipole inducing source layer 51A. The diffused DICS may be locally positioned in the gate dielectric layer 16. The DICS may be diffused into a portion of the gate dielectric layer 16 that contacts the dipole inducing source layer 51A. Therefore, DICS diffused portion 51L' may be locally formed in the gate dielectric layer 16. The DICS diffused portion 51L' may include the DICS. The DICS diffused portion 51L' may include lanthanum atoms. The DICS diffused portion 51L' may be of a lanthanum-doped silicon oxide. The DICS diffused portion 51L' may be of a lanthanum silicate.

The DICS may be diffused from the dipole inducing source layer 51A into the barrier 17 and the first gate electrode 18 during the heat treatment 52'. A first doped interface layer 17I may be formed in the top surface of the barrier 17, and a second doped interface layer 18I may be formed in the top surface of the first gate electrode 18. Since the barrier 17 is a titanium nitride, the first doped interface layer 17I may be a lanthanum atom-diffused titanium nitride. Since the first gate electrode 18 is tungsten, the second doped interface layer 18I may be lanthanum atom-diffused tungsten.

Subsequently, referring to FIG. 20A, the dipole inducing source layer 51A may be removed. The dipole inducing source layer 51A may be removed by a wet etching process. By applying the wet etch process, the dipole inducing source layer 51A may be selectively removed without attacking the gate dielectric layer 16.

When the dipole inducing source layer 51A is removed, the surface of the DICS diffused portion 51L' may be partially removed. As a result, a thinned DICS diffused portion 51T may be formed.

The first doped interface layer 17I and the second doped interface layer 18I may remain without loss.

Subsequently, a dipole inducing portion, a second gate electrode, a capping layer, first and second source/drain regions may be sequentially formed by the method described in FIGS. 19C to 19F. Referring to FIG. 20B, the dipole inducing portion 51L may be positioned in the gate dielectric layer 16. A second gate electrode 20' may be formed over the dipole inducing portion 51L. A capping layer 21 may be formed over the second gate electrode 20'. A second doped interface layer 18I may be formed between the second gate electrode 20' and the first gate electrode 18. A first doped interface layer 17I may be formed between the second gate electrode 20' and the barrier 17.

After the capping layer 21 is formed, a first source/drain region 22 and a second source/drain region 23 may be formed in the active region 14.

Figure 21:
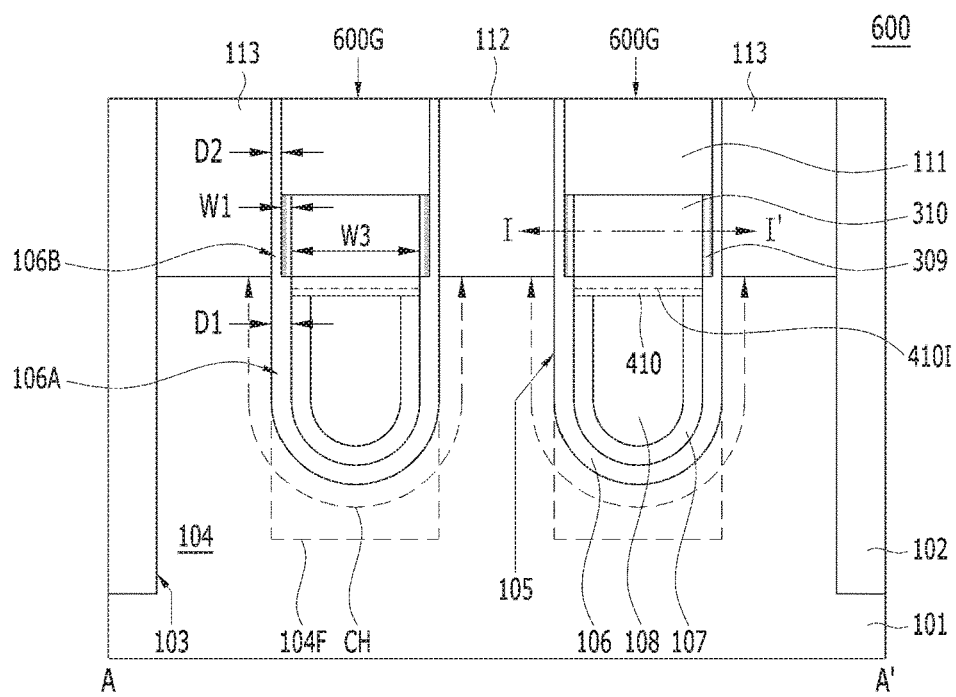
FIG. 21 is a cross-sectional view illustrating a semiconductor device in accordance with an $11^{th}$ embodiment of the present invention.

FIG. 21 is a cross-sectional view illustrating a semiconductor device 600 in accordance with an $11^{th}$ embodiment of the present invention. Some constituent elements of the semiconductor device 600 may be the same as those of the semiconductor device 400 of FIG. 14. More specifically, the other constituent elements except for a doped anti-oxidation barrier 410I may be the same as those of the semiconductor device 400 of FIG. 14.

Referring to FIG. 21, the semiconductor device 600 may include a buried gate structure 600G. The buried gate structure 600G may include a gate dielectric layer 106, a barrier 107, a first gate electrode 108, an anti-oxidation barrier 410, a dipole inducing portion 309, a second gate electrode 310, and a capping layer 111. The buried gate structure 600G may further include a doped anti-oxidation barrier 410I between the first gate electrode 108 and the second gate electrode 310.

The doped anti-oxidation barrier 410I may be positioned between the second gate electrode 310 and the first gate electrode 108. The doped anti-oxidation barrier 410I may be positioned between the barrier 107 and the second gate electrode 310.

The doped anti-oxidation barrier 410I may be positioned in the anti-oxidation barrier 410.

The doped anti-oxidation barrier 410I may include DICS. The anti-oxidation barrier 410 may not include DICS. The DICS may include lanthanum atoms. The doped anti-oxidation barrier 410I may be of a lanthanum-doped material.

The dipole inducing portion 309 may include DICS. The dipole inducing portion 309 and the doped anti-oxidation barrier 410I may include the same DICS. The dipole inducing portion 309 and the doped anti-oxidation barrier 410I may include lanthanum atoms individually. The dipole inducing portion 309 may include a dielectric material, and the doped anti-oxidation barrier 410I may include a conductive material. The dipole inducing portion 309 may be of a lanthanum atom-doped silicon oxide. The doped anti-oxidation barrier 410I may include a titanium nitride doped with lanthanum atoms. The anti-oxidation barrier 410 may include an undoped titanium nitride.

Figure 22:
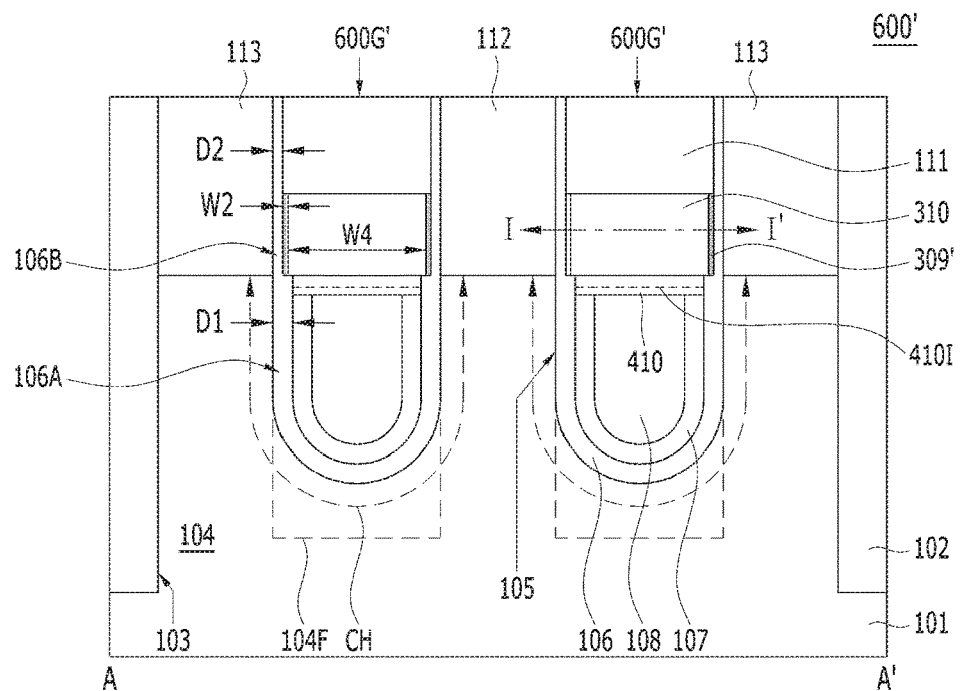
FIG. 22 is a cross-sectional view illustrating a semiconductor device in accordance with a $12^{th}$ embodiment of the present invention.

FIG. 22 is a cross-sectional view illustrating a semiconductor device 600' in accordance with a $12^{th}$ embodiment of the present invention. Some constituent elements of the semiconductor device 600' may be the same as those of the semiconductor device 600 of FIG. 21. More specifically, the other constituent elements except for a dipole inducing portion 309' may be the same as those of the semiconductor device 600 of FIG. 21.

Referring to FIG. 22, the semiconductor device 600' may include a buried gate structure 600G'. The buried gate structure 600G' may include a gate dielectric layer 106, a barrier 107, a first gate electrode 108, a dipole inducing portion 309', a second gate electrode 310, and a capping layer 111. The buried gate structure 600G' may further include an anti-oxidation barrier 410 and a doped anti-oxidation barrier 410I between the first gate electrode 108 and the second gate electrode 310.

The thickness of the dipole inducing portion 309' may be thinner than the thickness of the dipole inducing portion 309 of FIG. 21 (W2<W1). The width of the second gate electrode 310 may be wider than the width of the second gate electrode 310 of FIG. 21 (W4>W3). As a result, the volume of the second gate electrode 310, which is a low-resistance material, increases, and the gate sheet resistance may be further reduced. In addition, the filling characteristics of the second gate electrode 310 may be further improved.

The doped anti-oxidation barrier 410I and the dipole inducing portion 309' may not contact each other.

Figure 23:
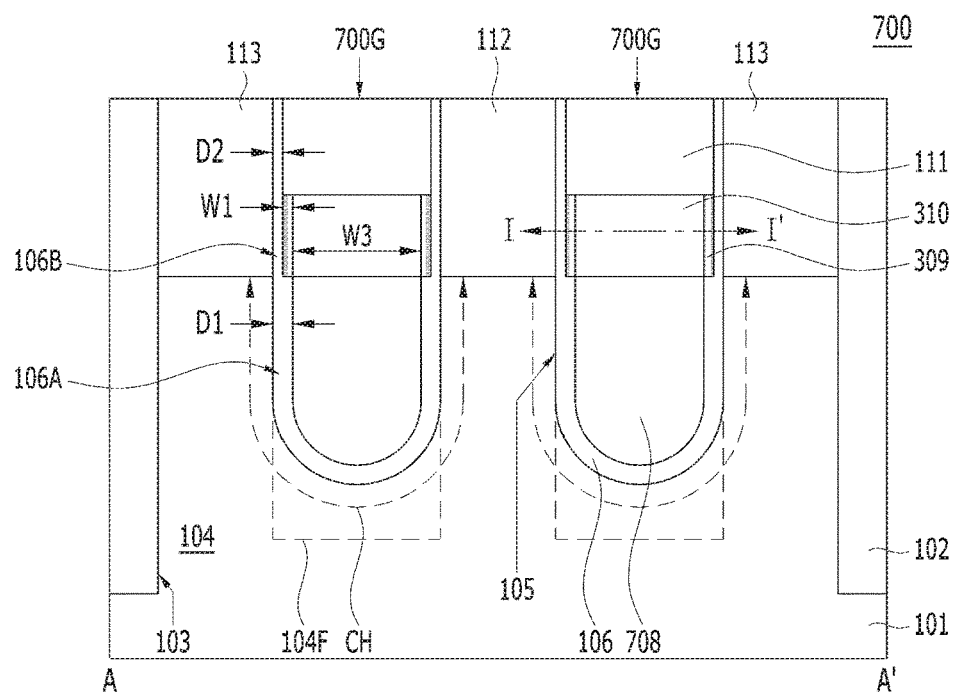
FIG. 23 is a cross-sectional view illustrating a semiconductor device in accordance with a $13^{th}$ embodiment of the present invention.

FIG. 23 is a cross-sectional view illustrating a semiconductor device 700 in accordance with a $13^{th}$ embodiment of the present invention. Some constituent elements of the semiconductor device 700 may be the same as those of the semiconductor device 300 of FIG. 10. More specifically, the other constituent elements except for a first gate electrode 708 may be the same as those of the semiconductor device 300 of FIG. 10.

Referring to FIG. 23, the semiconductor device 700 may include a buried gate structure 700G. The buried gate structure 700G may include a gate dielectric layer 106, a first gate electrode 708, a dipole inducing portion 309, a second gate electrode 310, and a capping layer 111.

The dipole inducing portion 309 may be positioned in the gate dielectric layer 106. The dipole inducing portion 309 may be in direct contact with the second gate electrode 310. The dipole inducing portion 309 may not be positioned between and be in direct contact with the first gate electrode 708 and the second gate electrode 310.

The first gate electrode 708 may be formed of a material that does not attack the gate dielectric layer 106. For example, the first gate electrode 708 may be formed of a material that does not contain any impurity, e.g., fluorine, i.e., a fluorine-free material. Thus, the barrier between the first gate electrode 708 and the gate dielectric layer 106 may be omitted. The first gate electrode 708 may include a titanium nitride. Since the first gate electrode 708 is of a fluorine-free material, the first gate electrode 708 may be referred to also herein as 'a barrier-less gate electrode'. The first gate electrode 708 in FIG. 23 is of a titanium nitride. The titanium nitride may not attack the gate dielectric layer 106. Since the barrier is omitted, the filling characteristic of the first gate electrode 708 may be improved.

The first gate electrode 708 and the second gate electrode 310 may be made of the same material. For example, the first gate electrode 70 and the second gate electrode 310 may each be formed of a titanium nitride. Accordingly, the first gate electrode 708 and the second gate electrode 310 may be 'a TiN-only gate electrode'.

The top surface of the dipole inducing portion 309 may be positioned at a lower level than the top surface of the substrate 101.

The dipole inducing portion 309 may be locally positioned in the gate dielectric layer 106. In other words, the dipole inducing portion 309 may be positioned in the gate dielectric layer 106. The dipole inducing portion 309 may overlap with the first and second source/drain regions 112 and 113 in the horizontal direction (see I-I').

Since the dipole inducing portion 309 is positioned in the gate dielectric layer 106, the filling characteristics of the second gate electrode 310 may be improved. The suppression of the gate induced drain leakage (GIDL) may be improved by a dipole inducing portion 309 containing DICS.

Figure 24:
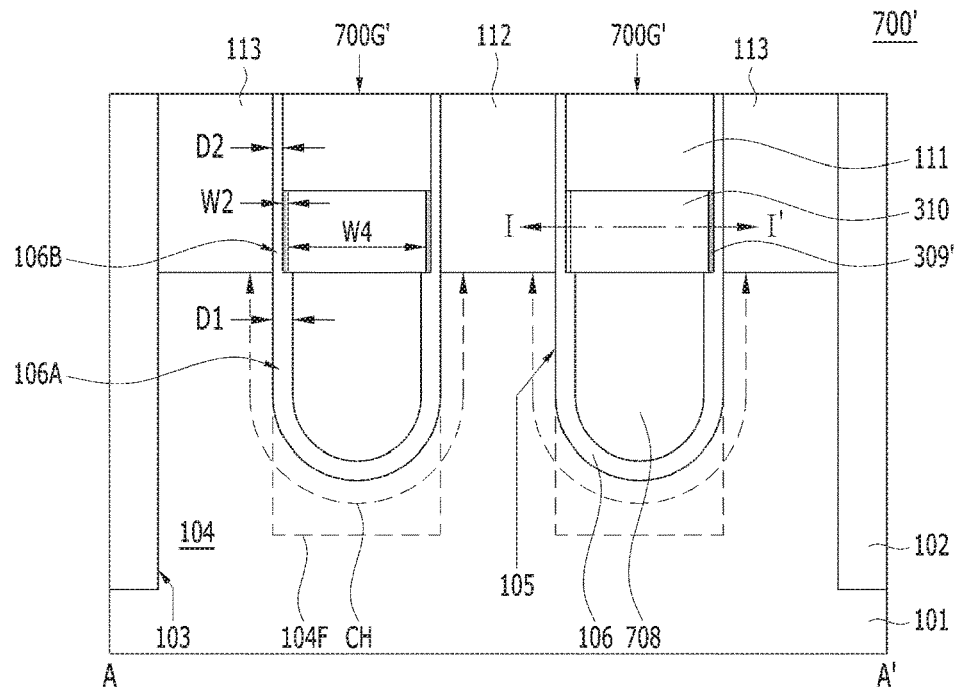
FIG. 24 is a cross-sectional view illustrating a semiconductor device in accordance with a $14^{th}$ embodiment of the present invention.

FIG. 24 is a cross-sectional view illustrating a semiconductor device 700' in accordance with a 14$^{th}$ embodiment of the present invention. Some constituent elements may be the same as those of the semiconductor device 700 of FIG. 23. More specifically, the other constituent elements except for a dipole inducing portion 309' may be the same as those of the semiconductor device 700 of FIG. 23.

Referring to FIG. 24, the semiconductor device 700' may include a buried gate structure 700G'. The buried gate structure 700G' may include a gate dielectric layer 106, a first gate electrode 708, a dipole inducing portion 309', a second gate electrode 310, and a capping layer 111.

The thickness of the dipole inducing portion 309' may be thinner than the thickness of the dipole inducing portion 309 of FIG. 23 (W2<W1). The width of the second gate electrode 310 may be wider than the width of the second gate electrode 310 of FIG. 23 (W4>W3). As a result, the volume of the second gate electrode 310, which is a low-resistance material, increases, and the gate sheet resistance may be further reduced. In addition, the filling characteristics of the second gate electrode 310 may be further improved.

Figure 25:
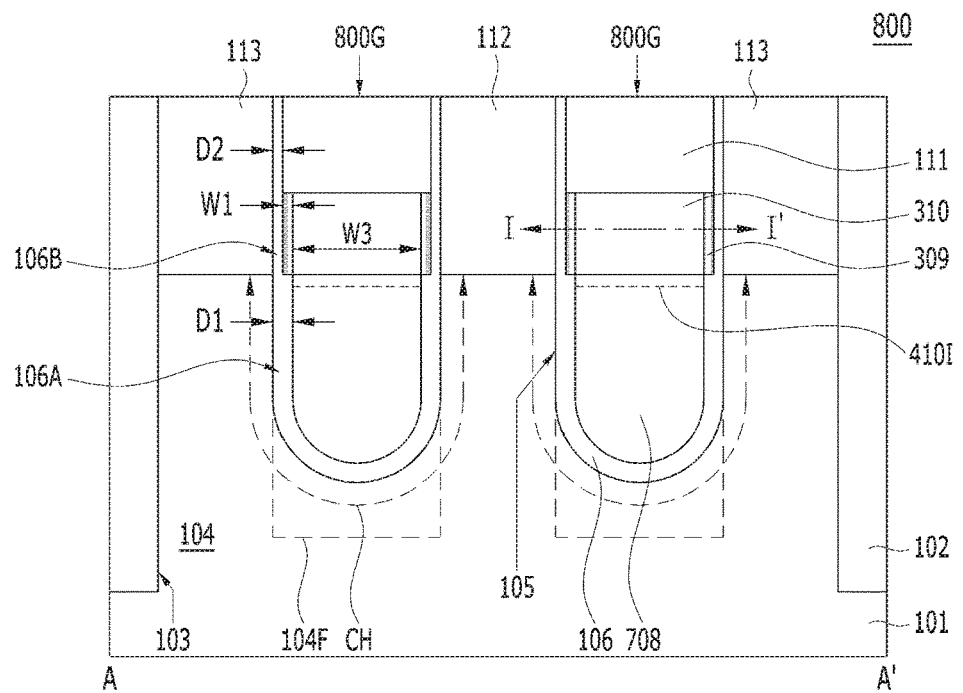
FIG. 25 is a cross-sectional view illustrating a semiconductor device in accordance with a $15^{th}$ embodiment of the present invention.

FIG. 25 is a cross-sectional view illustrating a semiconductor device 800 in accordance with a 15$^{th}$ embodiment of the present invention. Some constituent elements of the semiconductor device 800 may be the same as those of the semiconductor device 700 of FIG. 23. More specifically, the other constituent elements except for a doped interface layer 410I may be the same as those of the semiconductor device 700 of FIG. 23.

Referring to FIG. 25, the semiconductor device 800 may include a buried gate structure 800G. The buried gate structure 800G may include a gate dielectric layer 106, a first gate electrode 708, a dipole inducing portion 309, a second gate electrode 310, and a capping layer 111. The buried gate structure 800G may further include a doped interface layer 410I between the first gate electrode 708 and the second gate electrode 310.

The doped interface layer 410I may be positioned between and be in direct contact with the first gate electrode 708 and the second gate electrode 310.

The doped interface layer 410I may comprise DICS. The DICS may include lanthanum atoms. The doped interface layer 410I may be a lanthanum atom-doped material. For example, the doped interface layer 410I may include a titanium nitride doped with lanthanum atoms.

The dipole inducing portion 309 may include DICS. The dipole inducing portion 309 and the doped interface layer 410I may include the same DICS. The dipole inducing portion 309 and the doped interface layer 410I may include lanthanum atoms, individually. The dipole inducing portion 309 may be of a dielectric material, and the doped interface layer 410I may be of a conductive material. The dipole inducing portion 309 may be a lanthanum atom-doped silicon oxide.

Figure 26:
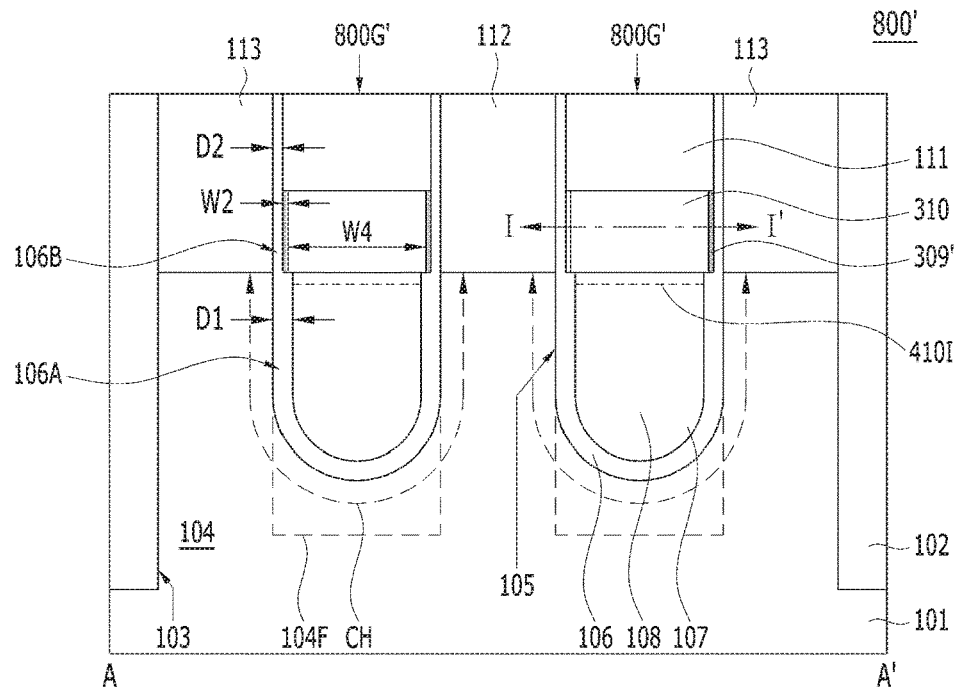
FIG. 26 is a cross-sectional view illustrating a semiconductor device in accordance with a $16^{th}$ embodiment of the present invention.

FIG. 26 is a cross-sectional view illustrating a semiconductor device 800' in accordance with a 16$^{th}$ embodiment of the present invention. Some constituent elements of the semiconductor device 800' may be the same as those of the semiconductor device 800 of FIG. 25. More specifically, the other constituent elements except for a dipole inducing portion 309' may be the same as those of the semiconductor device 800 of FIG. 25.

Referring to FIG. 26, the semiconductor device 800' may include a buried gate structure 800G'. The buried gate structure 800G' may include a gate dielectric layer 106, a first gate electrode 708, a dipole inducing portion 309', a second gate electrode 310, and a capping layer 111. The buried gate structure 800G' may further include a doped interface layer 410I between the first gate electrode 708 and the second gate electrode 310.

The thickness of the dipole inducing portion 309' may be thinner than the thickness of the dipole inducing portion 309 of FIG. 25 (W2<W1). The width of the second gate electrode 310 may be wider than the width of the second gate electrode 310 of FIG. 25 (W4>W3). As a result, the volume of the second gate electrode 310, which is a low-resistance material, increases, and the gate sheet resistance may be further reduced. In addition, the filling characteristics of the second gate electrode 310 may be further improved.

Figure 27:
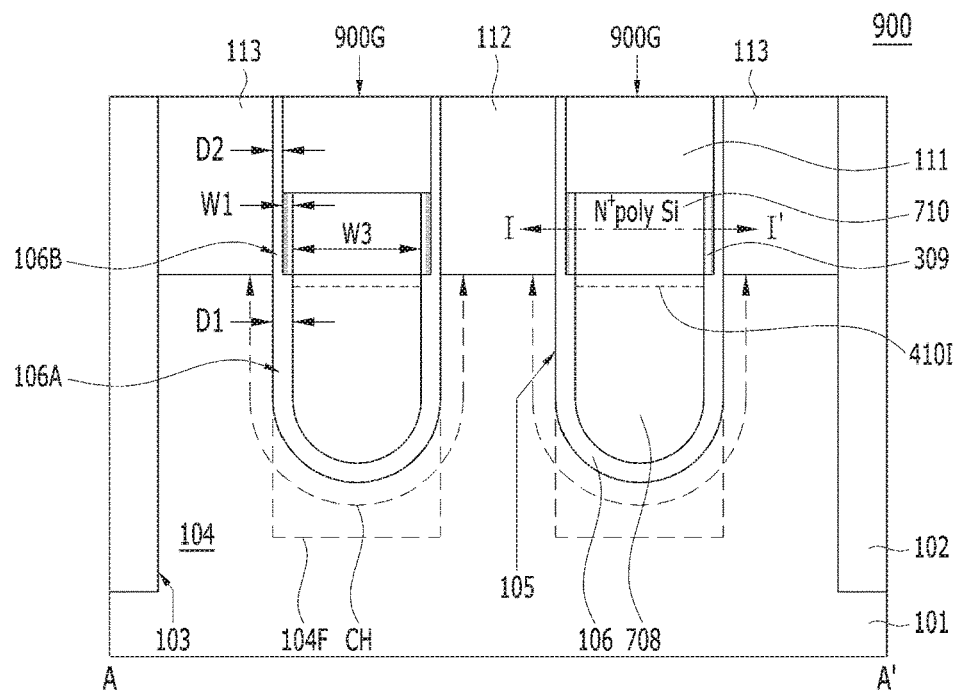
FIG. 27 is a cross-sectional view illustrating a semiconductor device in accordance with a $17^{th}$ embodiment of the present invention.

FIG. 27 is a cross-sectional view illustrating a semiconductor device 900 in accordance with a 17$^{th}$ embodiment of the present invention. Some constituent elements of the semiconductor device 900 may be the same as those of the semiconductor device 800 of FIG. 25. More specifically, the other constituent elements except for a second gate electrode 710 may be the same as those of the semiconductor device 800 of FIG. 25.

Referring to FIG. 27, the semiconductor device 900 may include a buried gate structure 900G. The buried gate structure 900G may include a gate dielectric layer 106, a first gate electrode 708, a dipole inducing portion 309, a second gate electrode 710, and a capping layer 111. The buried gate structure 900G may further include a doped interface layer 410I between the first gate electrode 708 and the second gate electrode 710.

The first gate electrode 708 and the second gate electrode 710 may be of different materials. For example, the second gate electrode 710 may be formed of polysilicon. The second gate electrode 710 may be formed of polysilicon having a low work function. The second gate electrode 710 may be formed of polysilicon doped with an N-type impurity (hereinafter, referred to as an N-type polysilicon). When the N-type polysilicon is applied as the second gate electrode 710, the agglomeration issue may be improved. The second gate electrode 710 may include polysilicon (N⁺ Poly Si) doped with a high-concentration N-type impurity.

The first gate electrode 708 may be formed of a titanium nitride, and the second gate electrode 710 may be formed of an N-type polysilicon.

Referring to FIG. 27, the buried gate structure 900G may include a dual gate electrode formed of a first gate electrode 708 and a second gate electrode 710. A doped interface layer 410I may be positioned between and be in direct contact with the first gate electrode 708 and the second gate electrode 710. A dipole inducing portion 309 may be positioned between the second gate electrode 710 and the gate dielectric layer 106. A dipole inducing portion 309 may be positioned in the gate dielectric layer 106. The dipole inducing portion 309 may overlap with the first and second source/drain regions 112 and 113 in the horizontal direction. The doped interface is layer 410I and the dipole inducing portion 309 may commonly include DICS. The DICS may include lanthanum atoms.

Figure 28:
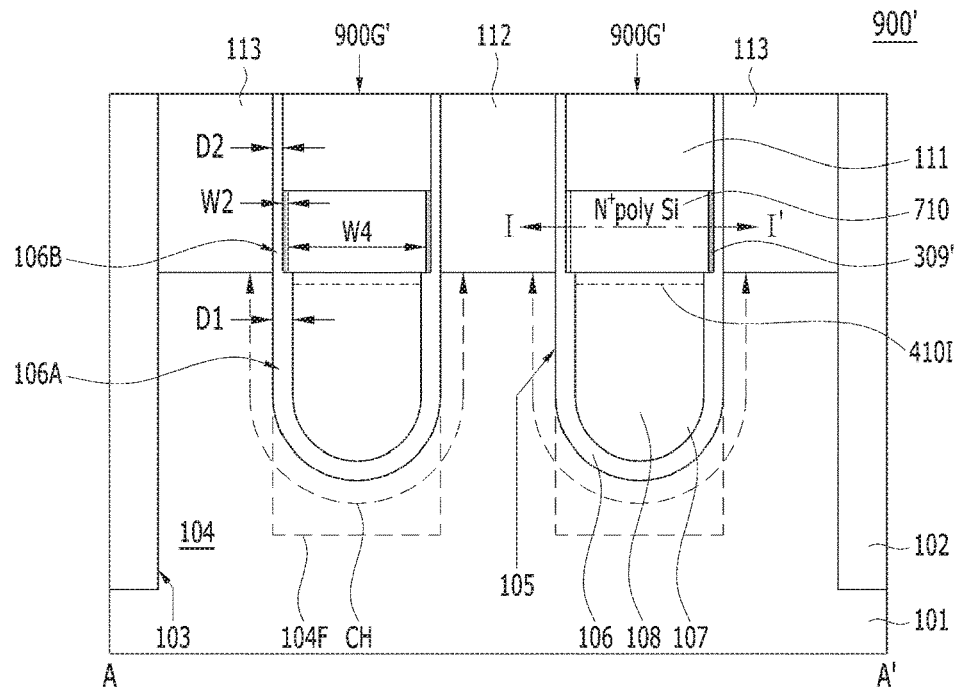
FIG. 28 is a cross-sectional view illustrating a semiconductor device in accordance with an $18^{th}$ embodiment of the present invention.

FIG. 28 is a cross-sectional view illustrating a semiconductor device 900' in accordance with an 18$^{th}$ embodiment of the present invention. Some constituent elements of the semiconductor device 900' may be the same as those of the semiconductor device 900 of FIG. 27. More specifically, the other constituent elements except for a dipole inducing portion 309' may be the same as those of the semiconductor device 900 of FIG. 27.

Referring to FIG. 28, the semiconductor device 900' may include a buried gate structure 900G'. The buried gate structure 900G' may include a gate dielectric layer 106, a first gate electrode 708, a dipole inducing portion 309', a second gate electrode 710, and a capping layer 111. The buried gate structure 900G' may further include a doped interface layer 410I between the first gate electrode 708 and the second gate electrode 710.

The thickness of the dipole inducing portion 309' may be thinner than the thickness of the dipole inducing portion 309 of FIG. 27 (W2<W1). The width of the second gate electrode 310 may be wider than the width of the second gate electrode 310 of FIG. 27 (W4>W3). As a result, the volume of the second gate electrode 310, which is a low-resistance material, increases, and the gate sheet resistance may be further reduced. In addition, the filling characteristics of the second gate electrode 310 may be further improved.

The first gate electrode 708 and the second gate electrode 710 may be of different materials. For example, the second gate electrode 710 may be formed of polysilicon. The second gate electrode 710 may be formed of polysilicon having a low work function. The second gate electrode 710 may be formed of polysilicon doped with an N-type impurity (hereinafter, referred to as an N-type polysilicon). When the N-type polysilicon is applied as the second gate electrode 710, the agglutination issue may be improved.

The first gate electrode 708 may be formed of a titanium nitride, and the second gate electrode 710 may be formed of an N-type polysilicon.

Referring to FIG. 28, the buried gate structure 900G' may include a dual gate electrode formed of a first gate electrode 708 and a second gate electrode 710. A doped interface layer 410I may be positioned between and be in direct contact with the first gate electrode 708 and the second gate electrode 710. A dipole inducing portion 309' may be positioned between the second gate electrode 710 and the gate dielectric layer 106. A dipole inducing portion 309' may be positioned in the gate dielectric layer 106. The dipole inducing portion 309' may overlap with the first and second source/drain regions 112 and 113 in the horizontal direction. The doped interface layer 410I and the dipole inducing portion 309' may include the same DICS. The DICS may include lanthanum atoms.

Figure 29:
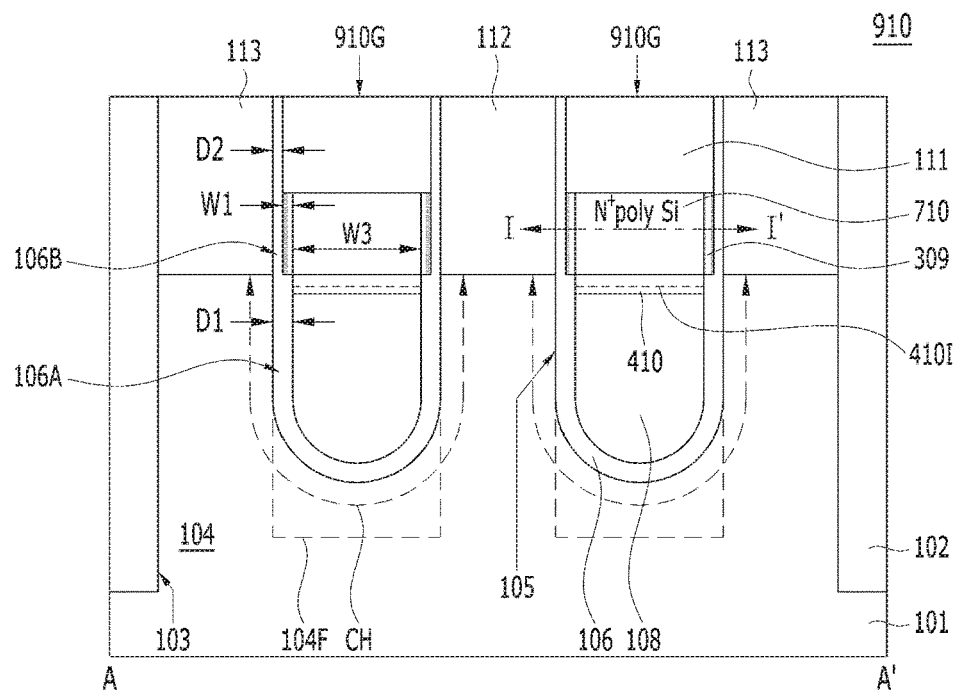
FIG. 29 is a cross-sectional view illustrating a semiconductor device in accordance with a $19^{th}$ embodiment of the present invention.

FIG. 29 is a cross-sectional view illustrating a semiconductor device 910 in accordance with a 19$^{th}$ embodiment of the present invention. Some constituent elements of the semiconductor device 910 may be the same as those of the semiconductor device 900 of FIG. 27. More specifically, the other constituent elements except for an anti-oxidation barrier 410 and a doped anti-oxidation barrier 410I may be the same as those of the semiconductor device 900 of FIG. 27.

Referring to FIG. 29, the semiconductor device 910 may include a buried gate structure 910G. The buried gate structure 910G may include a gate dielectric layer 106, a first gate electrode 708, a dipole inducing portion 309, a second gate electrode 710, and a capping layer 111. The buried gate structure 910G may further include an anti-oxidation barrier 410 and a doped anti-oxidation barrier 410I between the first gate electrode 708 and the second gate electrode 710.

The doped anti-oxidation barrier 410I may be positioned between the second gate electrode 310 and the first gate electrode 108. The doped anti-oxidation barrier 410I may be positioned between the barrier 107 and the second gate electrode 310.

The doped anti-oxidation barrier 410I may be positioned in the anti-oxidation barrier 410.

The doped anti-oxidation barrier 410I may include DICS. The anti-oxidation barrier 410 may not include DICS. The DICS may include lanthanum atoms. The doped anti-oxidation barrier 410I may be a lanthanum atom-doped material.

The first gate electrode 708 and the second gate electrode 710 may be of different materials. For example, the second gate electrode 710 may be formed of polysilicon. The second gate electrode 710 may be formed of polysilicon having a low work function. The second gate electrode 710 may be formed of polysilicon (N⁺ poly Si) doped with a high-concentration N-type impurity.

The first gate electrode 708 may be formed of a titanium nitride, and the second gate electrode 710 may be formed of an N-type polysilicon.

According to FIG. 29, the buried gate structure 900G may include a dual gate electrode formed of a first gate electrode 708 and a second gate electrode 710. An anti-oxidation barrier 410 and a doped anti-oxidation barrier 410I may be positioned between and be in direct contact with the first gate electrode 708 and the second gate electrode 710. A dipole inducing portion 309 may be positioned between the second gate electrode 710 and the gate dielectric layer 106. A dipole inducing portion 309 may be positioned in the gate dielectric layer 106. The dipole inducing portion 309 may overlap with the first and second source/drain regions 112 and 113 in the horizontal direction. The doped anti-oxidation barrier 410I and the dipole inducing portion 309 may include the same DICS. The DICS may include lanthanum atoms.

Figure 30:
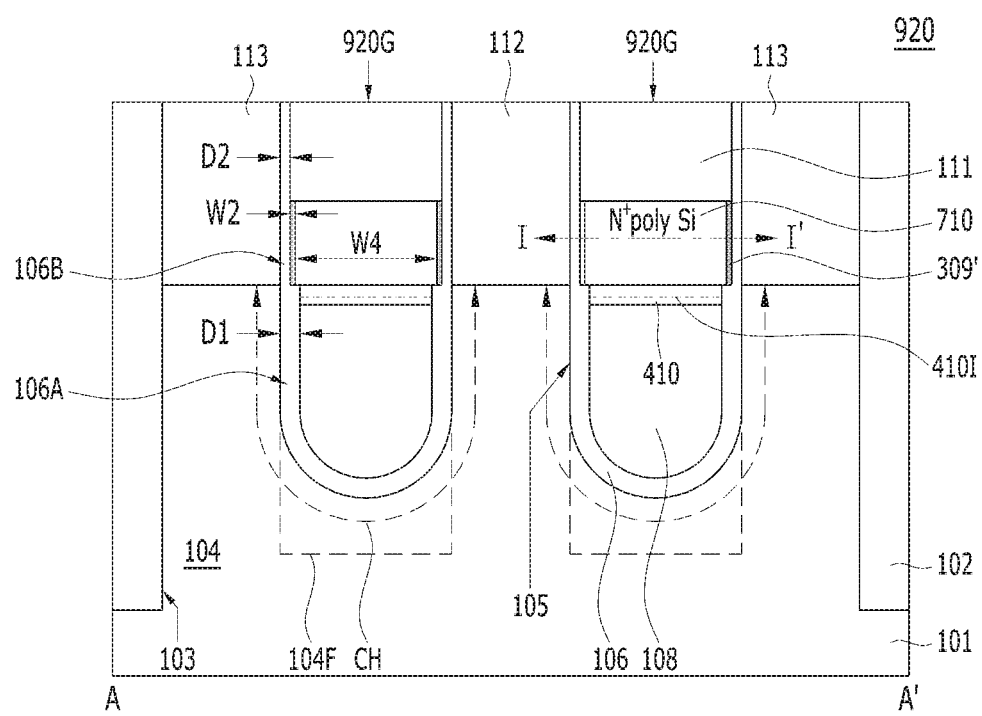
FIG. 30 is a cross-sectional view illustrating a semiconductor device in accordance with a $20^{th}$ embodiment of the present invention.

FIG. 30 is a cross-sectional view illustrating a semiconductor device in accordance with a 20$^{th}$ embodiment of the present invention. Some constituent elements of the semiconductor device 920 may be the same as the semiconductor device 910 of FIG. 29. More specifically, the other constituent elements except for a dipole inducing portion 309' may be the same as the semiconductor device 910 of FIG. 29.

Referring to FIG. 30, the semiconductor device 920 may include a buried gate structure 920G. The buried gate structure 920G may include a gate dielectric layer 106, a first gate electrode 708, a dipole inducing portion 309', a second gate electrode 710, and a capping layer 111. The buried gate structure 920G may further include an anti-oxidation barrier 410 and a doped anti-oxidation barrier 410I between the first gate electrode 708 and the second gate electrode 710.

The doped anti-oxidation barrier 410I may be positioned between the second gate electrode 310 and the first gate electrode 108. The doped anti-oxidation barrier 410I may be positioned between the barrier 107 and the second gate electrode 310.

The doped anti-oxidation barrier 410I may be positioned in the anti-oxidation barrier 410.

The doped anti-oxidation barrier 410I may include DICS. The anti-oxidation barrier 410 may not include DICS. The DICS may include lanthanum atoms. The doped anti-oxidation barrier 410I may be a lanthanum-doped material.

The thickness of the dipole inducing portion 309' may be thinner than the thickness of the dipole inducing portion 309 of FIG. 29 (W2<W1). The width of the second gate electrode 710 may be wider than the width of the second gate electrode 710 of FIG. 27 (W4>W3). As a result, the volume of the second gate electrode 710, which is a low-resistance material, increases, and the gate sheet resistance may be further reduced. In addition, the filling characteristics of the second gate electrode 710 may be further improved.

The first gate electrode 708 and the second gate electrode 710 may be of different materials. For example, the second gate electrode 710 may be formed of polysilicon. The second gate electrode 710 may be formed of polysilicon having a low work function. The second gate electrode 710 may be formed of polysilicon ($N^+$ Poly Si) doped with a high-concentration N-type impurity.

The first gate electrode 708 may be formed of a titanium nitride, and the second gate electrode 710 may be formed of an N-type polysilicon.

Referring to FIG. 30, the buried gate structure 900G' may include a dual gate electrode formed of a first gate electrode 708 and a second gate electrode 710. An anti-oxidation barrier 410 and a doped anti-oxidation barrier 410I may be positioned between and be in direct contact with the first gate electrode 708 and the second gate electrode 710. A dipole inducing portion 309' may be positioned between the second gate electrode 710 and the gate dielectric layer 106. A dipole inducing portion 309' may be positioned in the gate dielectric layer 106. The dipole inducing portion 309' may overlap with the first and second source/drain regions 112 and 113 in the horizontal direction. The doped interface layer 410I and the dipole inducing portion 309' may include the same DICS. The DICS may include lanthanum atoms.

FIGS. 31A to 31G illustrate an example of a method for fabricating the semiconductor device 600. More specifically, the other constituent elements except for a doped anti-oxidation barrier 31I may be similar to the method described in FIGS. 16A to 16G.

First, an anti-oxidation barrier 31 and a dummy anti-oxidation layer 31D may be formed by the method described in FIGS. 7A and 7B.

Figure 31A:
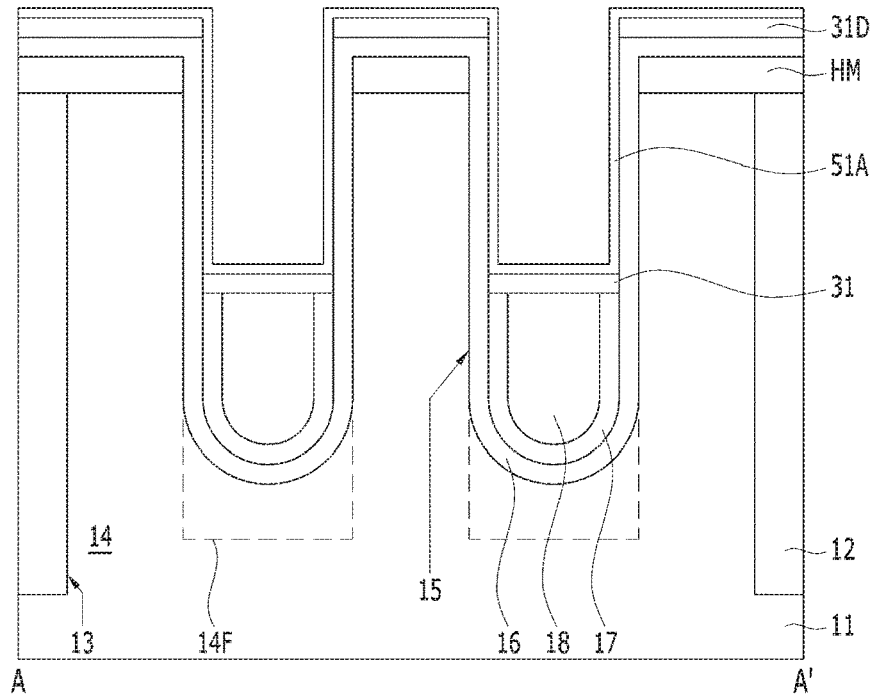
FIGS. 31A to 31G illustrate an example of a method for fabricating the semiconductor device 600.

Subsequently, referring to FIG. 31A, a dipole inducing source layer 51A may be formed over the gate dielectric layer 16, the anti-oxidation barrier 31, and the dummy anti-oxidation layer 31D. The dipole inducing source layer 51A may be conformally formed. The dipole inducing source layer 51A may be formed by using a Chemical Vapor Deposition (CVD) process or an Atomic Layer Deposition (ALD) process. The dipole inducing source layer 51A may include DICS. The DICS may include lanthanum atoms. The dipole inducing source layer 51A may include a lanthanum oxide. In accordance with an embodiment, the dipole inducing source layer 51A may include an yttrium oxide, a germanium oxide, a lutetium oxide, or a strontium oxide.

Figure 31B:
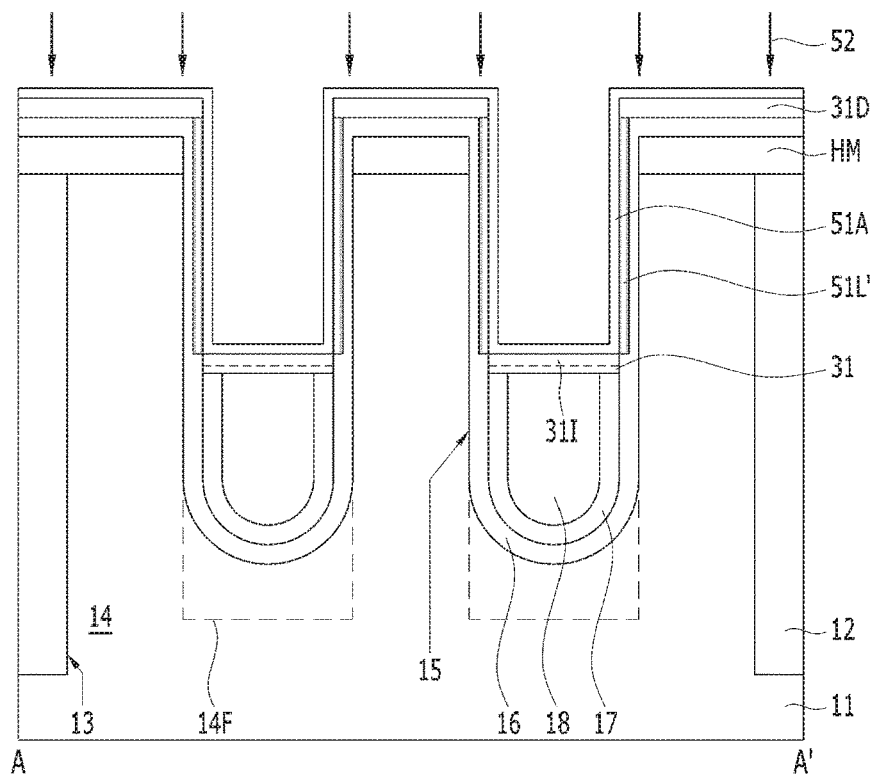

Referring to FIG. 31B, a heat treatment 52 may be performed. The heat treatment 52 may include a Rapid Thermal Annealing (RTA). When the heat treatment 52 is performed, DICS may be diffused from the dipole inducing source layer 51A. The diffused DICS may be locally positioned in the gate dielectric layer 16. The DICS may be diffused into a portion of the gate dielectric layer 16 that contacts the dipole inducing source layer 51A. As a result, DICS diffused portion 51L' may be locally formed in the gate dielectric layer 16. The DICS diffused portion 51L' may include DICS. The DICS diffused portion 51L' may include lanthanum atoms. The DICS diffused portion 51L' may be a lanthanum-doped silicon oxide. The DICS diffused portion 51L' may be a lanthanum silicate.

During the heat treatment 52, the DICS may be diffused into the anti-oxidation barrier 31. As a result, a doped anti-oxidation barrier 31I may be formed in the anti-oxidation barrier 31. The doped anti-oxidation barrier 31I may include a lanthanum atom-diffused titanium nitride.

Meanwhile, the DICS may not be diffused into the gate dielectric layer 16 that contacts the dummy anti-oxidation layer 31D.

Figure 31C:
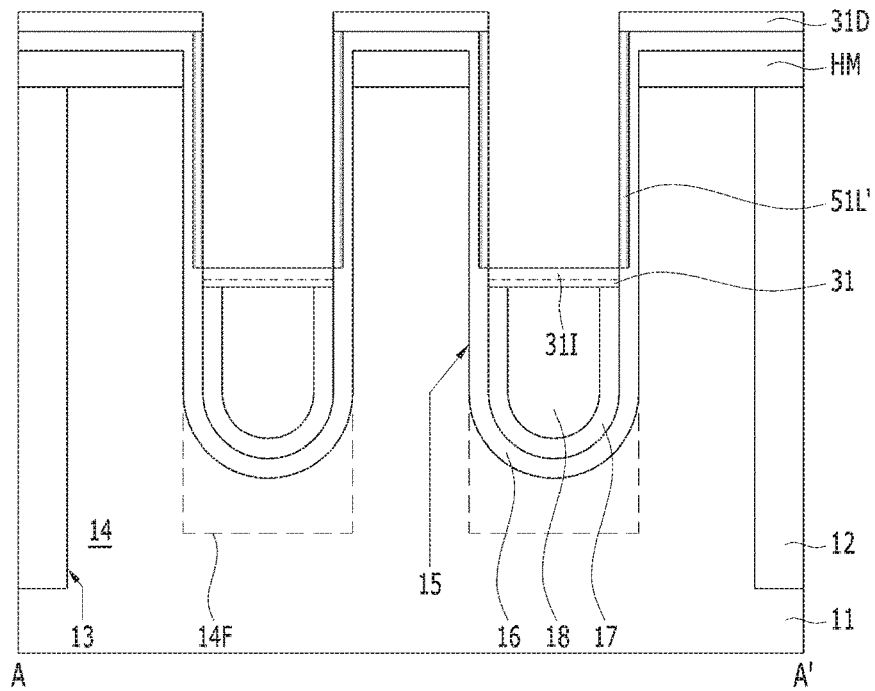

Referring to FIG. 31C, the dipole inducing source layer 51A may be removed. The dipole inducing source layer 51A may be removed by a wet etching process. By applying the wet etching process, the dipole inducing source layer 51A may be selectively removed without attacking the gate dielectric layer 16. In accordance with an embodiment, the wet etching process may be performed by a mixture of HCl/HF.

In accordance with an embodiment of the present invention, when the dipole inducing source layer 51A is removed, the surface of the DICS diffused portion 51L' may be partially removed. As a result, a dipole inducing portion 309' of the semiconductor device 600' described in FIG. 22 may be formed.

Figure 31D:
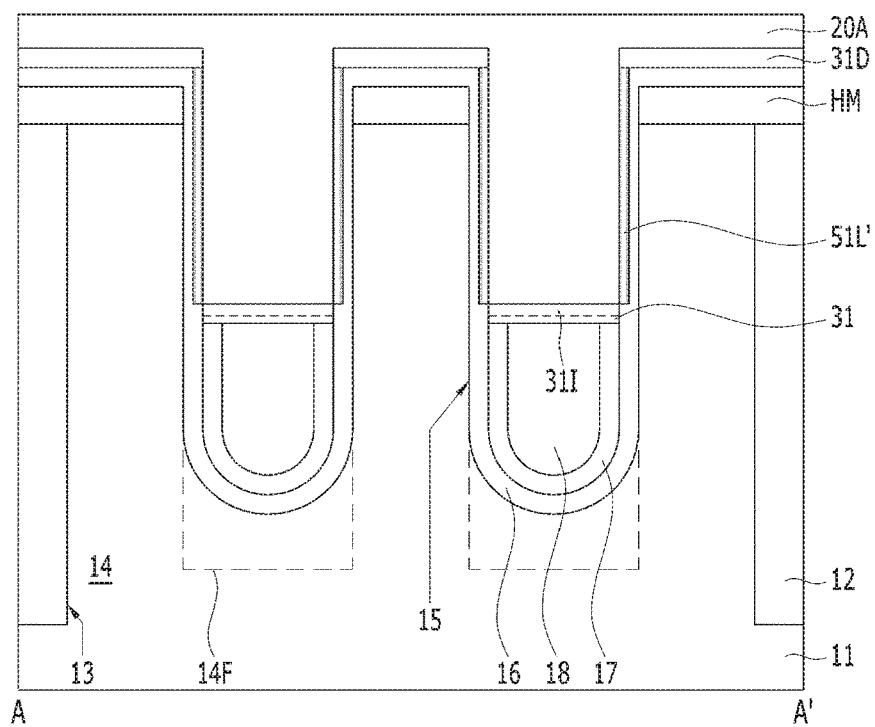

Referring to FIG. 31D, the second conductive layer 20A may be formed over the inducing chemical species diffused portion 51L'. The second conductive layer 20A may fill the gate trench 15. The second conductive layer 20A may include any suitable low-resistance metal material. For example, the second conductive layer 20A may include a titanium nitride. The second conductive layer 20A may be formed by a Chemical Vapor Deposition (CVD) process or an Atomic Layer Deposition (ALD) process.

Figure 31E:
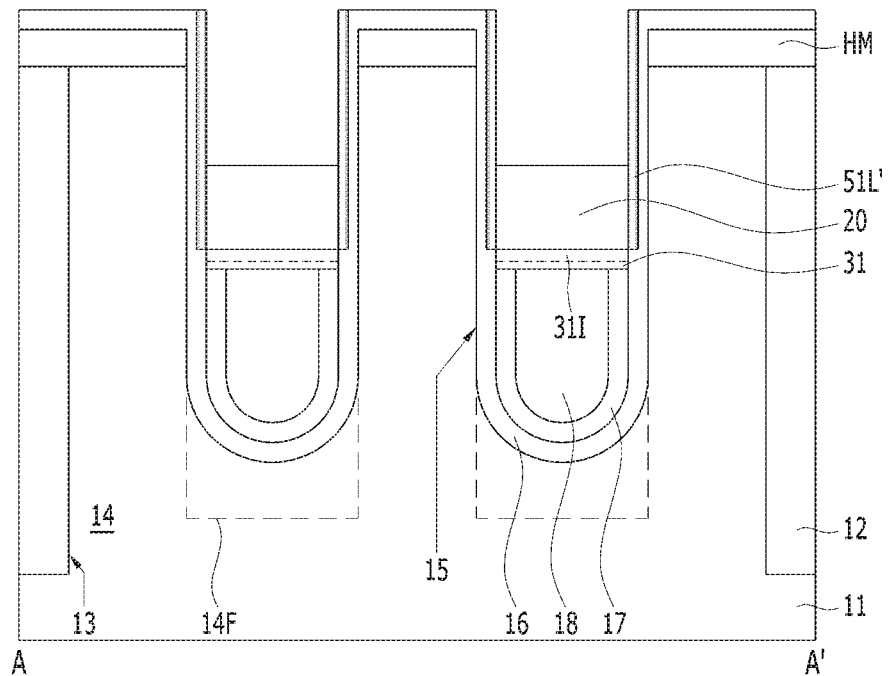

Referring to FIG. 31E, a second gate electrode 20 may be formed in the gate trench 15. For forming the second gate electrode 20, a recessing process may be performed. The recessing process may include performing dry etching, for example, an etch-back process. The second gate electrode 20 may be formed by an etch-back process of the second conductive layer 20A. In accordance with an embodiment, the recessing process may include first performing a planarization process for exposing the hard mask HM, and then performing an etch-back process following the planarization process. The planarization process may be any suitable planarization process including but not limited to a chemical mechanical polishing. The top surface of the second gate electrode 20 may be recessed lower than the top surface of the active region 14. A portion of the DICS diffused portion 51L' may be exposed by the second gate electrode 20.

Figure 31F:
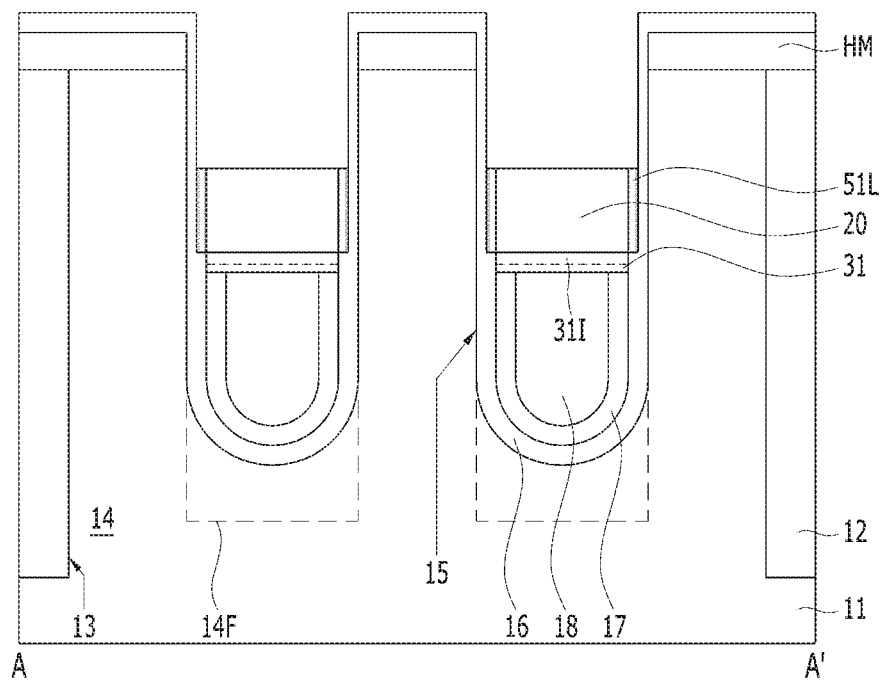

Referring to FIG. 31F, a dipole inducing portion 51L may be formed. The dipole inducing portion 51L may contact both sidewalls of the second gate electrode 20. For forming the dipole inducing portion 51L, the DICS diffused portion 51L' may be selectively removed. For example, the DICS diffused portion 51L' that is not in contact with the second gate electrode 20 may be removed by a wet etching process. The top surfaces of the dipole inducing portion 51L and the second gate electrode 20 may be positioned at the same level. The top surface of the dipole inducing portion 51L may be recessed lower than the top surface of the active region 14.

The dipole inducing portion 51L may have a form of a spacer. The dipole inducing portion 51L may not be positioned between and be in direct contact with the first gate electrode 18 and the second gate electrode 20.

After the dipole inducing portion 51L is formed, the gate dielectric layer 16 may remain as a first portion 16A and a second portion 16B (see FIG. 12F).

Figure 31G:
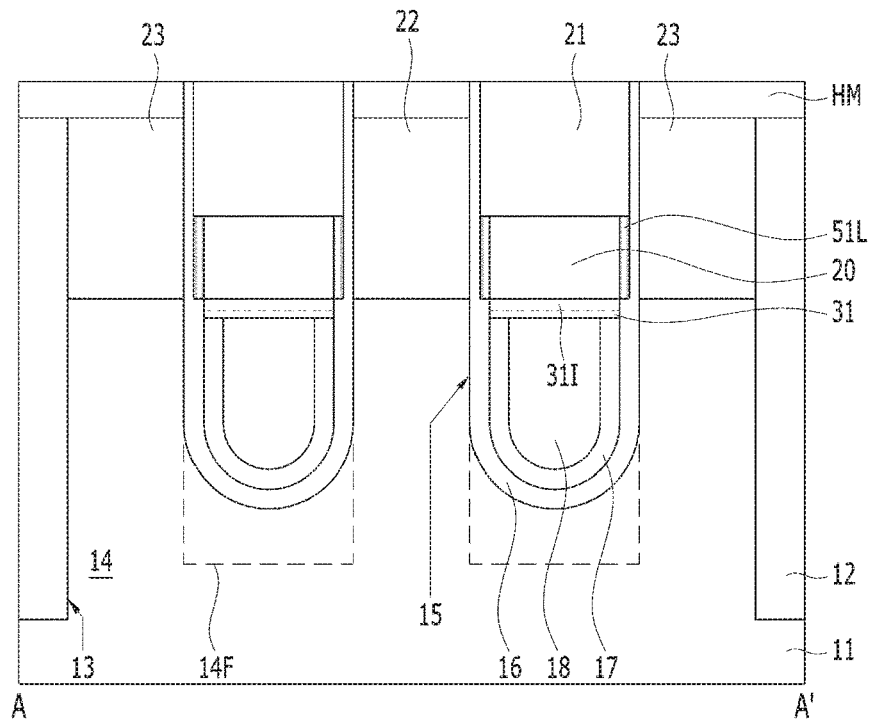

Referring to FIG. 31G, a capping layer 21 may be formed over the dipole inducing portion 51L and the second gate electrode 20. After the capping layer 21 is formed, a first source/drain region 22 and a second source/drain region 23 may be formed in the active region 14.

In accordance with an embodiment, for forming the semiconductor device 700 shown in FIG. 23, the barrier may be omitted. For example, the barrier 17 may be omitted in FIG. 31A, and then the first gate electrode 18 may be formed. Herein, the first gate electrode 18 may include a titanium nitride. The subsequent processes will be referred to FIGS. 31A to 31G.

Figure 32:
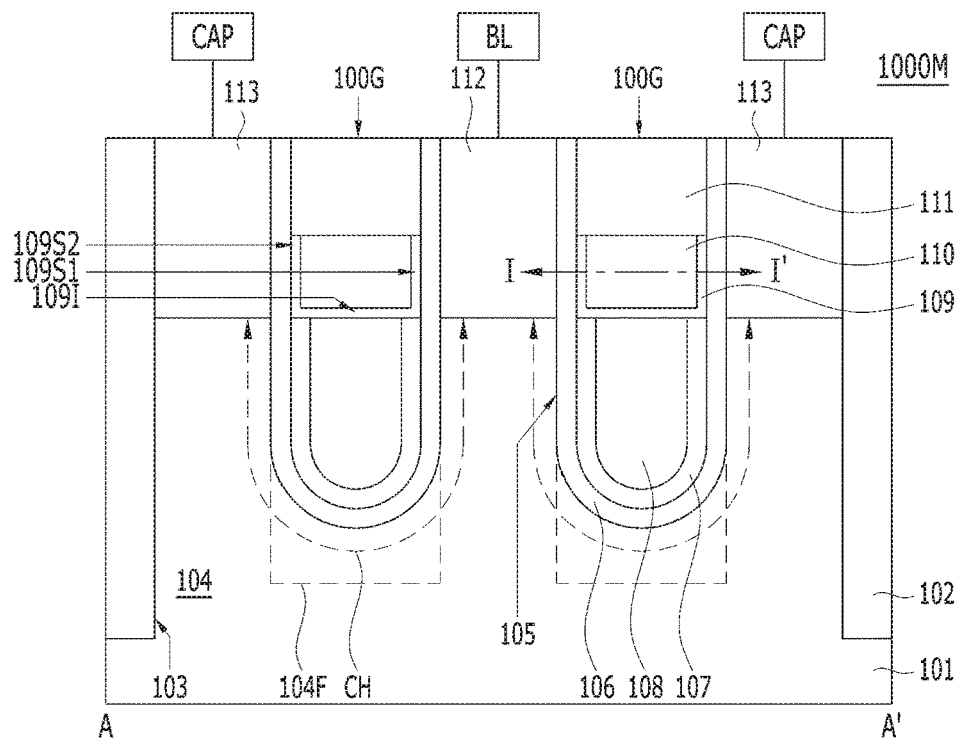
FIG. 32 is a cross-sectional view illustrating a memory cell.

FIG. 32 is a cross-sectional view illustrating a memory cell.

Referring to FIG. 32, a memory cell 1000M may be shown. The memory cell 1000M may include a cell transistor, a bit line BL, and a capacitor CAP. The cell transistor may be the semiconductor device 100 of FIG. 2A. Therefore, the cell transistor may include a buried gate structure 100G, a channel region CH, a first source/drain region 112, and a second source/drain region 113. The first source/drain region 112 may be electrically connected to the bit line BL. The second source/drain region 113 may be electrically connected to the capacitor CAP.

In the memory cell 1000M, the buried gate structure 100G may be referred to also herein as a buried word line structure BWL. The buried word line structure BWL may be positioned in the gate trench 105. The buried word line structure BWL may include a gate dielectric layer 106, a barrier 107, a first gate electrode 108, a dipole inducing layer 109, a second gate electrode 110, and a capping layer 111. The dipole inducing layer 109 may include a lanthanum oxide or a lanthanum oxide monolayer. The dipole inducing layer 109 may include an interface portion 109I, a first side portion 109S1, and a second side portion 109S2. The interface portion 109I may be formed between the first gate electrode 108 and the second gate electrode 110. The first and second side portions 109S1 and 109S2 may be formed between the second gate electrode 110 and the gate dielectric layer 106. The first side portion 109S1 may be positioned between the first source/drain region 112 and the second gate electrode 110. The second side portion 109S2 may be positioned between the second source/drain region 113 and the second gate electrode 110.

The buried gate structure 100G may be replaced with one among the buried gate structures of the above-described embodiments.

The capacitor CAP may include a storage node, a dielectric layer, and a plate node. The storage node may be in the form of a cylinder or a pillar. A capacitor dielectric layer may be formed on the surface of the storage node. The dielectric layer may include at least one selected from the group including a zirconium oxide, an aluminum oxide, and a hafnium oxide. For example, the dielectric layer may have a ZAZ structure in which a first zirconium oxide, an aluminum oxide, and a second zirconium oxide are stacked. A plate node may be formed over the dielectric layer. The storage node and the plate node may include a metal-containing material.

The memory cell 1000M may be part of a DRAM. When the memory cell 1000M is applied to a DRAM, the refresh characteristic of the DRAM can be improved. In addition, it is possible to improve the retention time by preventing off-leakage.

In accordance with the embodiments of the present invention, the gate-induced drain leakage (GIDL) may be decreased by forming a dipole inducing layer or a dipole inducing portion between a buried gate electrode and a source/drain region.

Also, in accordance with the embodiments of the present invention, the sheet resistance of a buried gate electrode may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a substrate;
a first source/drain region and a second source/drain region spaced apart from each other by a trench in the substrate; and
a gate structure in the trench,
wherein the gate structure includes:
    a gate dielectric layer being a single layer and covering a bottom and sidewalls of the trench,
    a first gate electrode positioned over the gate dielectric layer; and
    a second gate electrode positioned over the first gate electrode,
wherein the gate dielectric layer includes:
    a first portion covering a portion of the trench between the first source/drain region and the second source/drain region; and
    a second portion including a dipole inducing portion containing a dipole inducing chemical species that contacts the second gate electrode,
wherein the dipole inducing portion is in direct contact with a sidewall of the second gate electrode and has a thickness that is less than a thickness of the gate dielectric layer, and
wherein the first portion of the gate dielectric is dipole-free.

2. The semiconductor device of claim 1, wherein the second portion of the gate dielectric layer includes:
a third portion that contains the dipole inducing chemical species; and
a fourth portion that does not contain the dipole inducing chemical species,
where the third portion contacts the second gate electrode, and the fourth portion contacts the first source/drain region and the second source/drain region.

3. The semiconductor device of claim 1, wherein the first portion of the gate dielectric layer does not include the dipole inducing chemical species.

4. The semiconductor device of claim 1, wherein the dipole inducing chemical species includes a lanthanum atom, and the first portion of the gate dielectric layer does not include a lanthanum atom.

5. The semiconductor device of claim 1, wherein the second portion of the gate dielectric layer includes a silicon oxide containing a lanthanum atom, and the first portion of the gate dielectric layer includes a silicon oxide that does not contain a lanthanum atom.

6. The semiconductor device of claim 1, wherein the second portion of the gate dielectric layer includes:
a lanthanum atom-containing silicon oxide; and
a lanthanum atom-free silicon oxide that does not contain a lanthanum atom, and
the lanthanum atom-containing silicon oxide is in contact with the second gate electrode, and the lanthanum atom-free silicon oxide is in contact with the first and second source/drain regions.

7. The semiconductor device of claim 1, wherein the first gate electrode and the second gate electrode include a metal nitride.

8. The semiconductor device of claim 1, wherein the first gate electrode includes a metal, and the second gate electrode includes a metal nitride, and
the gate structure further includes a metal nitride barrier formed between the first gate electrode and the first portion of the gate dielectric layer.

9. The semiconductor device of claim 1, wherein the first gate electrode includes a metal-based material, and the second gate electrode includes an N-type doped polysilicon.

10. The semiconductor device of claim 1, wherein an upper portion of the first gate electrode includes the dipole inducing chemical species.

11. The semiconductor device of claim 10, wherein a lower portion of the first gate electrode and the second gate electrode do not contain the dipole inducing chemical species.

12. The semiconductor device of claim 1, wherein an upper portion of the first gate electrode includes a lanthanum atom.

13. The semiconductor device of claim 1, wherein an upper portion of the first gate electrode includes a lanthanum atom-containing titanium nitride, a lanthanum atom-containing tungsten, or a stack thereof.

14. The semiconductor device of claim 1, further comprising:
an anti-oxidation barrier formed between the first gate electrode and the second gate electrode.

15. The semiconductor device of claim 14, wherein the anti-oxidation barrier includes a metal nitride.

16. The semiconductor device of claim 14, wherein the anti-oxidation barrier includes the dipole inducing chemical species.

17. The semiconductor device of claim 14, wherein the anti-oxidation barrier includes a lanthanum atom-containing titanium nitride.

18. The semiconductor device of claim 1, further comprising:
a fin region formed below the trench,
wherein the gate dielectric layer and the first gate electrode cover a top surface and sidewalls of the fin region.

19. The semiconductor device of claim 1, wherein the first portion of the gate dielectric layer is formed of silicon oxide without dipole, and the second portion of the gate dielectric layer is formed of the silicon oxide containing the dipole inducing species.

20. A semiconductor device, comprising:
a substrate comprising a source and a drain region;
a trench formed in the substrate between the source region and the drain region;
a channel defined between the source region and the drain region along a surface profile of the trench;
a single silicon oxide layer formed on the trench and the channel;
a first gate electrode formed over the single silicon oxide layer and filled in a lower portion of the trench; and
a second gate electrode formed over the first gate electrode and partially filled in an upper portion of the trench,
wherein the single silicon oxide layer includes lanthanum atoms diffused into or formed in the single silicon oxide layer,
wherein the lanthanum atoms are provided only in a dipole inducing portion of the single silicon oxide layer horizontally overlapping with the source and drain regions, and
wherein the lanthanum atoms are in direct contact with a sidewall of the second gate electrode,
wherein the dipole inducing portion of the single silicon oxide layer has a thickness that is less than the thickness of the single silicon oxide layer, and
wherein a portion of the single silicon oxide layer that does not overlap with the source and drain regions is dipole-free.

* * * * *